(12) United States Patent
Kanemoto et al.

(10) Patent No.: US 6,501,183 B2
(45) Date of Patent: Dec. 31, 2002

(54) SEMICONDUCTOR DEVICE AND A METHOD OF MANUFACTURING THE SAME AND AN ELECTRONIC DEVICE

(75) Inventors: Kouichi Kanemoto, Koganei (JP); Masachika Masuda, Tokorozawa (JP); Tamaki Wada, Higashimurayama (JP); Michiaki Sugiyama, Tokyo (JP); Mikako Kimura, Sayama (JP)

(73) Assignees: Hitachi, Ltd., Tokyo (JP); Hitachi USLI Systems Co., Ltd., Tokyo (JP)

( * ) Notice: Subject to any disclaimer, the term of this patent is extended or adjusted under 35 U.S.C. 154(b) by 0 days.

(21) Appl. No.: 09/915,375

(22) Filed: Jul. 27, 2001

(65) Prior Publication Data
US 2002/0014686 A1 Feb. 7, 2002

Related U.S. Application Data

(62) Division of application No. 09/450,676, filed on Nov. 30, 1999, now Pat. No. 6,410,987.

(30) Foreign Application Priority Data
Dec. 2, 1998 (JP) ............................................ 10-343265
Jan. 28, 1999 (JP) .............................................. 10-19370

(51) Int. Cl.[7] ............................................. H01L 23/48
(52) U.S. Cl. ...................... 257/777; 257/691; 257/666; 257/670; 257/692; 257/695; 257/784; 257/690
(58) Field of Search ................................. 257/777, 666, 257/670, 784, 723, 685, 690, 691, 695, 692

(56) References Cited

U.S. PATENT DOCUMENTS 6,087,722 A * 7/2000 Lee et al. .................... 257/669
6,133,623 A * 10/2000 Otsuki et al. ............... 257/666

FOREIGN PATENT DOCUMENTS

JP          7-58281        3/1995

* cited by examiner

Primary Examiner—Albert W. Paladini
Assistant Examiner—Luan Thai
(74) Attorney, Agent, or Firm—Mattingly, Stanger & Malur, P.C.

(57) ABSTRACT

A first semiconductor chip (2) is bonded and secured to a second semiconductor chip (3) with a back surface of the first semiconductor chip (2) and a circuit forming surface (3X) of the second semiconductor chip (3) facing each other, and an inner portion of a support lead (6) is bonded and secured to the circuit forming surface (3X) of the second semiconductor chip (3). Such a configuration makes it possible to provide a semiconductor with a reduced thickness.

8 Claims, 50 Drawing Sheets

FIG.8
(a)
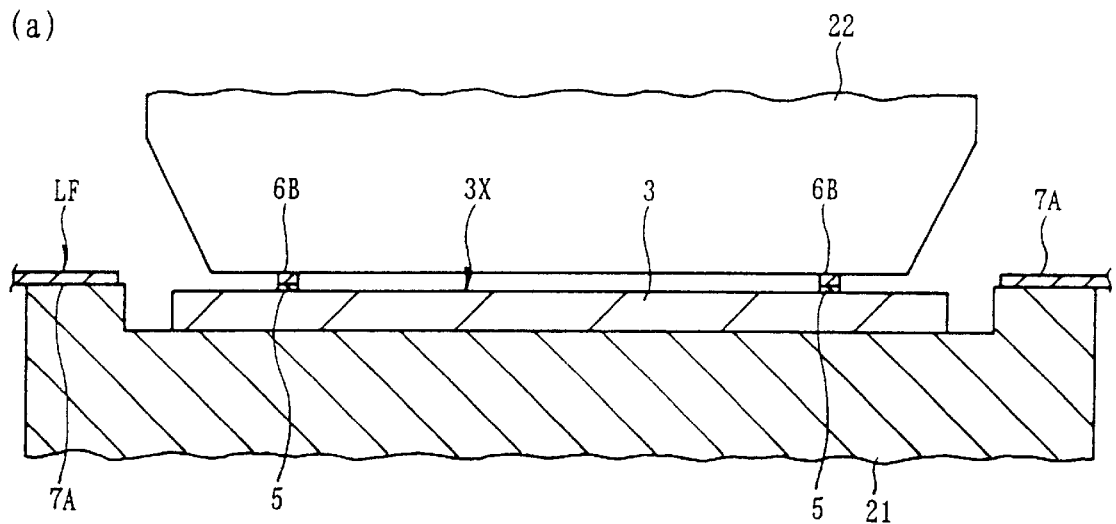
(b)
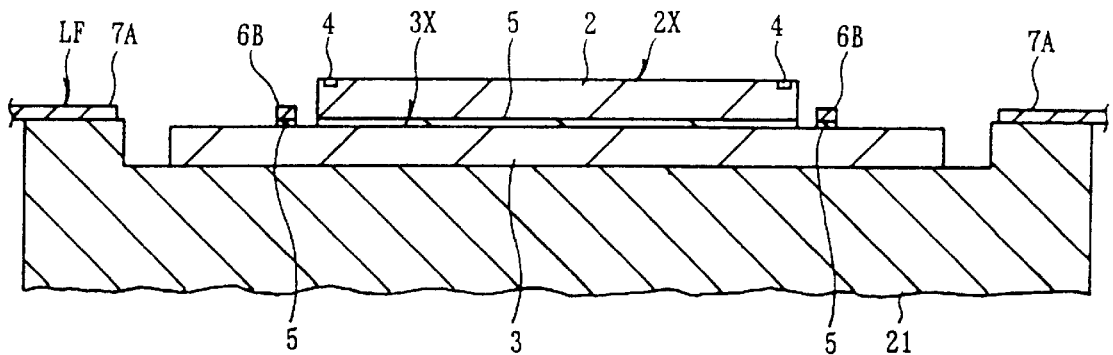
(c)
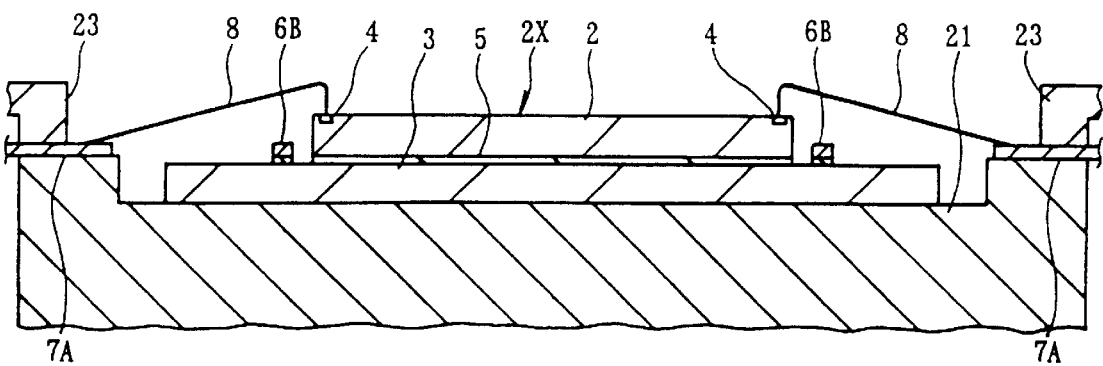

FIG.30
(a)
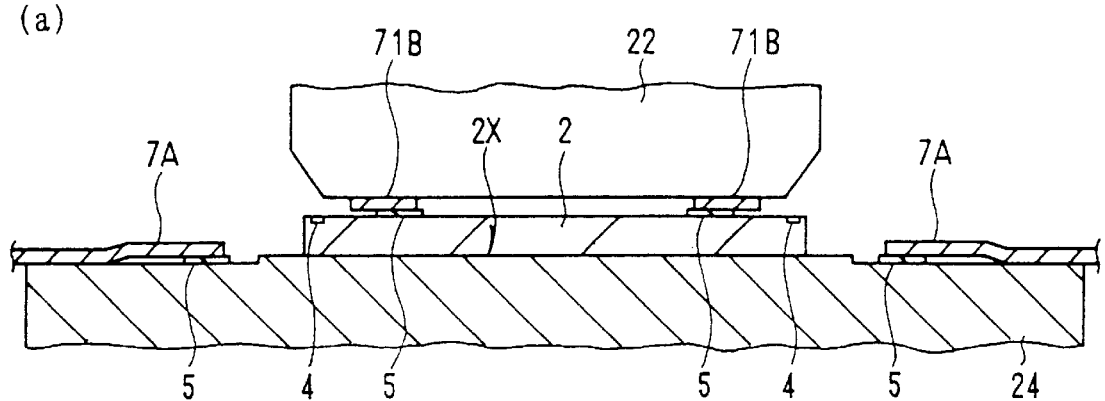
(b)
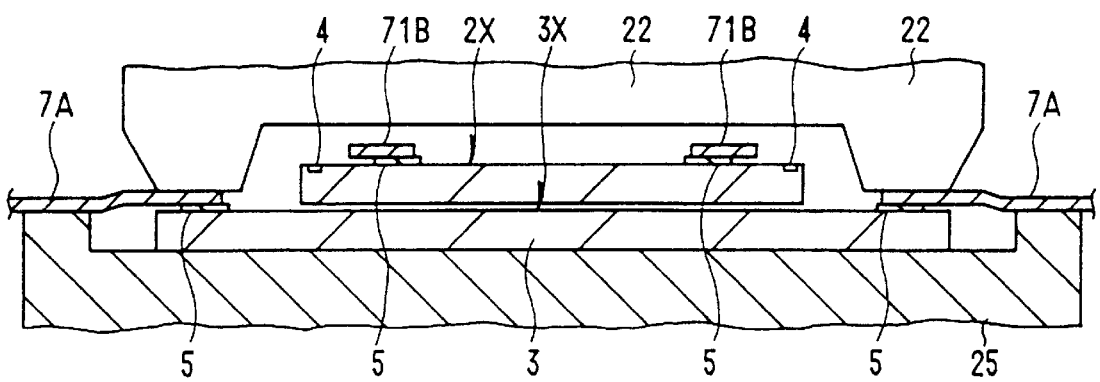
(c)
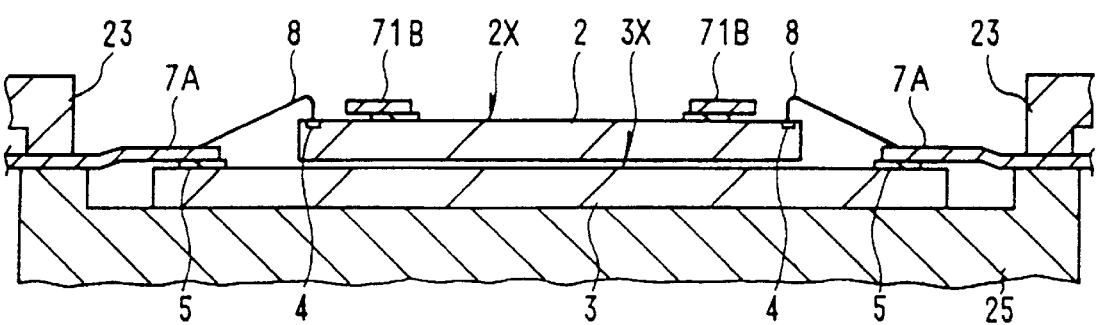

FIG.42
(a)
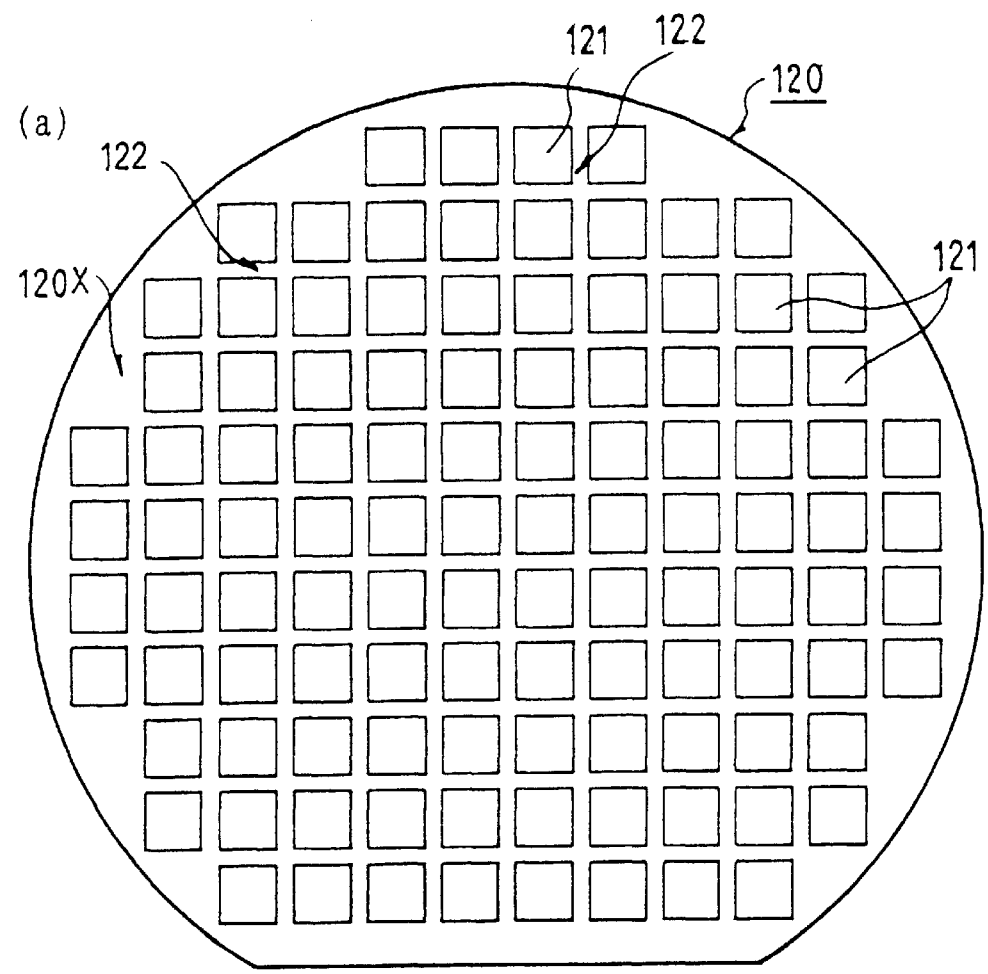
(b)
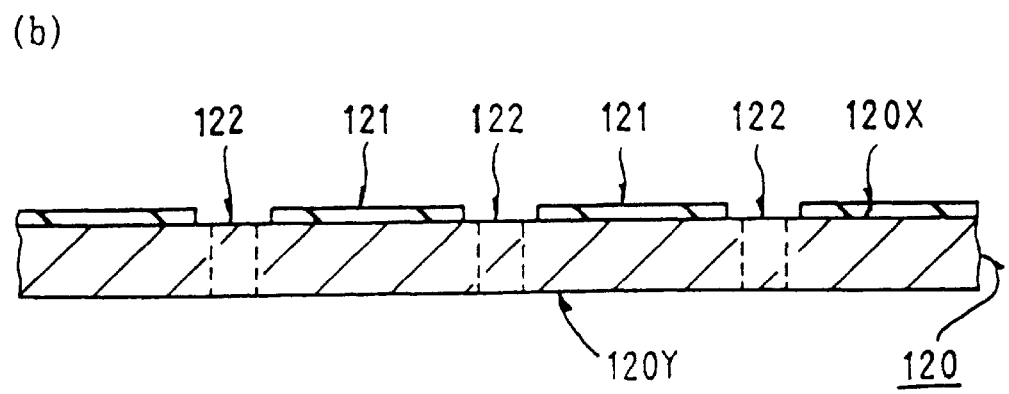

FIG.43
(a)
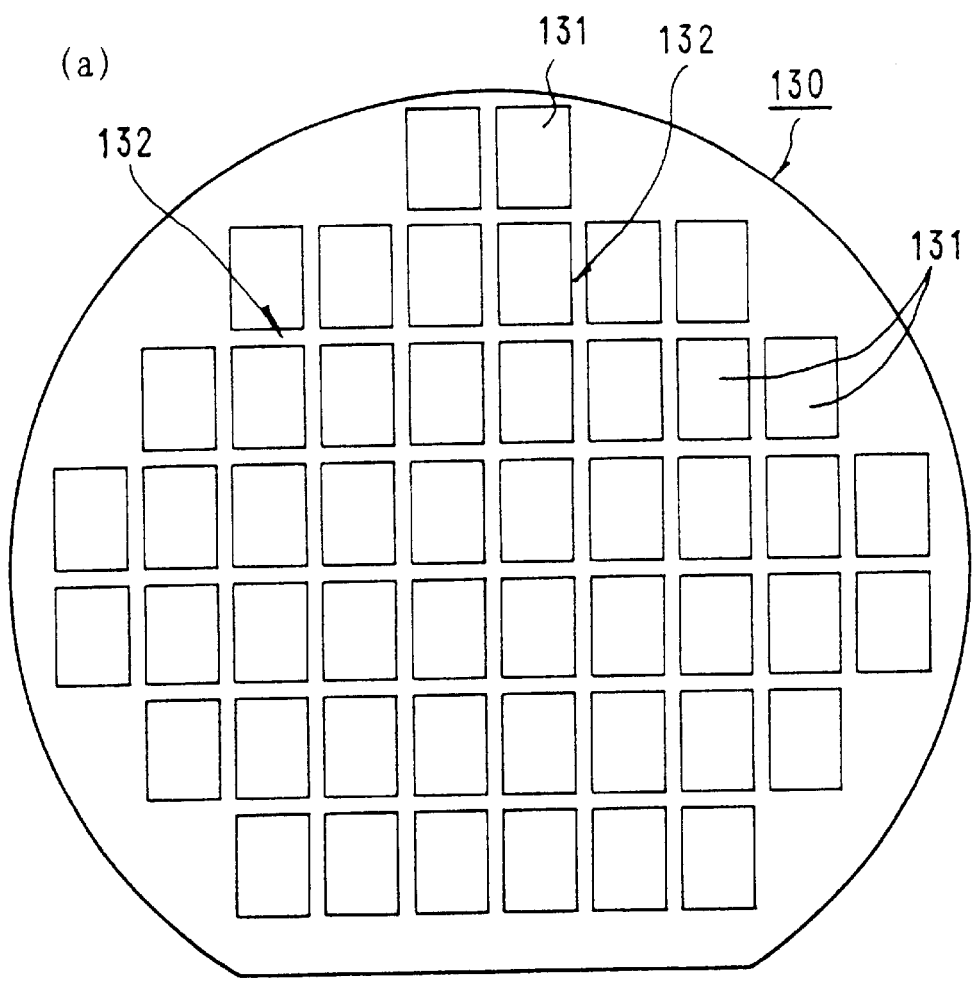
(b)
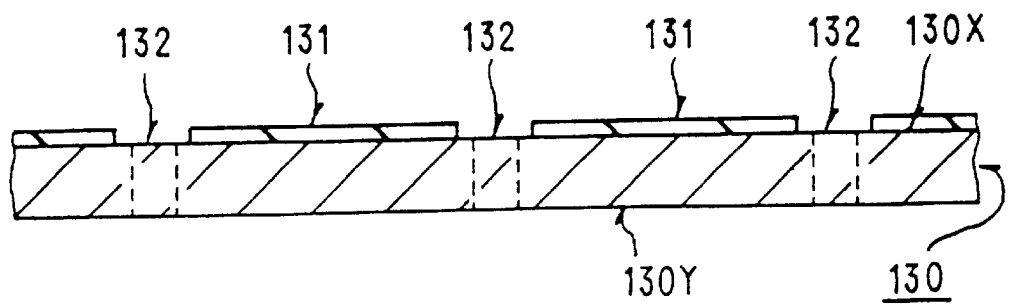

FIG.44
(a)
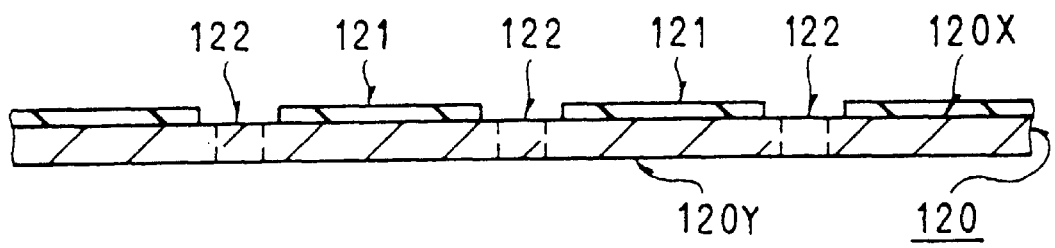
(b)
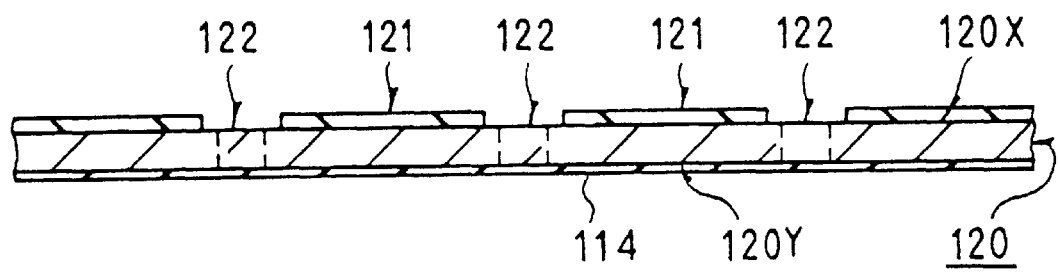
(c)
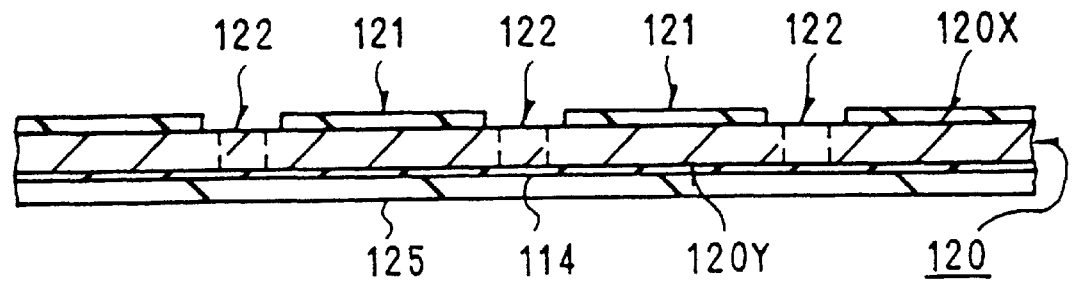
(d)
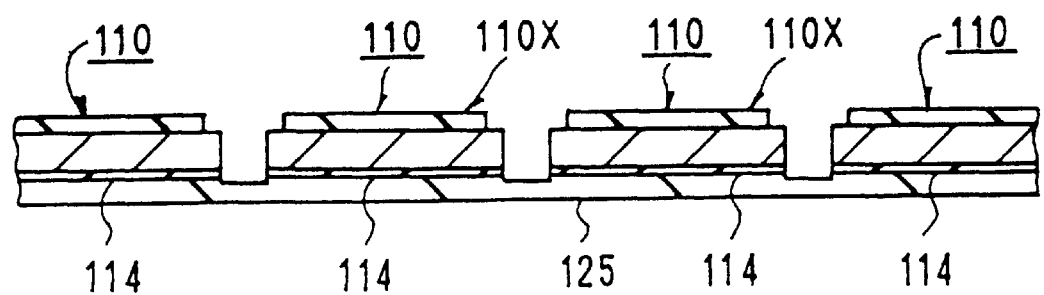

SEMICONDUCTOR DEVICE AND A METHOD OF MANUFACTURING THE SAME AND AN ELECTRONIC DEVICE

This application is a divisional application of U.S. Ser. No. 09/450,676, filed Nov. 30, 1999 U.S. Pat. No. 6,410,987.

BACKGROUND OF THE INVENTION

1. Field of the Invention

The present invention relates to a semiconductor device and, more particularly, to a technique advantageously applied to a semiconductor device in which two semiconductor chips are stacked on one another and are encapsulated with a single resin encapsulant.

2. Description of the Related Art

For the purpose of increasing the capacity of a storage circuit system, stacked semiconductor devices have been proposed in which two semiconductor chips forming a memory circuit system are stacked on one another and are encapsulated with a single resin encapsulant. For example, Japanese unexamined patent publication No. H7(1995)-58281 discloses a stacked semiconductor device having a LOC (lead on chip) structure.

A stacked semiconductor device having a LOC structure is comprised of a first semiconductor chip and a second semiconductor chip having a plurality of electrode pads formed on a circuit forming surface thereof which is the top surface, i.e., one of principal surfaces opposite to each other, a plurality of first leads bonded and secured to the circuit forming surface of the first semiconductor chip with an insulating film interposed therebetween and electrically connected to the electrode pads on the circuit forming surface through conductive wires, a plurality of second leads bonded and secured to the circuit forming surface of the second semiconductor chip with an insulating film interposed therebetween and electrically connected to the electrode pads on the circuit forming surface through conductive wires and a resin encapsulant for encapsulating the first semiconductor chip, second semiconductor chip, inner portions of the first leads, inner portions of the second leads, the wires and the like. The first and second semiconductor chips are stacked with their circuit forming surfaces facing each other. The first and second leads are bonded with respective connecting portions overlapping each other.

The inventors have encountered the following problems in the course of the development of stacked semiconductor device.

The conventional LOC structure as described above results in an increase in manufacturing cost because the manufacture involves the use of two lead frames when this structure is adopted.

The above-described conventional technique necessitates two lead frames because two semiconductor chips are to be stacked.

Further, since two semiconductor chips are stacked, the electrode pads of the two semiconductor chips can not be provided in four directions on the semiconductor chips with a single lead frame.

It is therefore an object of the invention to provide a technique which makes it possible to reduce the thickness of a semiconductor device by stacking two semiconductor chips and encapsulating the two semiconductor chips with a single resin encapsulant.

It is another object of the invention to provide a technique that accommodates a structure of a semiconductor device having two semiconductor chips stacked and encapsulated with a single resin encapsulant in which a single lead frame serves electrode pads provided along four sides of the stack formed by the two semiconductor chips.

It is still another object of the invention to provide a technique to make it possible to provide a multi-chip package having a reduced mounting without changing the storage capacity.

It is still another object of the invention to provide a technique that makes it possible to prevent cracks in a structure of a semiconductor device having two semiconductor chips stacked and encapsulated with a single resin encapsulant.

The above and other objects and novel features of the invention will be clearly understood from the description of this specification and the accompanying drawings.

SUMMARY OF THE INVENTION

Typical aspects of the invention disclosed in this specification can be briefly summarized as follows.

(1) There is provided a semiconductor device comprising:
a first semiconductor chip having a circuit forming surface and a back surface opposite to the circuit forming surface and a plurality of electrode pads formed on the circuit forming surface;
a second semiconductor chip having a circuit forming surface and a back surface opposite to the circuit forming surface and a plurality of electrode pads formed on the circuit forming surface and having a plane size greater than that of the first semiconductor chip;
a plurality of leads each having an inner portion and an outer portion, the inner portions being electrically connected to respective electrode pads of the first and second semiconductor chips through conductive wires;
a support lead having an inner portion and an outer portion for supporting the second semiconductor chip with the inner portion; and
a resin encapsulant for encapsulating the first semiconductor chip, the second semiconductor chip, the inner portions of the leads, the inner portion of the support lead and the wires, wherein
the first semiconductor chip is bonded and secured to the second semiconductor chip with the back surface of the first semiconductor chip and the circuit forming surface of the second semiconductor chip facing each other and wherein
the inner portion of the support lead is bonded and secured to the circuit forming surface of the second semiconductor chip.

(2) There is provided a semiconductor device according to the first aspect, wherein a part of the inner portions of the leads is provided on the circuit forming surface of the second semiconductor chip.

(3) There is provided a semiconductor device comprising:
a first semiconductor chip having a circuit forming surface and a back surface opposite to the circuit forming surface and a plurality of electrode pads formed on the circuit forming surface;
a second semiconductor chip having a circuit forming surface and a back surface opposite to the circuit forming surface and a plurality of electrode pads formed on the circuit forming surface and having a plane size greater than that of the first semiconductor chip;

a plurality of leads each having an inner portion and an outer portion, the inner portions being electrically connected to respective electrode pads of the first and second semiconductor chips through conductive wires;

a support lead having an inner portion and an outer portion for supporting the second semiconductor chip with the inner portion; and a resin encapsulant for encapsulating the first semiconductor chip, the second semiconductor chip, the inner portions of the leads, the inner portion of the support lead and the wires, wherein the first semiconductor chip is bonded and secured to the second semiconductor chip with the back surface of the first semiconductor chip and the back surface of the second semiconductor chip facing each other and wherein the inner portion of the support lead is bonded and secured to the back surface of the second semiconductor chip.

(4) There is provided a semiconductor device comprising:

a first semiconductor chip having a circuit forming surface and a back surface opposite to the circuit forming surface and a plurality of electrode pads formed on the circuit forming surface;

a second semiconductor chip having a circuit forming surface and a back surface opposite to the circuit forming surface and a plurality of electrode pads formed on the circuit forming surface and having a plane size greater than that of the first semiconductor chip;

a plurality of leads each having an inner portion and an outer portion, the inner portions being electrically connected to respective electrode pads of the first and second semiconductor chips through conductive wires;

a support lead having an inner portion and an outer portion for supporting the first and second semiconductor chips with the inner portion; and a resin encapsulant for encapsulating the first semiconductor chip, the second semiconductor chip, the inner portions of the leads, the inner portion of the support lead and the wires, wherein the first semiconductor chip is bonded and secured to the second semiconductor chip with the back surface of the first semiconductor chip and the circuit forming surface of the second semiconductor chip facing each other and wherein the inner portion of the support lead is bonded and secured to the circuit forming surfaces of the first and second semiconductor chips.

(5) There is provided a semiconductor device according to the fourth aspect, wherein a part of the inner portions of the leads is provided on the circuit forming surface of the second semiconductor chip.

(6) There is provided a semiconductor device comprising:

a first semiconductor chip having a circuit forming surface and a back surface opposite to the circuit forming surface and a plurality of electrode pads formed on the circuit forming surface;

a second semiconductor chip having a circuit forming surface and a back surface opposite to the circuit forming surface and a plurality of electrode pads formed on the circuit forming surface and having a plane size greater than that of the first semiconductor chip;

a plurality of leads each having an inner portion and an outer portion, the inner portions being electrically connected to respective electrode pads of the first and second semiconductor chips through conductive wires;

a support lead having an inner portion and an outer portion for supporting the first and second semiconductor chips with the inner portion; and a resin encapsulant for encapsulating the first semiconductor chip, the second semiconductor chip, the inner portions of the leads, the inner portion of the support lead and the wires, wherein the first semiconductor chip is bonded and secured to the second semiconductor chip with the back surface of the first semiconductor chip and the back surface of the second semiconductor chip facing each other and wherein the inner portion of the support lead is bonded and secured to the circuit forming surface of the first semiconductor chip and the back surface of the second semiconductor chip.

(7) There is provided a semiconductor device comprising:

a first semiconductor chip having a circuit forming surface and a back surface opposite to the circuit forming surface and a plurality of electrode pads formed on the circuit forming surface;

a second semiconductor chip having a circuit forming surface and a back surface opposite to the circuit forming surface and a plurality of electrode pads formed on the circuit forming surface and having a plane size greater than that of the first semiconductor chip;

a plurality of leads each having an inner portion and an outer portion, the inner portions being electrically connected to respective electrode pads of the first and second semiconductor chips through conductive wires;

a support lead having an inner portion and an outer portion for supporting the first and second semiconductor chips with the inner portion; and a resin encapsulant for encapsulating the first semiconductor chip, the second semiconductor chip, the inner portions of the leads, the inner portion of the support lead and the wires, wherein the first semiconductor chip is provided on the second semiconductor chip with the resin of the resin encapsulant interposed between the back surface of the first semiconductor chip and the circuit forming surface of the second semiconductor chip and wherein the inner portion of the support lead is bonded and secured to the circuit forming surfaces of the first and second semiconductor chips.

(8) There is provided a semiconductor device according to the seventh aspect, wherein a part of the inner portions of the leads is provided on the circuit forming surface of the second semiconductor chip.

(9) There is provided a semiconductor device comprising:

a first semiconductor chip having a circuit forming surface and a back surface opposite to the circuit forming surface and a plurality of electrode pads formed on the circuit forming surface;

a second semiconductor chip having a circuit forming surface and a back surface opposite to the circuit forming surface and a plurality of electrode pads formed on the circuit forming surface and having a plane size greater than that of the first semiconductor chip;

a plurality of leads each having an inner portion and an outer portion, the inner portions being electrically connected to respective electrode pads of the first and second semiconductor chips through conductive wires;

a support lead having an inner portion and an outer portion for supporting the first and second semiconductor chips with the inner portion; and a resin encapsulant for encapsulating the first semiconductor chip, the second semiconductor chip, the inner portions of the leads, the inner portion of the support lead and the wires, wherein the first semiconductor chip is provided on the second semiconductor chip with the resin of the resin encapsulant interposed between the back surface of the first semiconductor chip and the back surface of the second semiconductor chip and wherein the inner portion of the support lead is bonded and secured to the circuit forming surface of the first semiconductor chip and the back surface of the second semiconductor chip.

(10) There is provided a semiconductor device according any of the first through ninth aspects, wherein the support lead is configured to serve as both a power supply lead and a reference potential lead.

(11) There is provided a method of manufacturing a semiconductor device comprising the steps of:

providing a first semiconductor chip having a circuit forming surface and a back surface opposite to the circuit forming surface and a plurality of electrode pads formed on the circuit forming surface and providing a second semiconductor chip having a circuit forming surface and a back surface opposite to the circuit forming surface and a plurality of electrode pads formed on the circuit forming surface and having a plane size greater than that of the first semiconductor chip;

forming a semiconductor chip stack by bonding and securing the back surface of the first semiconductor chip to the circuit forming surface of the second semiconductor chip;

bonding and securing an inner portion of a support lead to the circuit forming surface of the second semiconductor chip;

electrically connecting the electrode pads of the first and second semiconductor chips to inner portions of a plurality of leads respectively through conductive wires; and encapsulating the first semiconductor chip, the second semiconductor chip, the inner portions of the leads, the inner portion of the support lead and the wires.

(12) There is provided a method of manufacturing a semiconductor device according to the eleventh aspect, comprising the step of providing a part of the inner portions of the leads on the circuit forming surface of the second semiconductor chip.

(13) There is provided a method of manufacturing a semiconductor device comprising the steps of:

providing a first semiconductor chip having a circuit forming surface and a back surface opposite to the circuit forming surface and a plurality of electrode pads formed on the circuit forming surface and providing a second semiconductor chip having a circuit forming surface and a back surface opposite to the circuit forming surface and a plurality of electrode pads formed on the circuit forming surface and having a plane size greater than that of the first semiconductor chip;

forming a semiconductor chip stack by bonding and securing the back surface of the first semiconductor chip to the back surface of the second semiconductor chip;

bonding and securing an inner portion of a support lead to the back surface of the second semiconductor chip;

electrically connecting the electrode pads of the first and second semiconductor chips to inner portions of a plurality of leads respectively through conductive wires; and encapsulating the first semiconductor chip, the second semiconductor chip, the inner portions of the leads, the inner portion of the support lead and the wires.

(14) There is provided a method of manufacturing a semiconductor device comprising the steps of:

providing a first semiconductor chip having a circuit forming surface and a back surface opposite to the circuit forming surface and a plurality of electrode pads formed on the circuit forming surface and providing a second semiconductor chip having a circuit forming surface and a back surface opposite to the circuit forming surface and a plurality of electrode pads formed on the circuit forming surface and having a plane size greater than that of the first semiconductor chip;

disposing the back surface of the first semiconductor chip and the circuit forming surface of the second semiconductor chip in a face-to-face relationship with each other and securing and supporting them at an inner portion of a support lead to form a semiconductor chip stack with a gap between them;

electrically connecting the electrode pads of the first and second semiconductor chips to inner portions of a plurality of leads respectively through conductive wires; and encapsulating the first semiconductor chip, the second semiconductor chip, the inner portions of the leads, the inner portion of the support lead and the wires.

(15) There is provided a method of manufacturing a semiconductor device according to the fourteenth aspect, comprising the step of providing a part of the inner portions of the leads on the circuit forming surface of the second semiconductor chip.

(16) There is provided a method of manufacturing a semiconductor device comprising the steps of:

providing a first semiconductor chip having a circuit forming surface and a back surface opposite to the circuit forming surface and a plurality of electrode pads formed on the circuit forming surface and providing a second semiconductor chip having a circuit forming surface and a back surface opposite to the circuit forming surface and a plurality of electrode pads formed on the circuit forming surface and having a plane size greater than that of the first semiconductor chip;

disposing the back surface of the first semiconductor chip and back surface of the second semiconductor chip in a face-to-face relationship with each other and securing and supporting them at an inner portion of a support lead to form a semiconductor chip stack with a gap between them;

electrically connecting the electrode pads of the first and second semiconductor chips to inner portions of a plurality of leads respectively through conductive wires; and encapsulating the first semiconductor chip, the second semiconductor chip, the inner portions of the leads, the inner portion of the support lead and the wires.

BRIEF DESCRIPTION OF THE DRAWINGS

FIGS. 8A, 8B and 8C are schematic sectional views of a semiconductor device according to the first embodiment for explaining the manufacture of the same.

FIGS. 30A, 30B and 30C are schematic sectional views of a semiconductor device according to the seventh embodiment for explaining the manufacture of the same.

FIG. 42A is a schematic plan view showing a first semiconductor wafer used for the manufacture of a semiconductor device according to the ninth embodiment.

FIG. 42B is a schematic sectional view of the first semiconductor wafer.

FIG. 43A is a schematic plan view showing a second semiconductor wafer used for the manufacture of a semiconductor device according to the ninth embodiment.

FIG. 43B is a schematic sectional view of the second semiconductor wafer.

FIGS. 44A, 44B, 44C and 44D are schematic sectional views of a semiconductor device according to the ninth aspect for explaining the manufacture of the same.

DETAILED DESCRIPTION OF PREFERRED EMBODIMENTS

Modes of carrying out the invention will now be described in detail with reference to the drawings. Throughout the drawings presented here for explaining the best modes of carrying out the invention, parts having like functions will be indicated by like reference numbers and will not be described repeatedly.

First Embodiment

The present embodiment refers to an example of an application of the invention to a TQFP (Thin Quad Flat Package) type semiconductor device having a quadruple lead structure.

Figure 1:
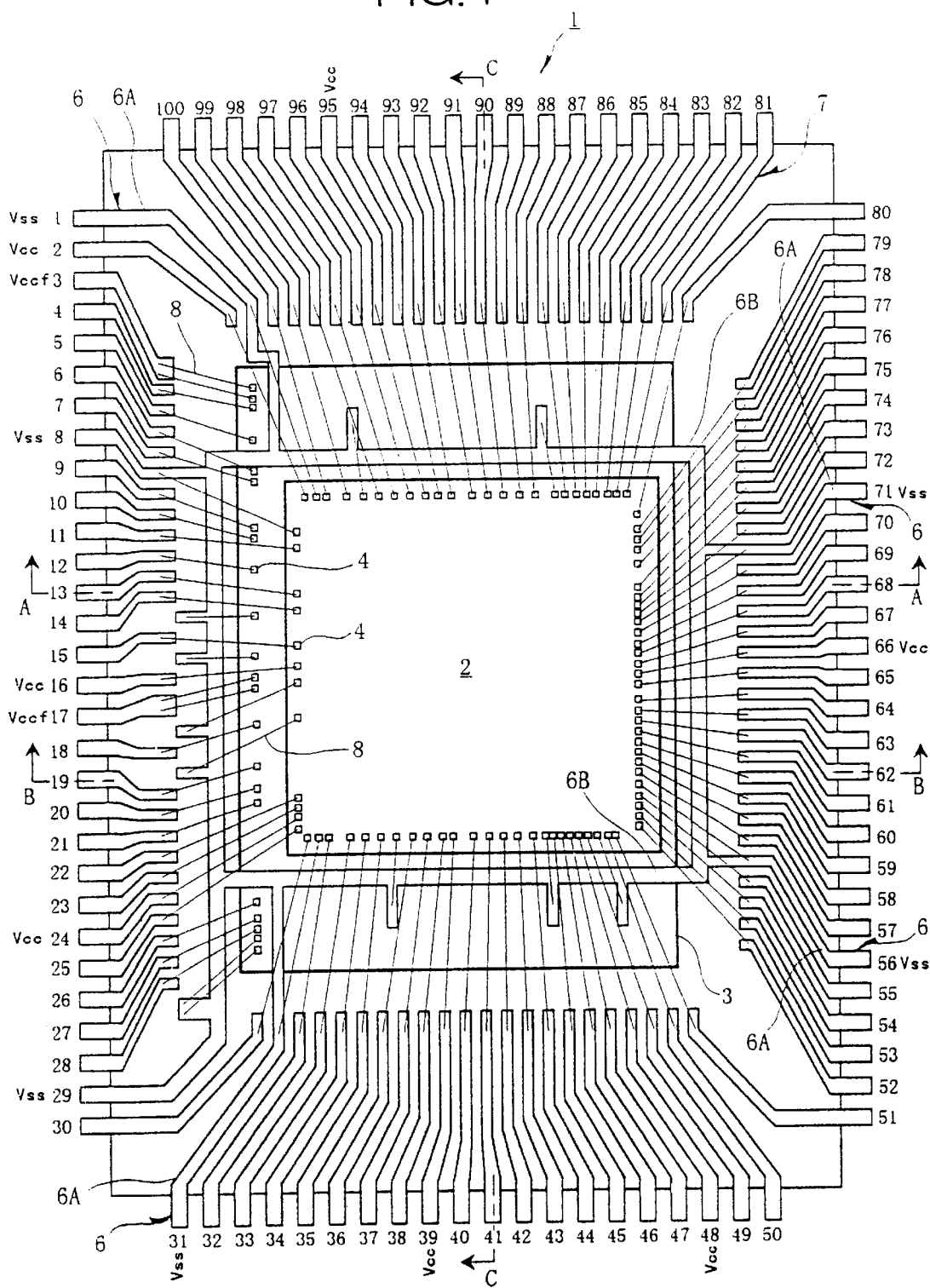
FIG. 1 is a schematic plan view of a semiconductor device which is a first embodiment of the invention with an upper part of a resin encapsulant thereof removed.
Figure 2:
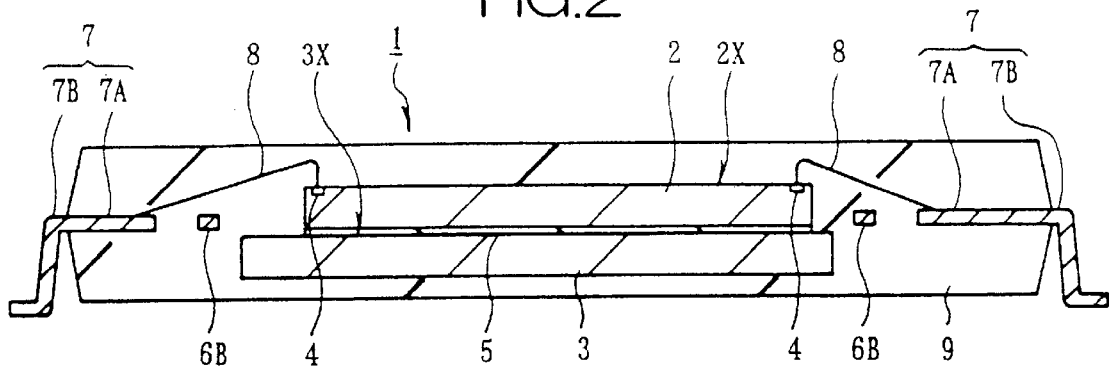
FIG. 2 is a schematic sectional view taken along the line A—A in FIG. 1.
Figure 3:
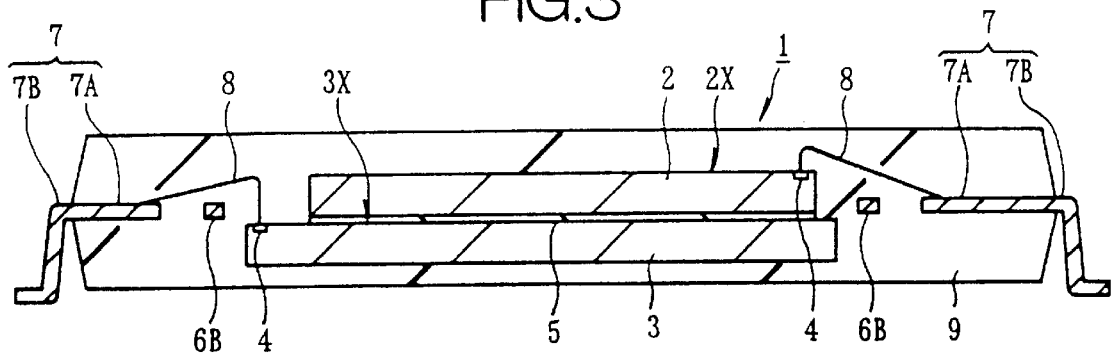
FIG. 3 is a schematic sectional view taken along the line B—B in FIG. 1.
Figure 4:
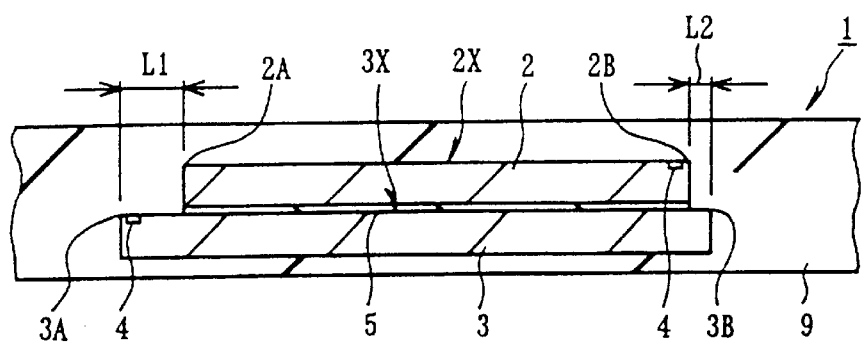
FIG. 4 is a schematic sectional view of a part of FIG. 3.
Figure 5:
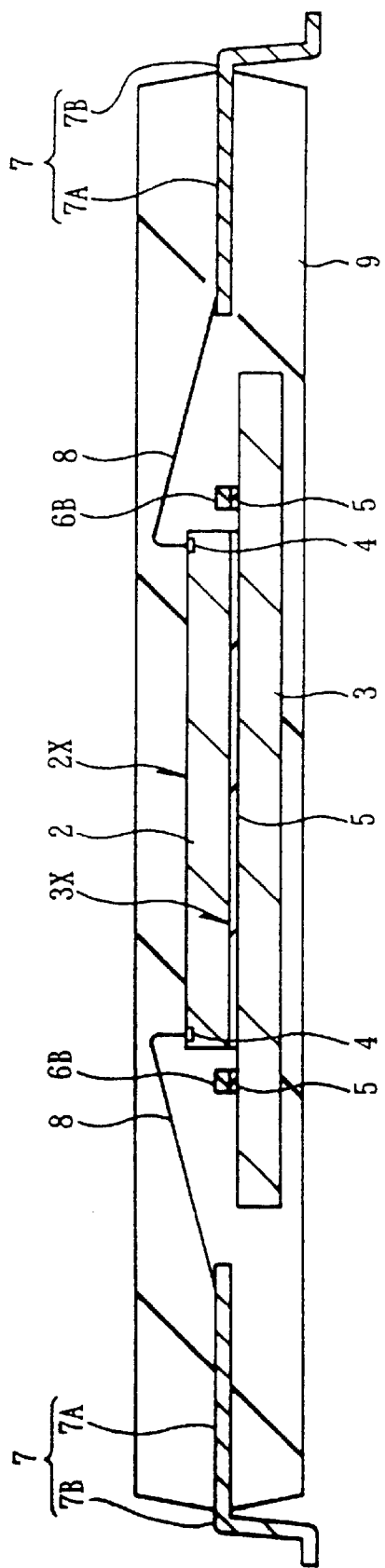
FIG. 5 is a schematic sectional view taken along the line C—C in FIG. 1.

FIG. 1 is a schematic plan view of a semiconductor device which is a first embodiment of the invention with an upper part of a resin encapsulant thereof removed. FIG. 2 is a schematic sectional view taken along the line A—A in FIG. 1. FIG. 3 is a schematic sectional view taken along the line B—B in FIG. 1. FIG. 4 is a schematic sectional view of a part of FIG. 3. FIG. 5 is a schematic sectional view taken along the line C—C in FIG. 1.

As shown in FIGS. 1, 2, 3 and 5, a semiconductor device 1 of the first embodiment has a semiconductor chip (first semiconductor chip) 2 obtained by forming a plurality of electrode pads 4 on a circuit forming surface (one principal surface) 2X of a quadrangular semiconductor substrate and a semiconductor chip (second semiconductor chip) 3 obtained by forming a plurality of electrode pads 4 on a circuit forming surface (one principal surface) 3X of a quadrangular semiconductor substrate having dimensions greater than those of the semiconductor chip 2. For example, an ASIC (Application Specific Integrated Circuit which is a general purpose integrated circuit) chip is used as the semiconductor chip 2 of the present embodiment, and a flash memory chip is used as the semiconductor chip 3.

In the present embodiment, for example, the semiconductor chip 2 has a square surface configuration and the semiconductor chip 3 has a rectangular surface configuration. The semiconductor chip 3 is formed in a plane size (outline dimensions) greater than that of the semiconductor chip 2.

The surface of the semiconductor chip 2 opposite to the circuit forming surface 2X, i.e., the back surface (another principal surface) facing the circuit forming surface 2X is placed (located) on the circuit forming surface 3X of the semiconductor chip 3, and the back surface of the semiconductor chip 2 and the circuit forming surface 3X of the semiconductor chip 3 are bonded and secured using an adhesive 5 as they are to form a semiconductor chip stack. A support lead 6 is bonded and secured to the circuit forming surface 3X of the semiconductor chip 3 of the semiconductor chip stack to support the semiconductor chip stack.

Inner portions 7A of leads 7 having the inner portions 7A and outer portions 7B are located outside the semiconductor chip stack consisting of the semiconductor chips 2 and 3. The inner portions 7A and the respective electrode pads 4 of the semiconductor chips 2 and 3 are electrically connected by conductive wires 8. The semiconductor chip stack, wires 8 and the inner portions 7A of the leads 7 are encapsulated with a resin encapsulant 9.

For example, each of the semiconductor chips 2 and 3 is primarily comprised of a semiconductor substrate made of single crystal silicon and a multiplicity of wiring layers formed on the semiconductor substrate. For example, a flash memory of 64 Mbit is formed in the semiconductor chip 3 as a memory circuit system.

The plurality of electrode pads (bonding pads) 4 are formed along the four sides of the circuit forming surface 2X which is the top surface (one principal surface) of the semiconductor chip 2. Each of the plurality of electrode pads 4 is formed in the uppermost wiring layer among the multiplicity of wiring layers of the semiconductor chip 2. The uppermost wiring layer is coated with a surface protection film (final protection film), and the surface protection film is formed with bonding holes where the surface of the electrode pads 4 is exposed.

The plurality of electrode pads 4 are formed along one of the two longer sides opposite to each other of the circuit forming surface 3X which is the top surface (one principal surface) of the semiconductor chip 3. Each of the plurality of electrode pads 4 is formed in the uppermost wiring layer among the multiplicity of wiring layers of the semiconductor chip 3. The uppermost wiring layer is coated with a surface protection film (final protection film), and the surface protection film is formed with bonding holes where the surface of the electrode pads 4 is exposed.

The resin encapsulant 9 has a quadrangular surface configuration, e.g., a rectangular configuration in the first embodiment. Outer portions 7B of the plurality of leads 7 are arranged along the four sides of resin encapsulant 9.

Figure 6:
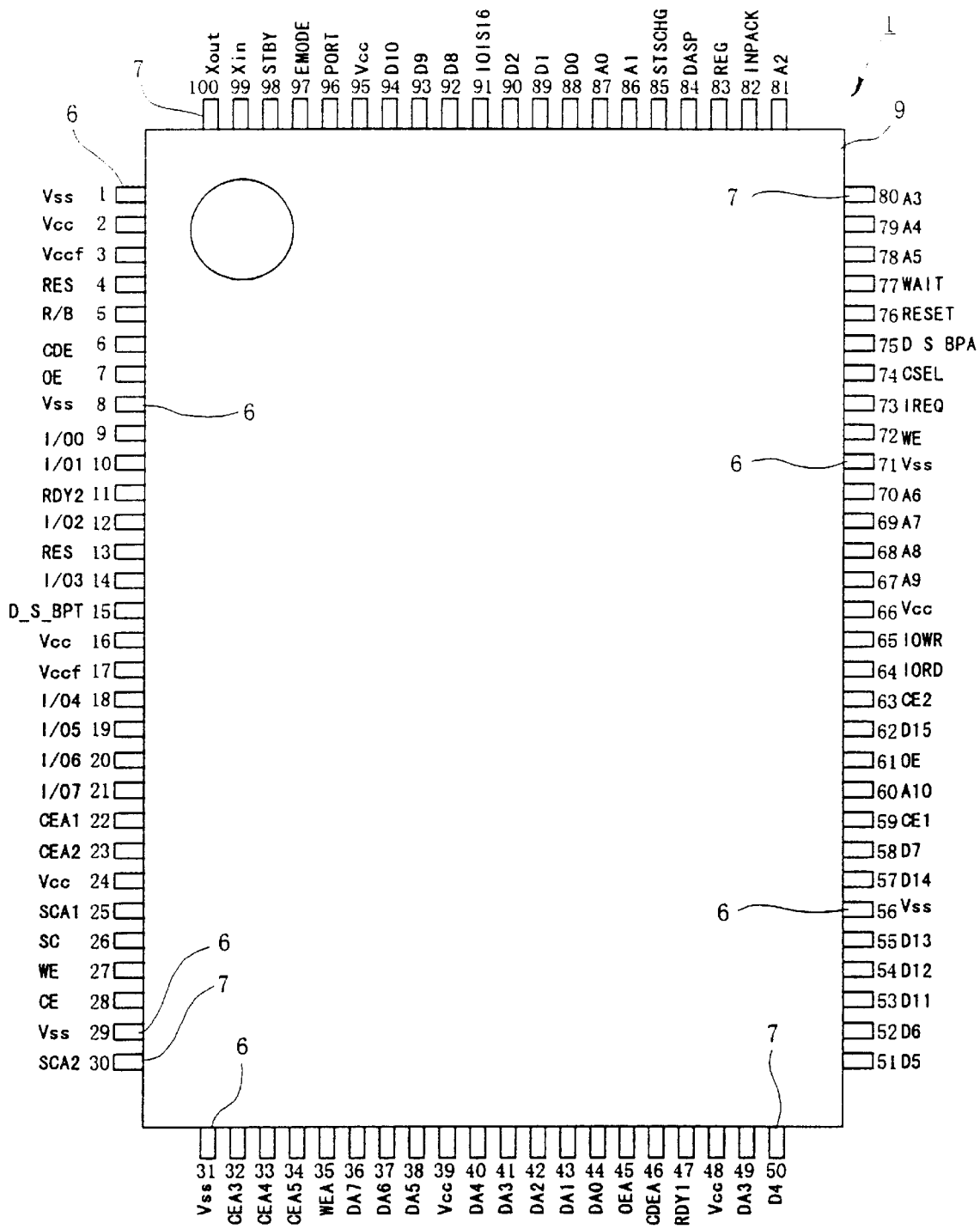
FIG. 6 illustrates functions and arrangement of leads of a semiconductor device according to the first embodiment.

As shown in FIG. 6, a terminal name is assigned to each of the outer portions 7B of the plurality of leads 7. For example, a terminal VCC is a power supply potential terminal whose potential is fixed at a power supply potential (e.g., 5 V). A terminal VSS is a reference potential terminal whose potential is fixed at a reference potential (e.g., 0 V). Terminals I/00 through I/07 are data input/output terminals. A terminal RES is a reset terminal. A terminal R/B is a ready/busy terminal. A terminal CDE is a command data enable terminal. A terminal OE is an output enable terminal. A terminal SC is a serial clock terminal. A terminal WE is a write enable terminal. A terminal CE is a chip enable terminal. Other terminal symbols are as described in Table 1.

TABLE 1

(MCP Pin Arrangement)

| # | Terminal | Function | Function |
|---|----------|----------|----------|
| 1 | Vss | Ground | Ground |
| 2 | Vcc | Power supply | Power supply |
| 3 | Vccf | Power supply(flash) | Power supply(flash) |
| 4 | RES | Reset | Reset |
| 5 | R/B | Ready/Busy | Ready/Busy |
| 6 | CDE | Command Data Enable | Command Data Enable |
| 7 | OE | Output Enable | Output Enable |
| 8 | Vss | Ground | Ground |
| 9 | I/00 | Input/Output 0 | Input/Output 0 |
| 10 | I/01 | Input/Output 1 | Input/Output 1 |
| 11 | RDY2 | Input | Input Ready for 2 banks |
| 12 | I/02 | Input/Output 2 | Input/Output 2 |
| 13 | RES | Reset | Reset |
| 14 | I/03 | Input/Output 3 | Input/Output 3 |
| 15 | D-S-BPT | Input | Input Select Diagnosis Mode |
| 16 | Vcc | Power supply | Power supply |
| 17 | Vccf | Power supply(flash) | Power supply(flash) |
| 18 | I/04 | Input/Output 4 | Input/Output 4 |
| 19 | I/05 | Input/Output 5 | Input/Output 5 |
| 20 | I/06 | Input/Output 6 | Input/Output 6 |
| 21 | I/07 | Input/Output 7 | Input/Output 7 |
| 22 | CEA1 | Output | Output Chip Enable 1 |
| 23 | CEA2 | Output | Output Chip Enable 2 |
| 24 | Vcc | Power supply | Power supply |
| 25 | SCA1 | Output | Output Serial Clock Output 1 |
| 26 | SC | Serial Clock | Serial Clock Input 1 |

TABLE 1-continued (MCP Pin Arrangement)

| # | Terminal | Function | Function |
|---|---|---|---|
| 27 | WE | Write Enable | Write Enable |
| 28 | CE | Chip Enable | Chip Enable |
| 29 | Vss | Ground | Ground |
| 30 | SCA2 | Output | Serial Clock Output 2 |
| 31 | Vss | Ground | Ground |
| 32 | CEA3 | Outout | Output Chip Enable 3 |
| 33 | CEA4 | Output | Output Chip Enable 4 |
| 34 | CEA5 | Output | Output Chip Enable 5 |
| 35 | WEA | Output | Output Write Enable |
| 36 | DA7 | Input/Output | Input/Output Data 7 |
| 37 | DA6 | Input/Output | Input/Output Data 6 |
| 38 | DA5 | Input/Output | Input/Output Data 5 |
| 39 | Vcc | Power supply | Power supply |
| 40 | DA4 | Input/Output | Input/Output Data 4 |
| 41 | DA3 | Input/Output | Input/Output Data 3 |
| 42 | DA2 | Input/Output | Input/Output Data 2 |
| 43 | DA1 | Input/Output | Input/Output Data 1 |
| 44 | DA0 | Input/Output | Input/Output Data 0 |
| 45 | CEA | Output | Output Enable |
| 46 | CDEA | Output | Output Command Data Enable |
| 47 | RDY1 | Output | Output Ready Signal 1 |
| 48 | Vcc | Power supply | Power supply |
| 49 | D3 | Data 3 | Data 3 |
| 50 | D4 | Data 4 | Data 4 |
| 51 | D5 | Data 5 | Data 5 |
| 52 | D6 | Data 6 | Data 6 |
| 53 | D11 | Data 11 | Data 11 |
| 54 | D12 | Data 12 | Data 12 |
| 55 | D13 | Data 13 | Data 13 |
| 56 | Vss | Ground | Ground |
| 57 | D14 | Data 14 | Data 14 |
| 58 | D7 | Data 7 | Data 7 |
| 59 | CE1 | Chip Enable 1 | Chip Enable 1 |
| 60 | A10 | Adress 10 | Adress 10 |
| 61 | OE | Output Enable | Output Enable |
| 62 | D15 | Data 15 | Data 15 |
| 63 | CE2 | Chip Enable 2 | Chip Enable 2 |
| 64 | IORD | Input | Input Read Data Control |
| 65 | IOWR | Input | Input Write Data Control |
| 66 | Vcc | Power supply | Power supply |
| 67 | A9 | Address 9 | Address 9 |
| 68 | A8 | Address 8 | Address 8 |
| 69 | A7 | Address 7 | Address 7 |
| 70 | A6 | Address 6 | Address 6 |
| 71 | Vss | Ground | Ground |
| 72 | WE | Write Enable | Write Enable |
| 73 | IREQ | Output | Output Interrupt Request |
| 74 | CSEL | Input | Input Card Select |
| 75 | D-S-BPA | Input | Input Diagnosis Mode Select |
| 76 | RESET | Reset | Reset |
| 77 | WAIT | Wait | Wait |
| 78 | A5 | Address 5 | Address 5 |
| 79 | A4 | Address 4 | Address 4 |
| 80 | A3 | Address 3 | Address 3 |
| 81 | A2 | Address 2 | Address 2 |
| 82 | INPACK | Output | Output Input Acknowledge |
| 83 | REQ | Register | Register |
| 84 | DASP | Input/Output | Input/Output Handshake Control |
| 85 | STSCHG | Input/Output | Input/Output Status Signal |
| 86 | A1 | Address 1 | Address 1 |
| 87 | A0 | Address 0 | Address 0 |
| 88 | D0 | Data 0 | Data 0 |
| 89 | D1 | Data 1 | Data 1 |
| 90 | D2 | Data 2 | Data 2 |
| 91 | IOIS16 | Output | Output 16bit Assert Signal |
| 92 | D8 | Data 8 | Data 8 |
| 93 | D9 | Data 9 | Data 9 |
| 94 | D10 | Data 10 | Data 10 |
| 95 | Vcc | Power supply | Power supply |
| 96 | PORT | PORT | PORT |
| 97 | EMODE | Input | Input Mode Select |
| 98 | STBY | STANBY | STANBY |
| 99 | XIN | | Crystal Oscillation (IN) |
| 100 | XOUT | | Crystal Oscillation (OUT) |

Since such a configuration eliminates the need for any tab (die pad) between the semiconductor chips 2 and 3, the distance between the circuit forming surface 2X of the semiconductor chip 2 and the circuit forming surface 3X of the semiconductor chip 3 can be reduced. Further, since there is only one bonding layer between the semiconductor chips 2 and 3, the distance between the circuit forming surface 2X of the semiconductor chip 2 and the circuit forming surface 3X of the semiconductor chip 3 can be reduced further. Since the support lead 6 is bonded and secured to the circuit forming surface 3X of the semiconductor chip 3, the thickness of the support lead 6 is canceled by the loop height of the wires 8 that electrically connect the electrode pads 4 of the semiconductor chip 2 and the inner portions 7A of the leads 7, and the support lead 6 has therefore no influence of the thickness of the resin encapsulant 9.

As shown in FIGS. 2, 3 and 5, the leads 7 of the first embodiment are constituted by the inner portions (internal lead portions) 7A which are encapsulated by the resin encapsulant 9 and outer portions (external lead portions) 7B which are led out from the resin encapsulant 9, and the outer portions 7B are formed in a configuration for surface mounting, e.g., a gull wing configuration.

For example, wires made of gold (Au) are used as the conductive wires 8. For example, the wires are connected using a method of bonding that involves both of thermocompression bonding and ultrasonic vibration.

In order to reduce stress, the resin encapsulant 9 is formed from, for example, biphenyl type resin added with a phenol type hardening agent, silicone rubber, filler and the like. The resin encapsulant 9 is formed using transfer molding that is suitable for mass production. Transfer molding is a method of forming a resin encapsulant by using a molding die having a pot, runner, entrance gate, cavity and the like and by injecting resin from the pot to the cavity through the runner and entrance gate under a pressure.

Referring to FIGS. 2, 3 and 5, the thickness of each of the semiconductor chips 2 and 3 is 0.24 mm; the thickness of the adhesive 5 is 0.01 mm; the thickness of the leads 7 is 0.125 mm; the height from the principal surface 2A of the semiconductor chip 2 to the top of the wires 8 electrically connecting the electrode pads 4 of the semiconductor chip 2 and the inner portions 7A of the leads 7 (loop height) is 0.19 mm; the gap between the top of the wires 8 and the top surface of the resin encapsulant 9 is 0.065 mm; the thickness of the resin encapsulant 9 is 1.0 mm; and the height from the top surface of the resin encapsulant 9 to the mounting surface of the leads 7 (outer portions 7B) is 1.20 mm.

The top surface of the support lead 6 is lower than the top of the wires 8. As shown in FIG. 1, the support lead 6 extends across the two shorter sides of the semiconductor chip 3 opposite to each other.

As shown in FIG. 4, the semiconductor chips 2 and 3 are stacked in an offset state such that the back surface of the semiconductor chip 2 of the circuit forming surface 3X of the semiconductor chip 3 are in a face-to-face relationship in which one (2A) of two sides of the semiconductor chip 2 opposite to each other is located close to one (3A) of the two longer sides of the semiconductor chip 3 opposite to each other and in which the other (2B) of the two sides of the semiconductor chip 2 is located close to the other (3B) of the two longer sides of the semiconductor chip 3 opposite to each other and such that the distance L1 from the side 2A of the semiconductor chip 2 to the longer side 3A of the semiconductor chip 3 is greater than the distance L2 from the side 2B of the semiconductor chip 2 to the longer side 3B of the semiconductor chip 3. That is, the semiconductor chips 2 and 3 are stacked with their centers offset from each other in a direction such that the distance L1 is greater than the distance L2.

Since such a configuration exposes a greater area of the semiconductor chip 3 on the side of the side 2A of the semiconductor chip 2, workability is improved in connecting the wires 8 to the electrode pads 4 provided at the side 3A of the semiconductor chip 3.

A description will now be made with reference to FIG. 7 (schematic plan view) on lead frames used in a process of manufacturing the semiconductor device 1. While a multiple structure is employed for actual lead frames to allow manufacture of a plurality of semiconductor devices, FIG. 7 shows a region used to manufacture one semiconductor device for simplicity of illustration.

Figure 7:
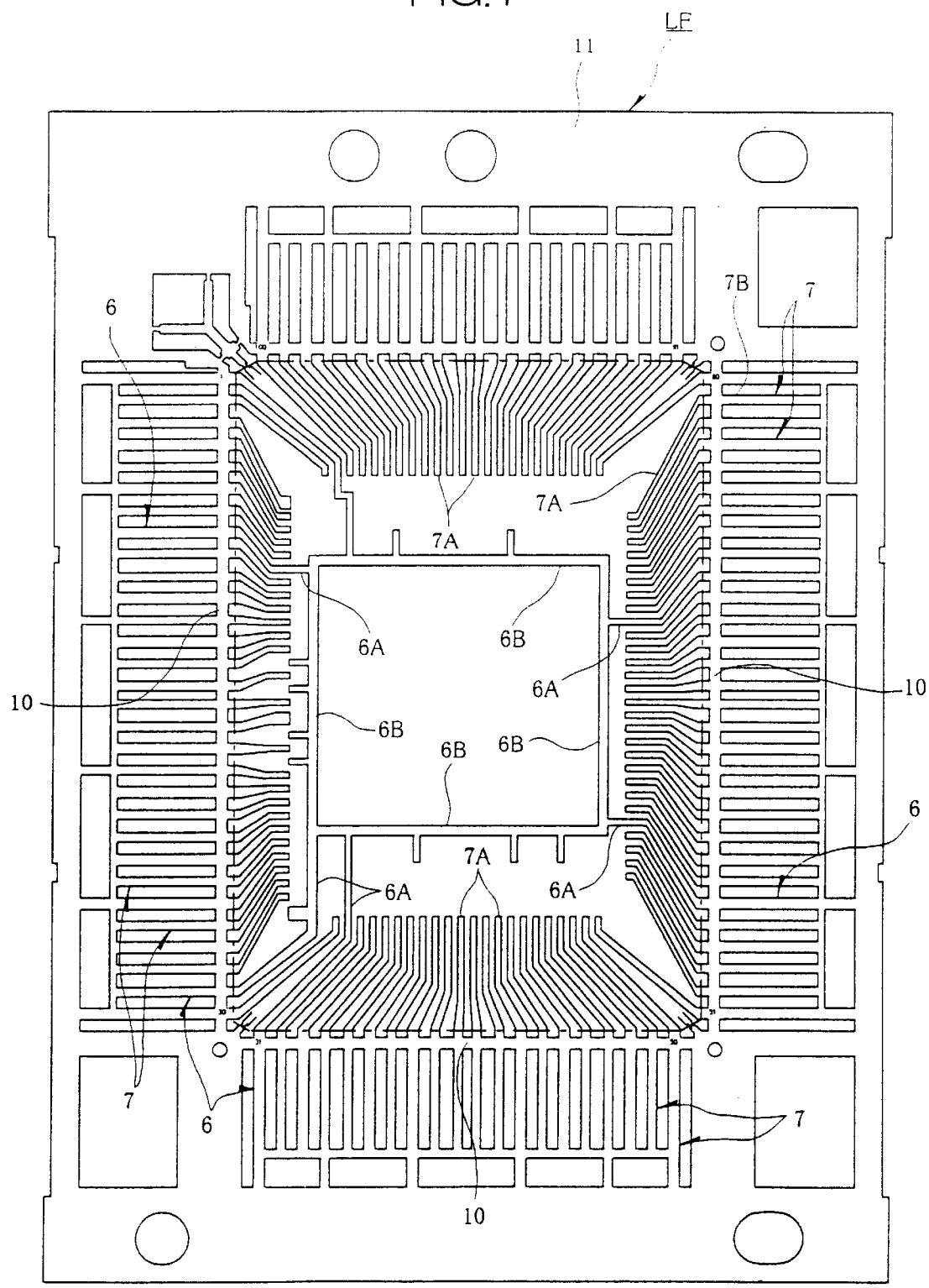
FIG. 7 is a schematic plan view of a lead frame used for a process of manufacturing a semiconductor device according to the first embodiment.

As shown in FIG. 7, a lead frame LF has a configuration in which a support lead 6, a plurality of leads 7 and the like are provided in a region defined by a frame 11. The plurality of leads 7 are arranged along four sides of the frame 11. The support lead 6 is a lead which is integrally formed with suspended lead portions 6A provided between groups of leads each consisting of a plurality of leads 7 and semiconductor chip support lead portions (bus bars) 6B provided in a central space surrounded by the ends of the inner portions 7A of the leads 7 and which is integrated with the frame 11 to be supported thereby.

The plurality of leads 7 are each constituted by an inner portion 7A encapsulated by the resin encapsulant 9 and an outer portion 7B exposed from the encapsulant 9 and are connected to each other through tie bars 10.

The lead frame LF is formed by etching or pressing a sheet material member made of, for example, an iron (Fe)-nickel (Ni) type alloy or copper (Cu) or a copper type alloy to form a predetermined lead pattern.

Figure 9:
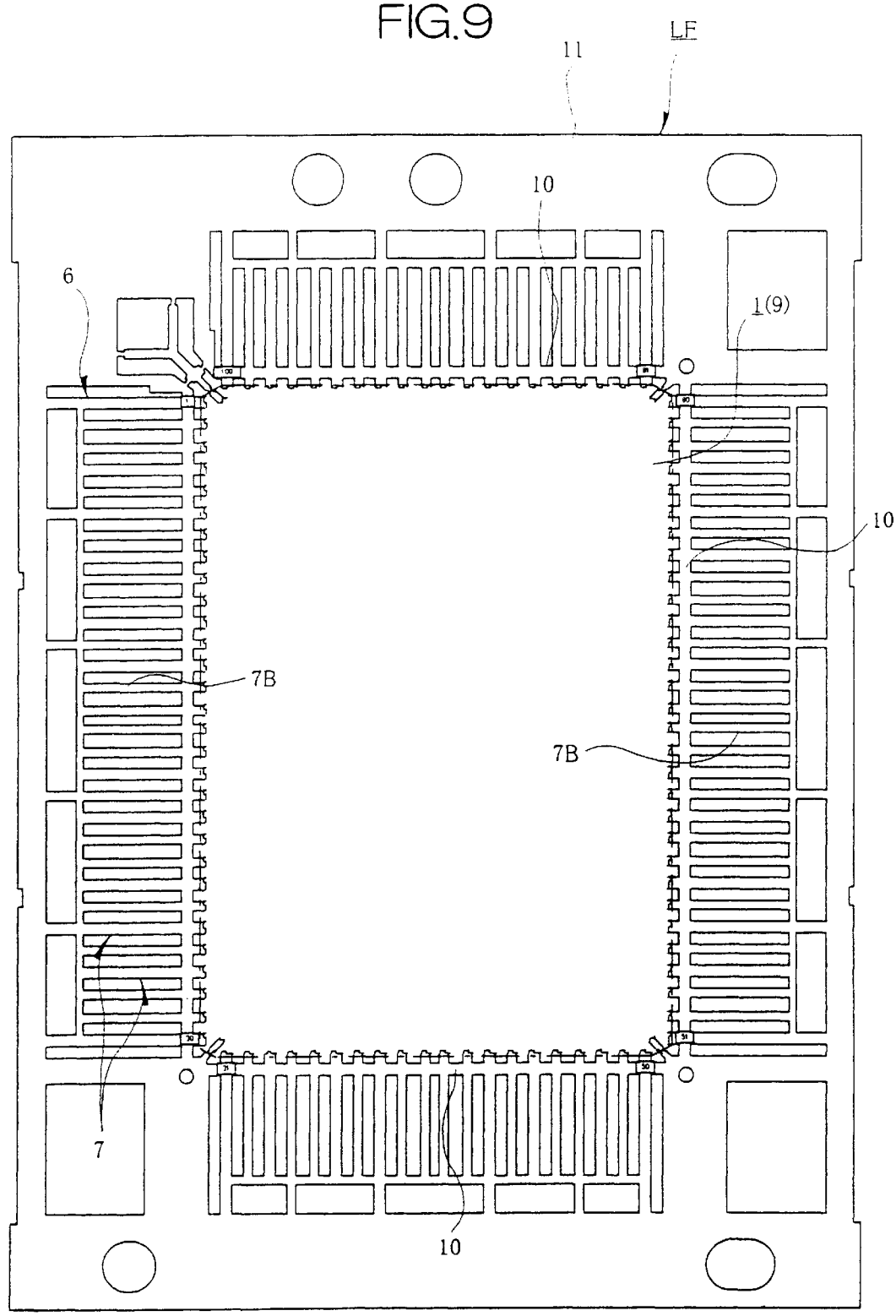
FIG. 9 is a schematic plan view of a lead frame with the resin encapsulant formed thereon during the manufacture of a semiconductor device according to the first embodiment.
Figure 10:
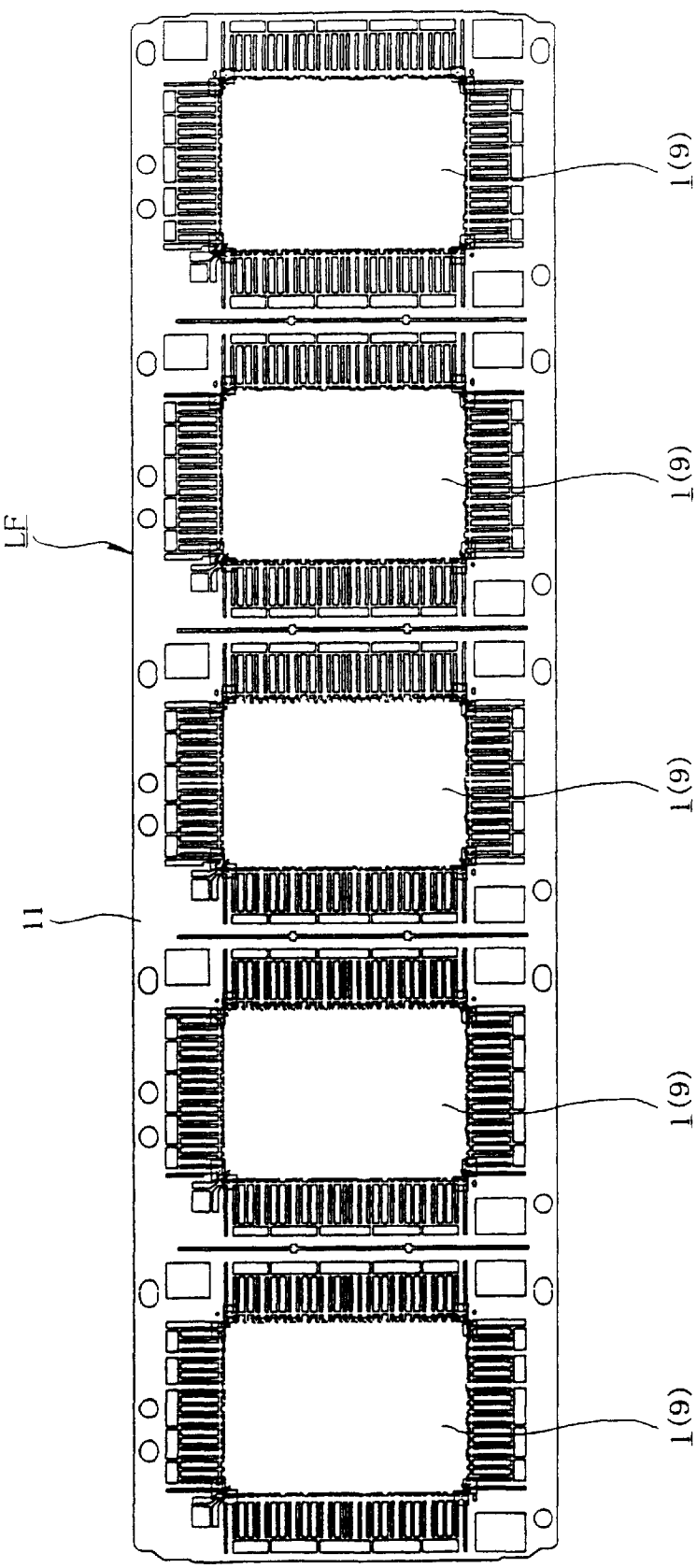
FIG. 10 is a schematic plan view of lead frames in a quintuple structure with the resin encapsulant formed thereon during the manufacture of semiconductor devices according to the first embodiment.
Figure 11:
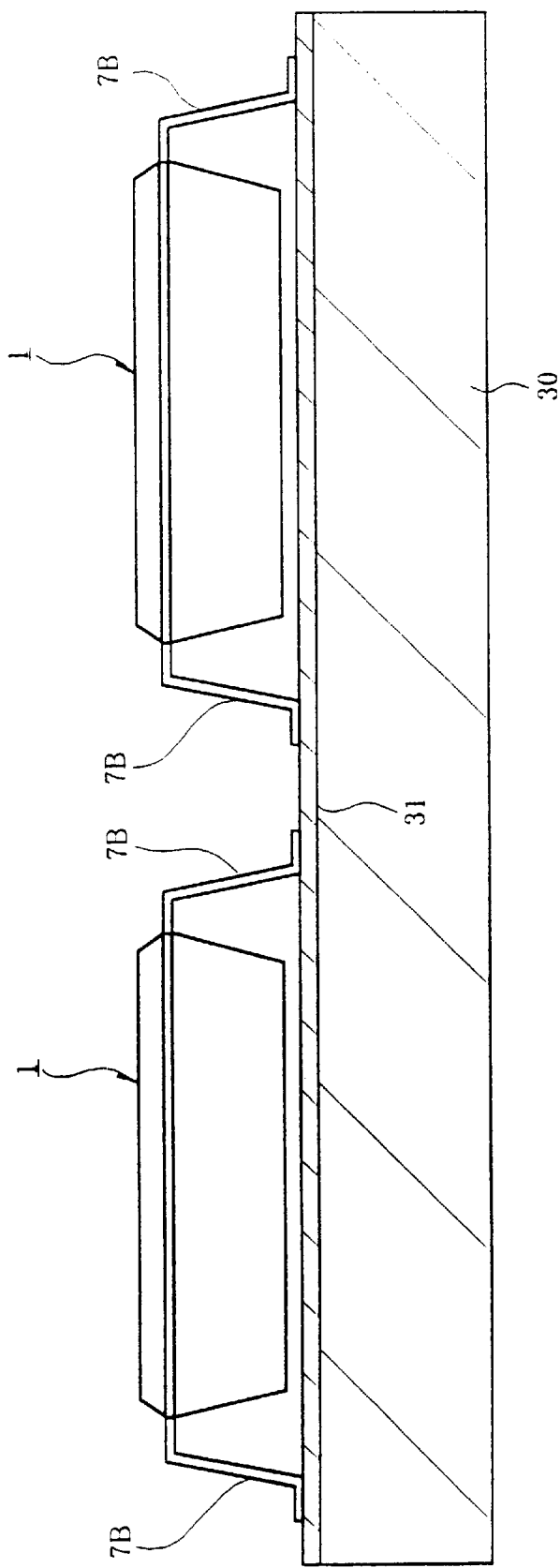
FIG. 11 is a schematic sectional view of semiconductor devices according to the first embodiment as mounted on a substrate.

A description will now be made with reference to FIGS. 8 through 10 on a method of manufacturing the semiconductor device 1. FIGS. 8A, 8B and 8C are schematic sectional views of the semiconductor device; FIG. 9 is a schematic plan view of a lead frame with a resin encapsulant formed thereon; and FIG. 10 is a schematic plan view of lead frames in a quitple structure with resin encapsulants formed thereon.

As shown in FIG. 8A, a semiconductor chip 3 is first mounted on a heat stage 21; a lead frame LF is placed on the same; a tool 22 is urged against the same while being heated; and the back surface of the semiconductor chip lead support lead portions (bus bars) 6B is bonded to the circuit forming surface 3X of the semiconductor chip 3.

Next, as shown in FIG. 8B, an adhesive 5 (e.g., a pasty agent) is applied to the circuit forming surface 3X of the semiconductor chip 3, and a semiconductor chip 2 is bonded on to the same.

Next, as shown in FIG. 8C, the top surface of the lead frame LF is pressed by and fixed with a frame pressing member 23; the heat stage 21 is heated to warm the semiconductor chips 2 and 3; and the inner portions 7A of the leads 7, the semiconductor chip support lead portions (bus bars) 6B and the electrode pads 4 on the semiconductor chips 2 and 3 are respectively electrically connected with wires (e.g., Au wires) 8.

A resin encapsulant 9 is then formed by resin-encapsulating the semiconductor chips 2 and 3, the inner portions of the support lead 6 (the inner portions of the suspended lead portions 6A and the support leads 6B in a quadrangular configuration), the inner portions 7A of the leads 7, the wires 8 and the like. The resin encapsulant is formed using transfer molding. Thus, a semiconductor device according to the first embodiment is formed on the frame 11 of the lead frame LF as shown in FIG. 9. Lead frames LF for actual manufacture are in a multiple structure (e.g., quintuple structure) as shown in FIG. 10.

Next, the tie bars 10 are cut off from the leads 7; a plating process is thereafter performed on the outer portions 7B of the leads 7; the leads 7 are thereafter cut off from the frame 11 of the lead frame LF; each of the outer portions 7B of the leads 7 is thereafter molded into a configuration for surface mounting, e.g., a gull wing configuration; and the support lead 6 is cut off from the frame 11 of the lead frame LF to complete a semiconductor device 1 as shown in FIGS. 1 through 5 substantially.

As shown in FIG. 9 (sectional view of major parts), a plurality of semiconductor devices 1 having such a configuration are mounted on a substrate 30 as components of an electronic device that constitutes a single circuit system. Each of the semiconductor devices 1 is mounted on the substrate 30 by electrically connecting the outer portions 7B of the leads 7 thereof to wires 31 on the substrate 30.

When the outer portions 7B of the leads 7 protrude above a plane at one half of the thickness of the resin encapsulant 9, the distance of the outer portions 7B from the substrate is increased, which reduces stress attributable to thermal expansion during mounting because it is absorbed by the outer portions 7B.

As apparent from the above description, the first embodiment provides the following effects.

(1) Since there is no tab between the circuit forming surface 2X of the semiconductor chip 2 and the circuit forming surface 3X of the semiconductor chip 3, the distance from the circuit forming surface 2X of the semiconductor chip 2 to the circuit forming surface 3X of the semiconductor chip 3 can be reduced to provide the semiconductor device 1 with a low profile.

(2) Since the support lead 6 is bonded and secured to the circuit forming surface 3X of the semiconductor chip 3, the thickness of the support lead 6 is canceled by the loop height of the wires 8, which prevents the support lead 6 from affecting the thickness of the resin encapsulant 9. As a result, the resin encapsulant 9 can be made thin to provide the semiconductor device 1 with a low profile.

(3) Since the resin encapsulant 9 can be made thin without reducing the thickness of the semiconductor chips 2 and 3, it is possible to provide low profile semiconductor devices with high yield.

(4) Since the resin encapsulant 9 can be made thin, a TQFP type configuration can be employed.

(5) Semiconductor memory chips may be used as the semiconductor chips 2 and 3 and may be stacked to achieve a small mounting area with the same storage capacity.

(6) The number of the leads 7 can be small because the support lead 6 is used not only to secure and support the semiconductor chips but also as a lead to serve as both a power supply lead and a reference potential D lead (GND lead).

(7) Since the position of bonding and securing with the support lead 6 is coplanar with the height of the leads 7, workability of the assembly step can be improved.

(8) The semiconductor chips 2 and 3 are stacked in an offset state such that the back surface of the semiconductor chip 2 and the circuit forming surface 3X of the semiconductor chip 3 are in a face-to-face relationship in which one (2A) of two sides of the semiconductor chip 2 opposite to each other is located close to one (3A) of the two longer sides of the semiconductor chip 3 opposite to each other and in which the other (2B) of the two sides of the semiconductor chip 2 is located close to the other (3B) of the two longer sides of the semiconductor chip 3 opposite to each other and such that the distance L1 from the side 2A of the semiconductor chip 2 to the longer side 3A of the semiconductor chip 3 is greater than the distance L2 from the side 2B of the semiconductor chip 2 to the longer side 3B of the semiconductor chip 3.

Since such a configuration exposes a greater area of the semiconductor chip 3 on the side of the side 2A of the semiconductor chip 2, workability is improved in connecting the wires 8 to the electrode pads 4 provided at the side 3A of the semiconductor chip 3.

Second Embodiment

Figure 12:
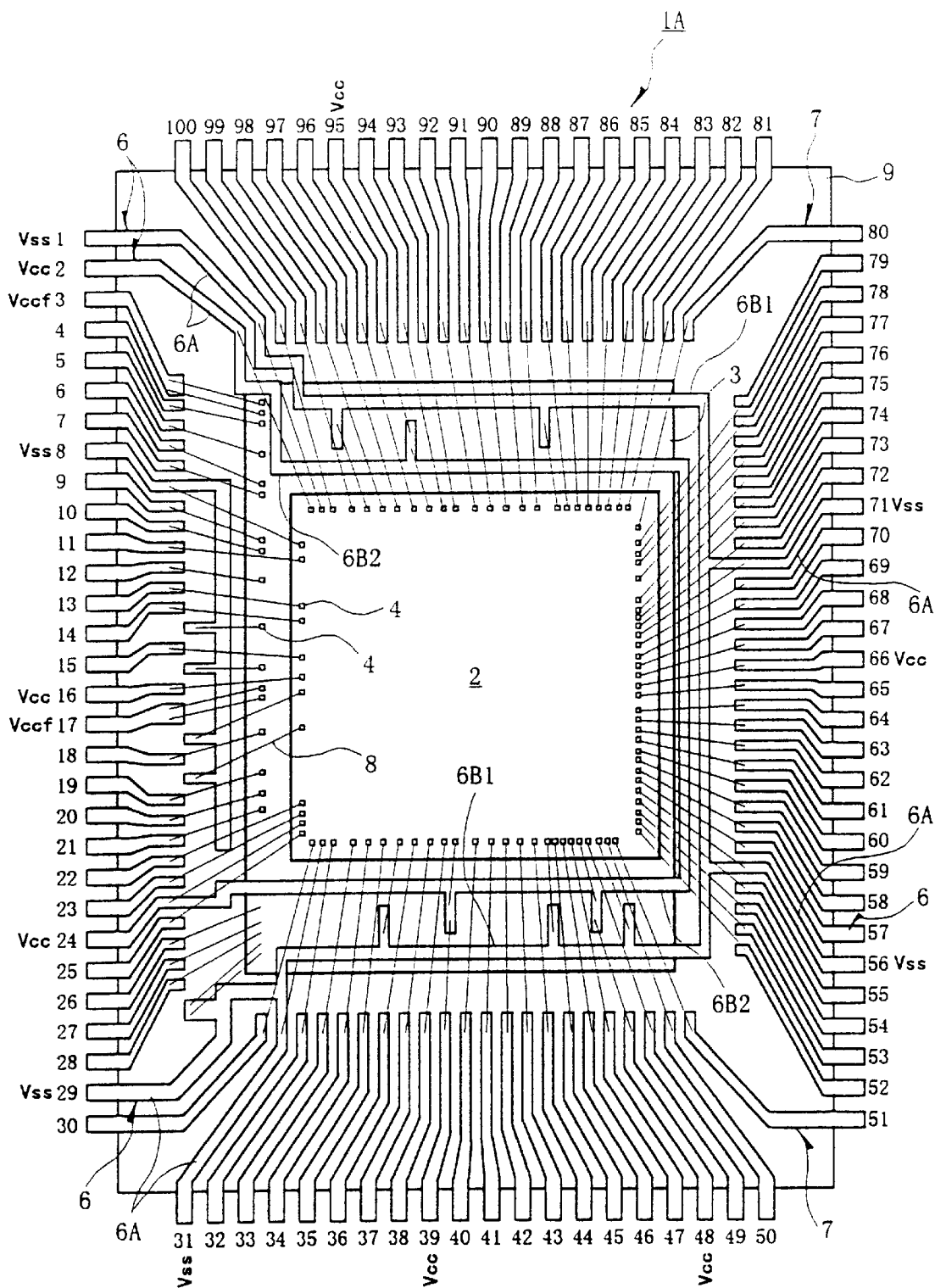
FIG. 12 is a schematic plan view of a semiconductor device which is a second embodiment of the invention with an upper part of a resin encapsulant thereof removed.

FIG. 12 is a schematic plan view of a semiconductor device which is a second embodiment of the invention with an upper part of a resin encapsulant thereof removed.

As shown in FIG. 12, in a semiconductor device 1A of the second embodiment, two types of semiconductor chip support lead portions 6B1 and 6B2 are separately provided for a reference potential (Vss) and a power supply potential (Vcc) respectively instead of the semiconductor chip support lead portions 6B of the first embodiment. Such a configuration makes it possible to use the reference potential (Vss) 6B1 and the power supply potential (Vcc) 6B2 simultaneously with a common lead.

Third Embodiment

Figure 13:
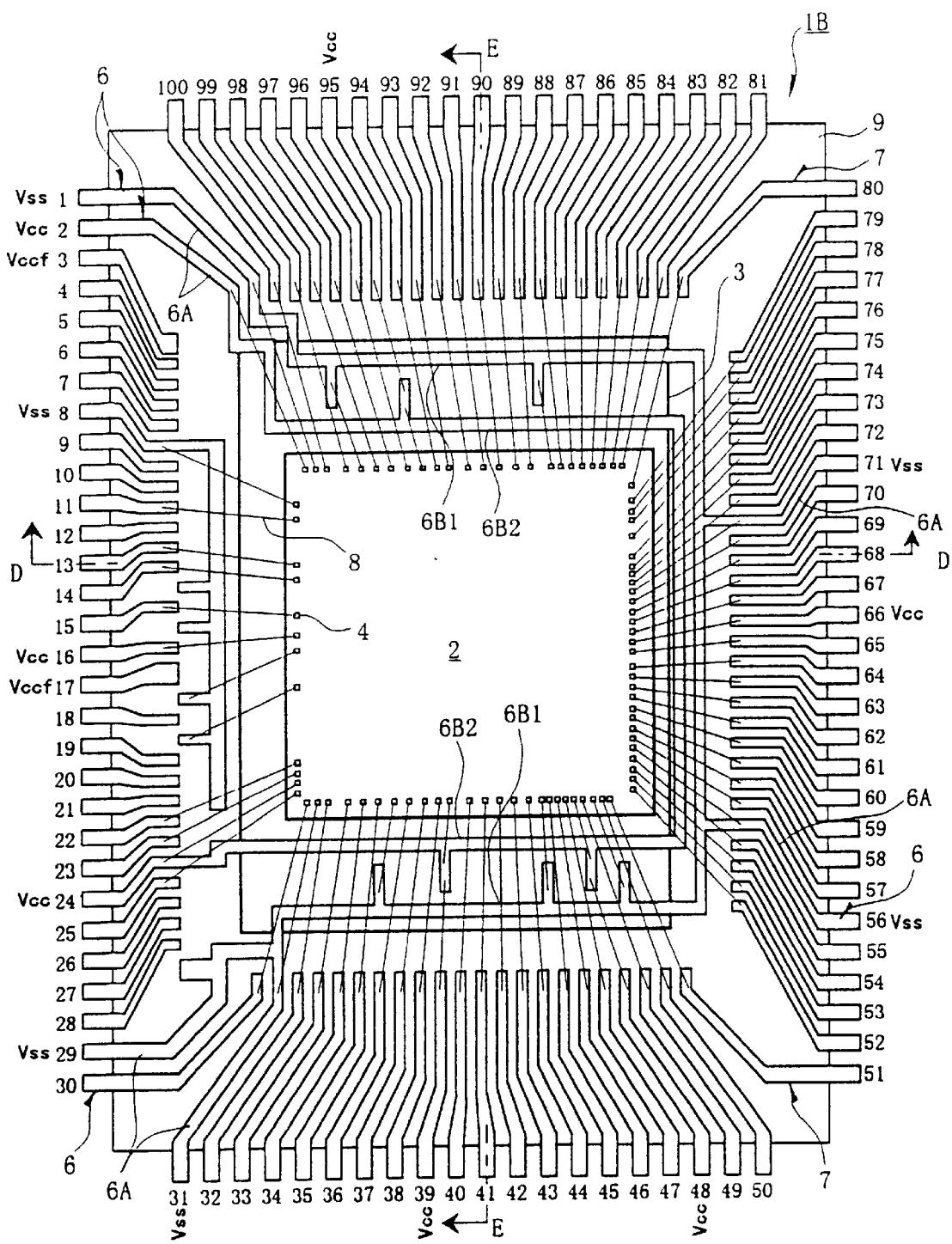
FIG. 13 is a schematic plan view of a semiconductor device which is a third embodiment of the invention with an upper part of a resin encapsulant thereof removed.
Figure 14:
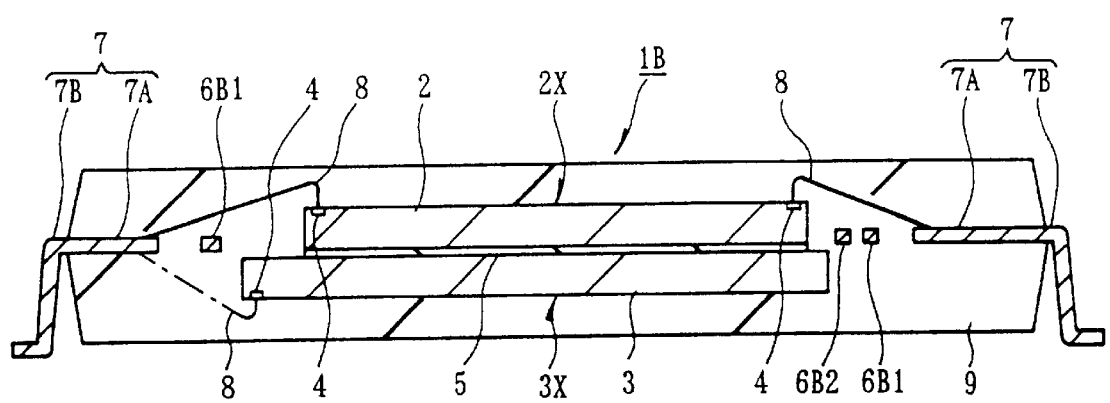
FIG. 14 is a schematic sectional view taken along the line D—D in FIG. 13.
Figure 15:
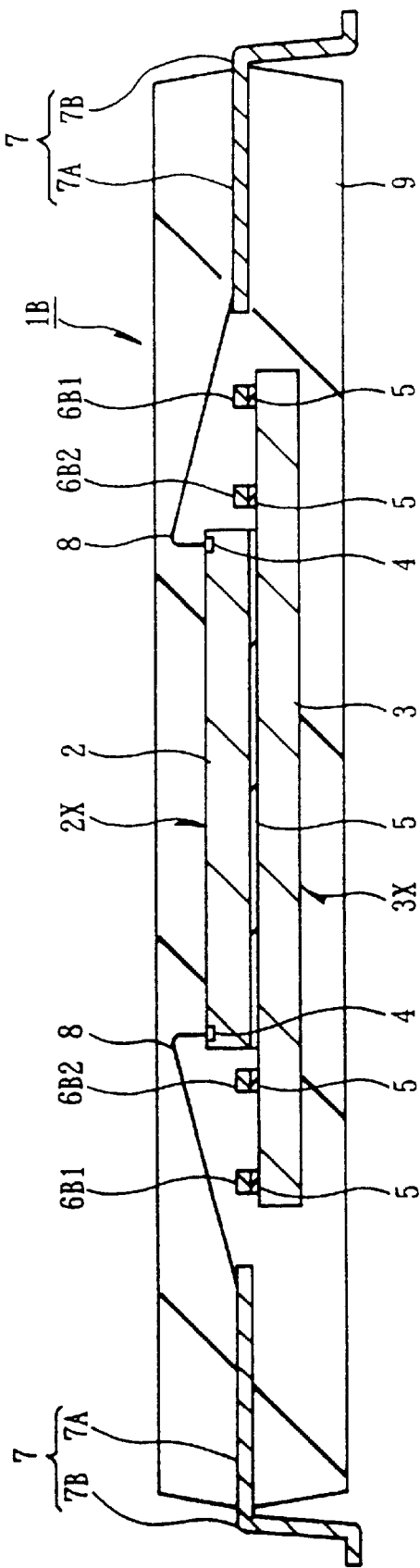
FIG. 15 is a schematic sectional view taken along the line E—E in FIG. 13.

FIG. 13 is a schematic plan view of a semiconductor device which is a third embodiment of the invention with an upper part of a resin encapsulant thereof removed. FIG. 14 is a schematic sectional view taken along the line D—D in FIG. 13. FIG. 15 is a schematic sectional view taken along the line E—E in FIG. 13.

As shown in FIGS. 13, 14 and 15, the configuration of a semiconductor device 1B of the present embodiment is basically the same as those of the first and second embodiments except the following points.

Specifically, when a semiconductor chip 2 is stacked on a semiconductor chip 3, the surfaces (back surfaces) of the semiconductor chips 2 and 3 opposite to the circuit forming surfaces 2X and 3X thereof are bonded and secured to each other, and a support lead 6 is bonded and secured to the back surface of the semiconductor chip 3 with an adhesive 5.

Referring to a method of manufacturing the semiconductor device 1B having such a configuration, in the process of the manufacturing method of the first embodiment, the back surfaces of the semiconductor chips 2 and 3 are bonded and secured to each other in a face-to-face relationship, and wire bonding is performed after the back surface of the semiconductor chip 3 is bonded and secured to each of semiconductor chip support leads 6B1 and 6B2 with the adhesive 5.

At the wire bonding step, electrode pads 4 on the semiconductor chip 2 and inner portions 7A of leads 7 are electrically connected with wires 8; thereafter, the device is inverted into contact with the heat stage; and electrode pads 4 on the semiconductor chip 3 and the leads 7 are electrically connected with wires 8.

Such a configuration provides the same effects as in the above-described first and second embodiments.

Fourth Embodiment

Figure 16:
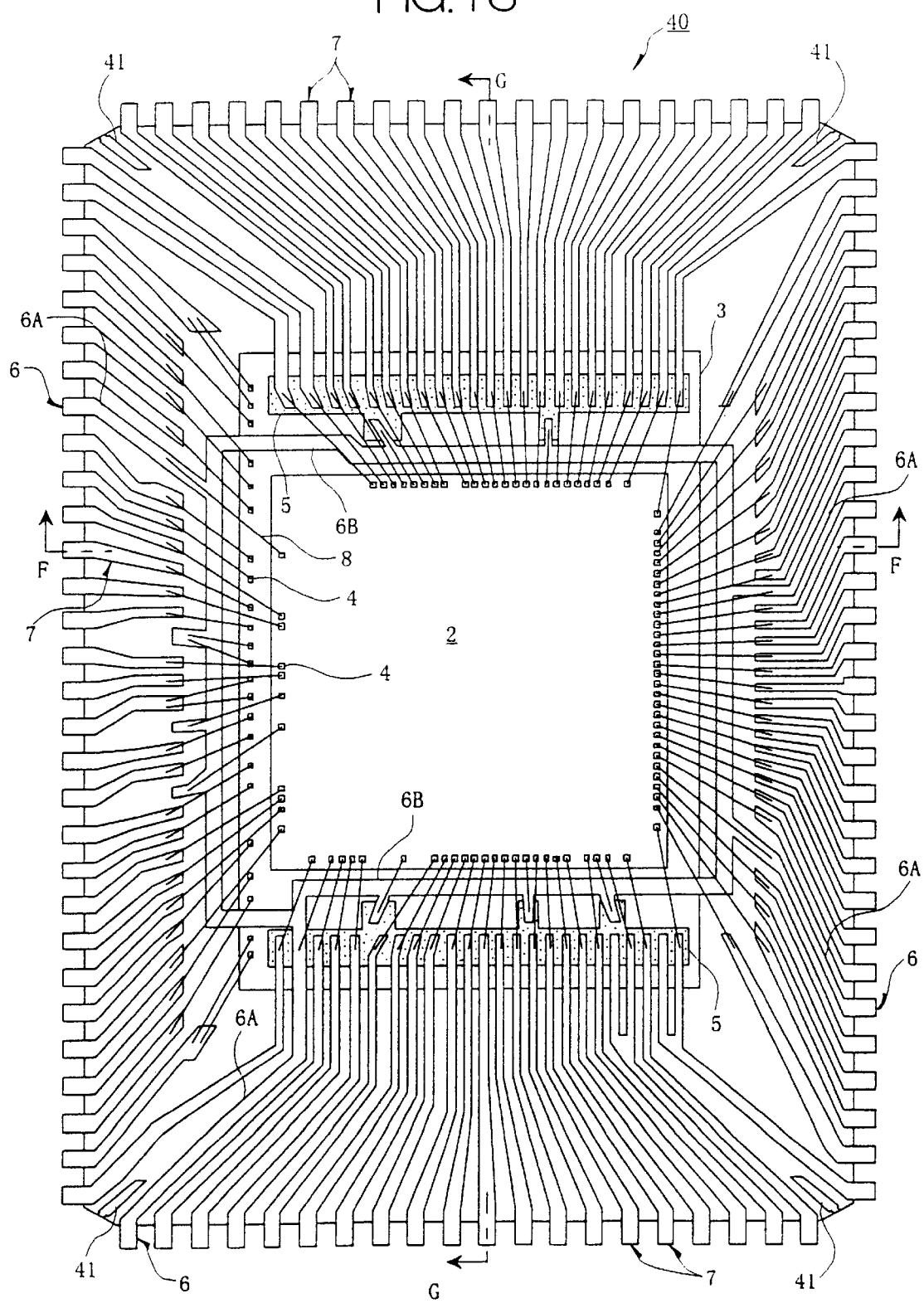
FIG. 16 is a schematic plan view of a semiconductor device which is a fourth embodiment of the invention with an upper part of a resin encapsulant thereof removed.
Figure 17:
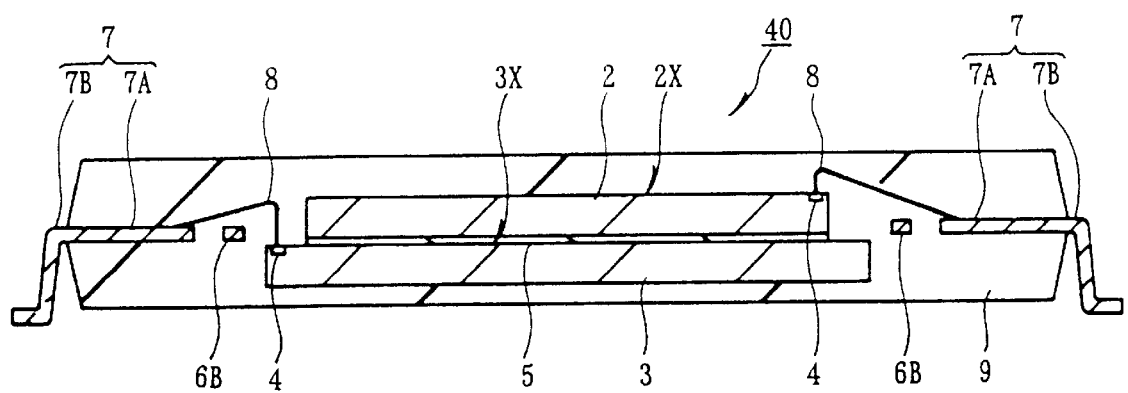
FIG. 17 is a schematic sectional view taken along the line F—F in FIG. 16.
Figure 18:
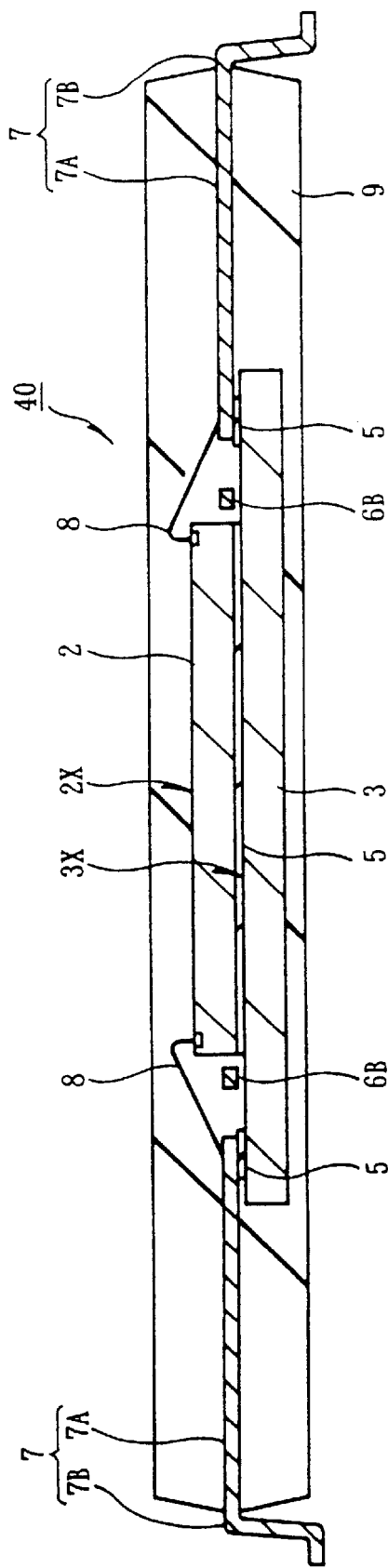
FIG. 18 is a schematic sectional view taken along the line G—G in FIG. 16.

FIG. 16 is a schematic plan view of a semiconductor device which is a fourth embodiment of the invention with an upper part of a resin encapsulant thereof removed. FIG. 17 is a schematic sectional view taken along the line F—F in FIG. 16. FIG. 18 is a schematic sectional view taken along the line G—G in FIG. 16.

As shown in FIGS. 16, 17 and 18, the configuration of a semiconductor device 40 of the present embodiment is basically the same as those of the first and second embodiments except the following points. In FIG. 16, 41 represents package support leads which are cut when the package is finally separated from the lead frame to complete the semiconductor device 40 in a method of manufacturing the semiconductor device 40.

Specifically, inner portions 7A of leads 7 are bonded and secured on to a circuit forming surface 3X of a semiconductor chip 3 with an adhesive (film or coating layer) 5 similarly to semiconductor chip support lead portions 6B1 and 6B2 of a support lead 6.

Such a configuration makes it possible to reduce the length of bonding wires for connecting inner portions 7A of leads 7 provided at shorter sides of the semiconductor chip 3 to the semiconductor chip 2. As a result, it is possible to prevent the wires from being inclined by encapsulating region during molding to cause shorting between the wires and between the wires and the semiconductor chips.

By supporting the semiconductor chip 3 at the inner portions 7A of the leads 7 provided at the shorter sides of the semiconductor chip 3, the semiconductor chip 3 is supported by the semiconductor chip support lead portions 6B1 and 6B2 and the inner portions 7A of the leads 7 provided at the shorter sides of the semiconductor chip 3 and, as a result, the possibility of inclination of the semiconductor chips 2 and 3 can be significantly reduced. Especially, it is possible to reliably prevent the inclination of the semiconductor chips during molding.

Fifth Embodiment

Figure 19:
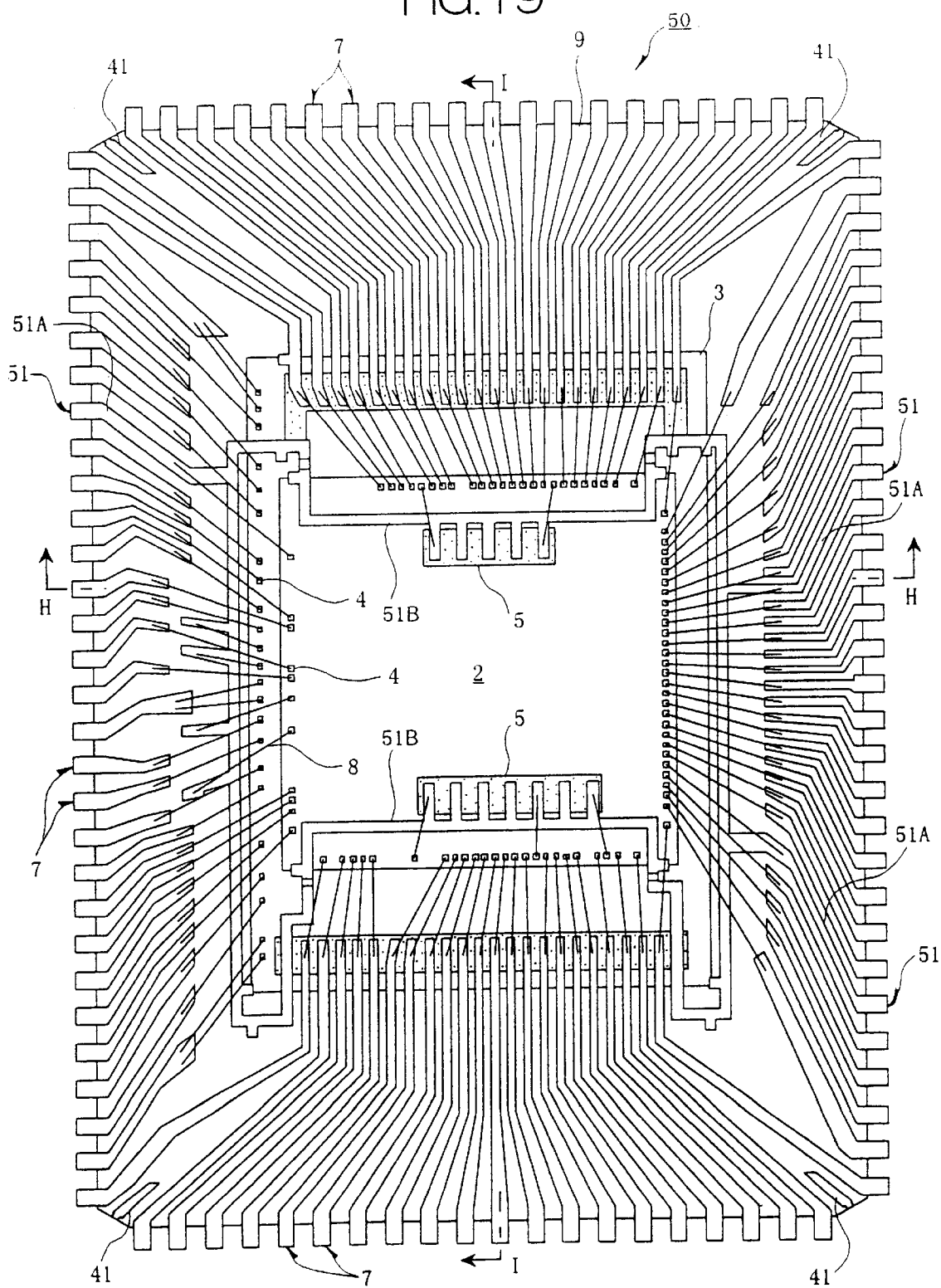
FIG. 19 is a schematic plan view of a semiconductor device which is a fifth embodiment of the invention with an upper part of a resin encapsulant thereof removed.
Figure 20:
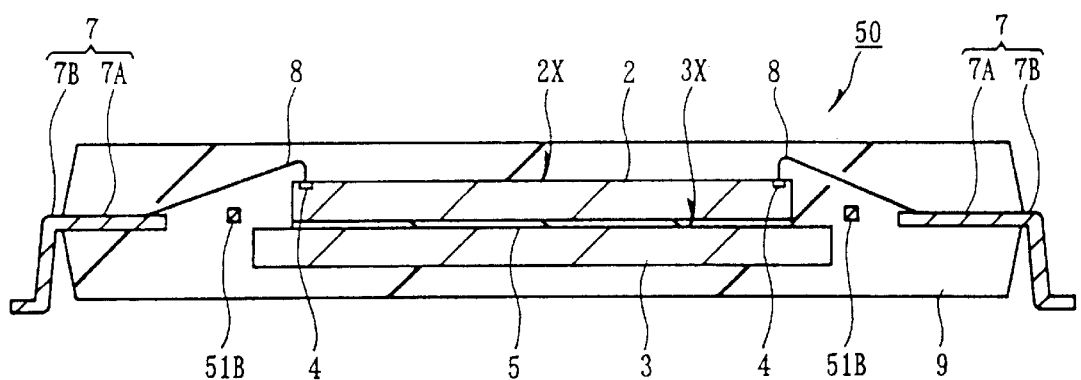
FIG. 20 is a schematic sectional view taken along the line H—H in FIG. 19.
Figure 21:
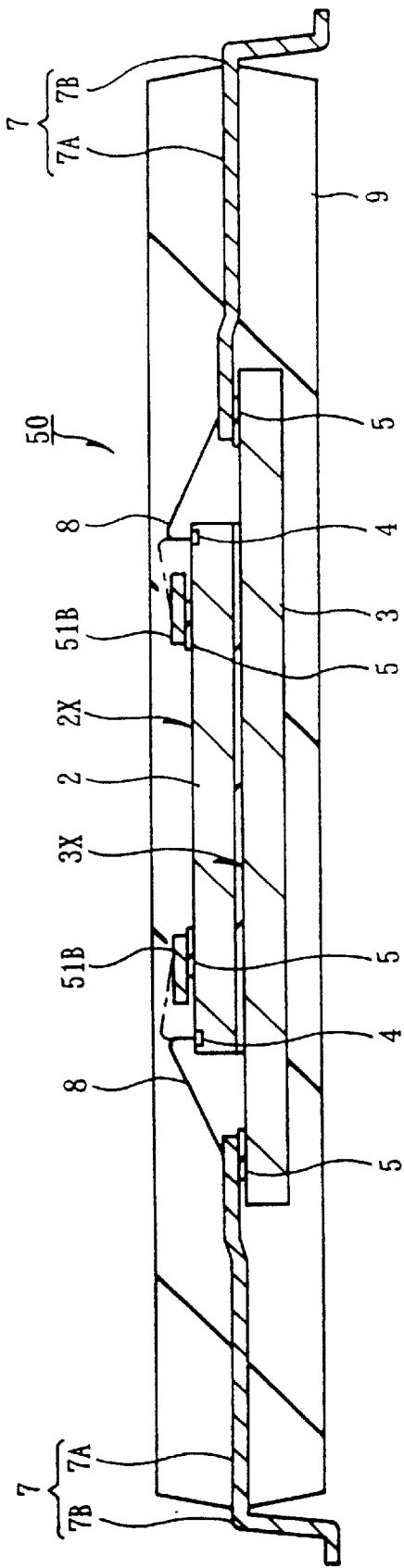
FIG. 21 is a schematic sectional view taken along the line I—I in FIG. 19.

FIG. 19 is a schematic plan view of a semiconductor device which is a fifth embodiment of the invention with an upper part of a resin encapsulant thereof removed. FIG. 20 is a schematic sectional view taken along the line H—H in FIG. 19. FIG. 21 is a schematic sectional view taken along the line I—I in FIG. 19.

As shown in FIGS. 19 through 21, the configuration of a semiconductor device 50 of the fifth embodiment is basically the same as that of the fourth embodiment except the following points.

A support lead 51 is used which is a modification of the configuration of the support lead 6 of the fourth embodiment. Semiconductor chip support lead portions (bus bars) 51B of the support lead 51 are secured to circuit forming surfaces 2X and 3X of respective semiconductor chips 2 and 3 with an adhesive 5.

The support lead 51 is comprised of suspended lead portions 51A and the semiconductor chip support lead portions (bus bars) 51B which are integrally formed from the same material.

Such a configuration makes it possible to bond the semiconductor chips 2 and 3 to each other and support the semiconductor chips 2 and 3 with improved rigidity.

A description will now be made with reference to FIGS. 22A, 22B and 22C (schematic sectional views) on a method of manufacturing the semiconductor device 50 of the fifth embodiment.

Figure 22:
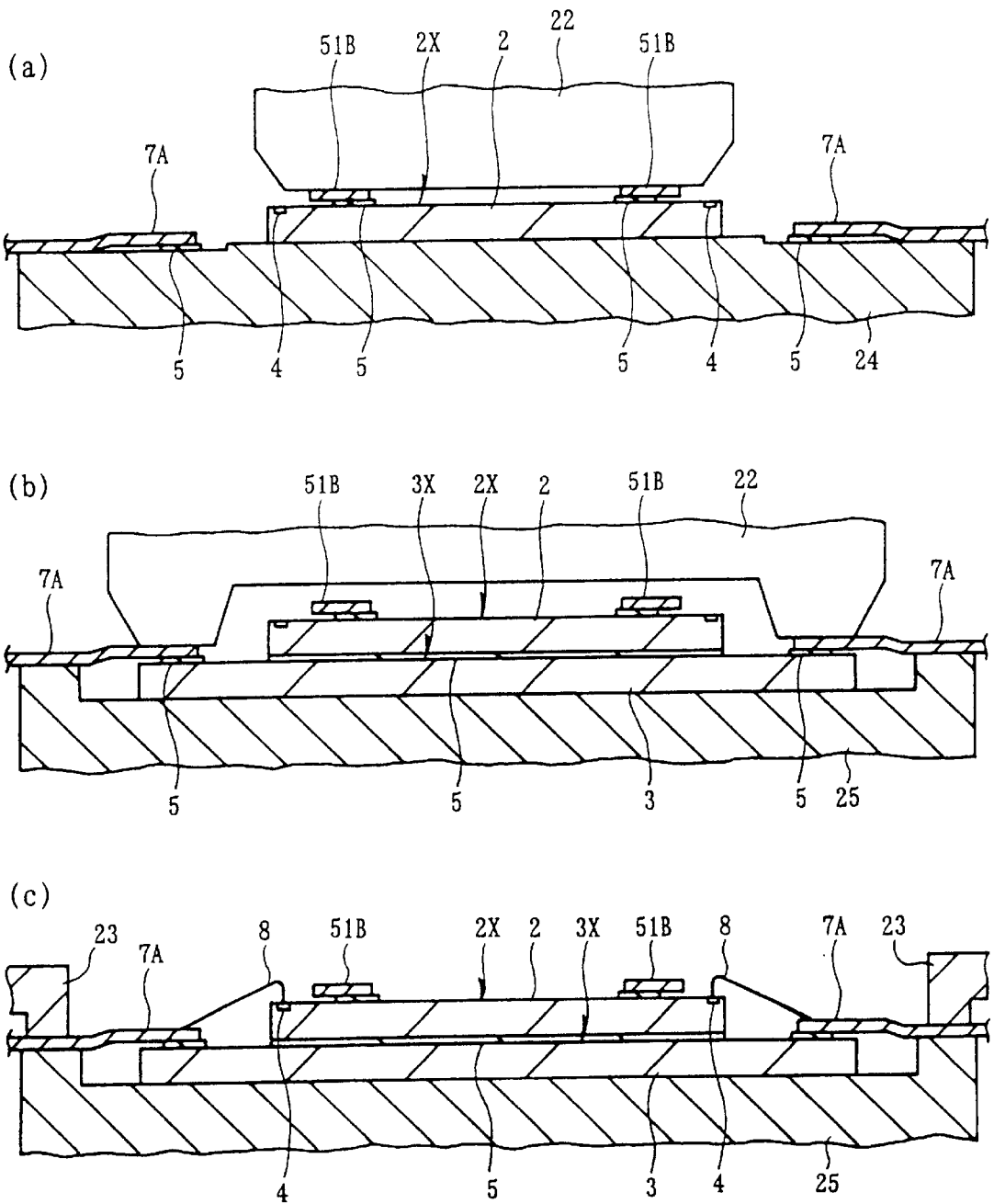
FIGS. 22A, 22B and 22C are schematic sectional views of a semiconductor device according to the fifth embodiment for explaining the manufacture of the same.

As shown in FIG. 22A, the semiconductor chip 2 is first mounted on a heat stage 24; a lead frame LF is placed on the same; a tool 22 is urged against the same while being heated; and the back surface of the semiconductor chip support lead portions (bus bars) 51B is bonded to the circuit forming surface 2X of the semiconductor chip 2.

Next, as shown in FIG. 22B, the semiconductor chip 3 is mounted on a heat stage 25; an adhesive 5 (e.g., a pasty agent) is applied to the circuit forming surface 3X of the semiconductor chip 3; inner portions 7A of leads 7 of the lead frame LF are placed on the same; a tool 22 is urged against the same while being heated; and bonding portions of the leads are bonded to the circuit forming surface 3X of the semiconductor chip 3 with the adhesive 5.

Next, as shown in FIG. 22C, the top surface of the lead frame LF is pressed by and fixed with a frame pressing member 23; the heat stage 25 is heated to warm the semiconductor chips 2 and 3; and the inner portions 7A of the leads 7, the semiconductor chip support lead portions (bus bars) 51B and electrode pads 4 on the semiconductor chips 2 and 3 are respectively electrically connected with wires (e.g., Au wires) 8.

A resin encapsulant 9 is then formed by resin-encapsulating the semiconductor chips 2 and 3, inner portions of the support lead 51 (inner portions of the suspended lead portions 51A and the semiconductor chip support lead portions (bus bars) 51B), inner portions 7A of the leads 7, the wires 8 and the like. The resin encapsulant 9 is formed using transfer molding. Thus, a semiconductor device 50 according to the fifth embodiment is formed on a lead frame LF as shown in FIG. 9.

Next, tie bars 10 connected to the leads 7 are cut off from the leads 7; a plating process is thereafter performed on outer portions 7B of the leads 7; the leads 7 are thereafter cut off from the frame 11 of the lead frame LF; each of the outer portions 7B of the leads 7 is thereafter molded into a configuration for surface mounting, e.g., a gull wing configuration; and the support lead 6 is cut off from the frame 11 of the lead frame LF to complete a semiconductor device 50 as shown in FIGS. 19 through 21 substantially.

Figure 23:
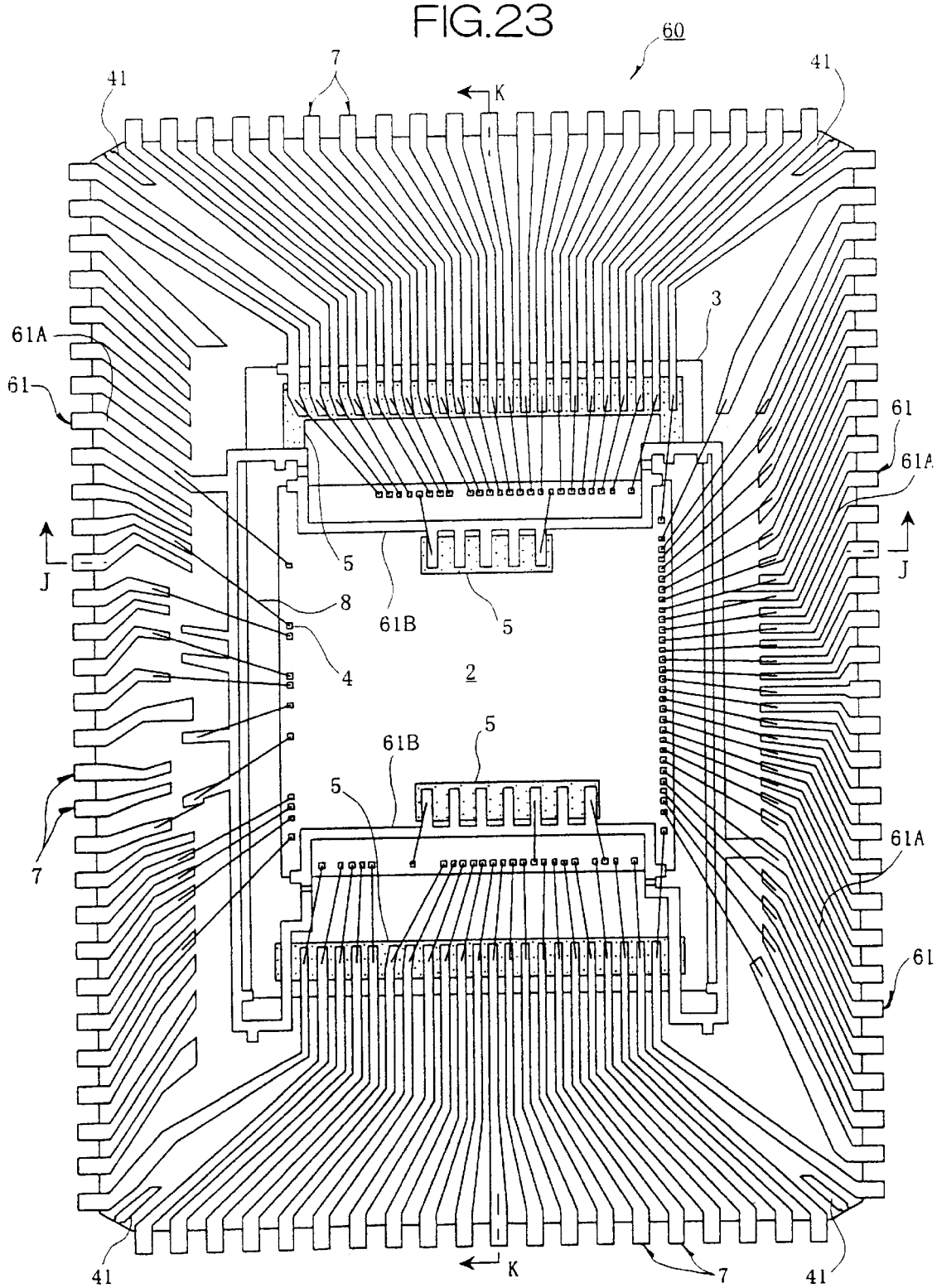
FIG. 23 is a schematic plan view of a semiconductor device which is a sixth embodiment of the invention with an upper part of a resin encapsulant thereof removed.
Figure 24:
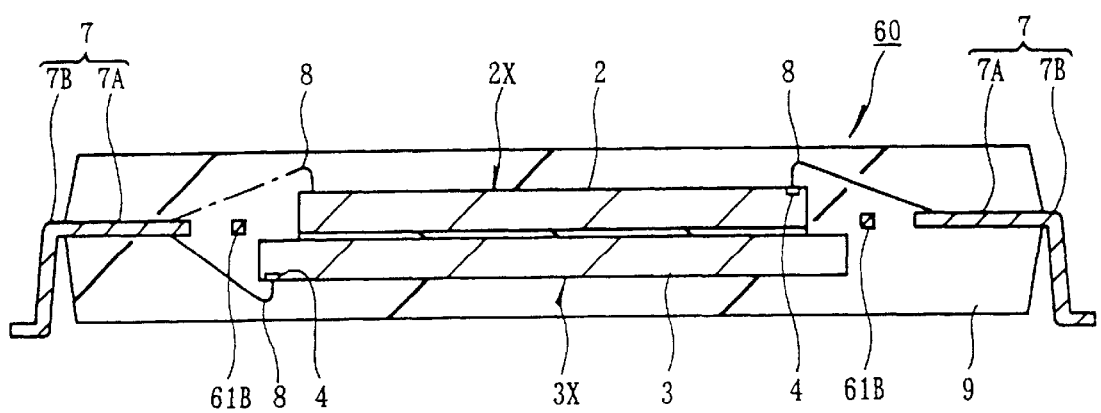
FIG. 24 is a schematic sectional view taken along the line J—J in FIG. 23.
Figure 25:
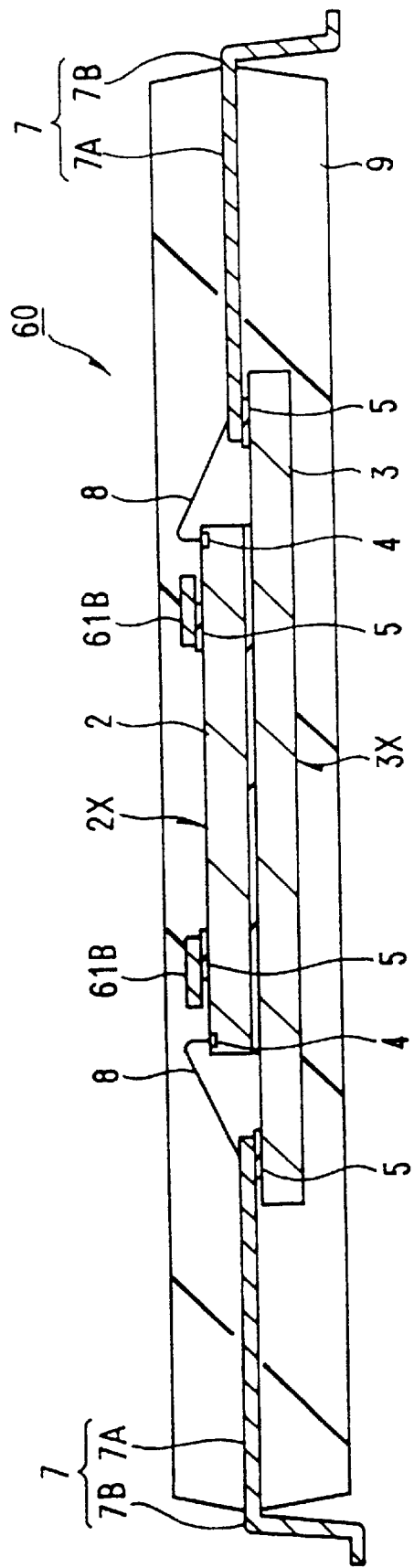
FIG. 25 is a schematic sectional view taken along the line K—K in FIG. 23.

Sixth Embodiment FIG. 23 is a schematic plan view of a semiconductor device which is a sixth embodiment of the invention with an upper part of a resin encapsulant thereof removed. FIG. 24 is a schematic sectional view taken along the line J—J in FIG. 23. FIG. 25 is a schematic sectional view taken along the line K—K in FIG. 23.

As shown in FIGS. 23 and 25, the configuration of a semiconductor device 60 of the sixth embodiment is basically the same as that of the third embodiment except the following points.

When a semiconductor chip 2 is stacked on a semiconductor chip 3, surfaces (back surfaces) of the semiconductor chips 2 and 3 opposite to respective circuit forming surfaces 2X and 3X are bonded and secured to each other with an adhesive 5. The stack formed by the semiconductor chips 2 and 3 is supported using a semiconductor chip support lead 61 which is a modification of the configuration of the semiconductor chip support lead 6. Specifically, semiconductor chip support lead portions (bus bars) 61B of the support lead 61 are secured to the surfaces (back surfaces) of the semiconductor chips 2 and 3 opposite to the respective circuit forming surfaces 2X and 3X with the adhesive 5.

The support lead 61 is comprised of suspended lead portions 61A and the semiconductor chip support lead portions (bus bars) 61B which are integrally formed from the same material.

Such a configuration makes it possible to bond the semiconductor chips 2 and 3 to each other and support the semiconductor chips 2 and 3 with improved rigidity.

While the surfaces (back surfaces) of the semiconductor chips 2 and 3 opposite to the respective circuit forming surfaces 2X and 3X are bonded and secured to each other with the adhesive 5 according to the sixth embodiment, the back surfaces may be secured to each other using the semiconductor chip support lead 61 by simply putting them in contact with each other without using the adhesive 5.

A description will now be made with reference to FIGS. 26A, 26B, 26C and 26D (schematic sectional views) on a method of manufacturing the semiconductor device 60 of the sixth embodiment. FIGS. 26A, 26B and 26C are schematic sectional views taken along the line K—K in FIG. 23, and FIG. 26D is a schematic sectional view taken along the line J—J in FIG. 23.

Figure 26:
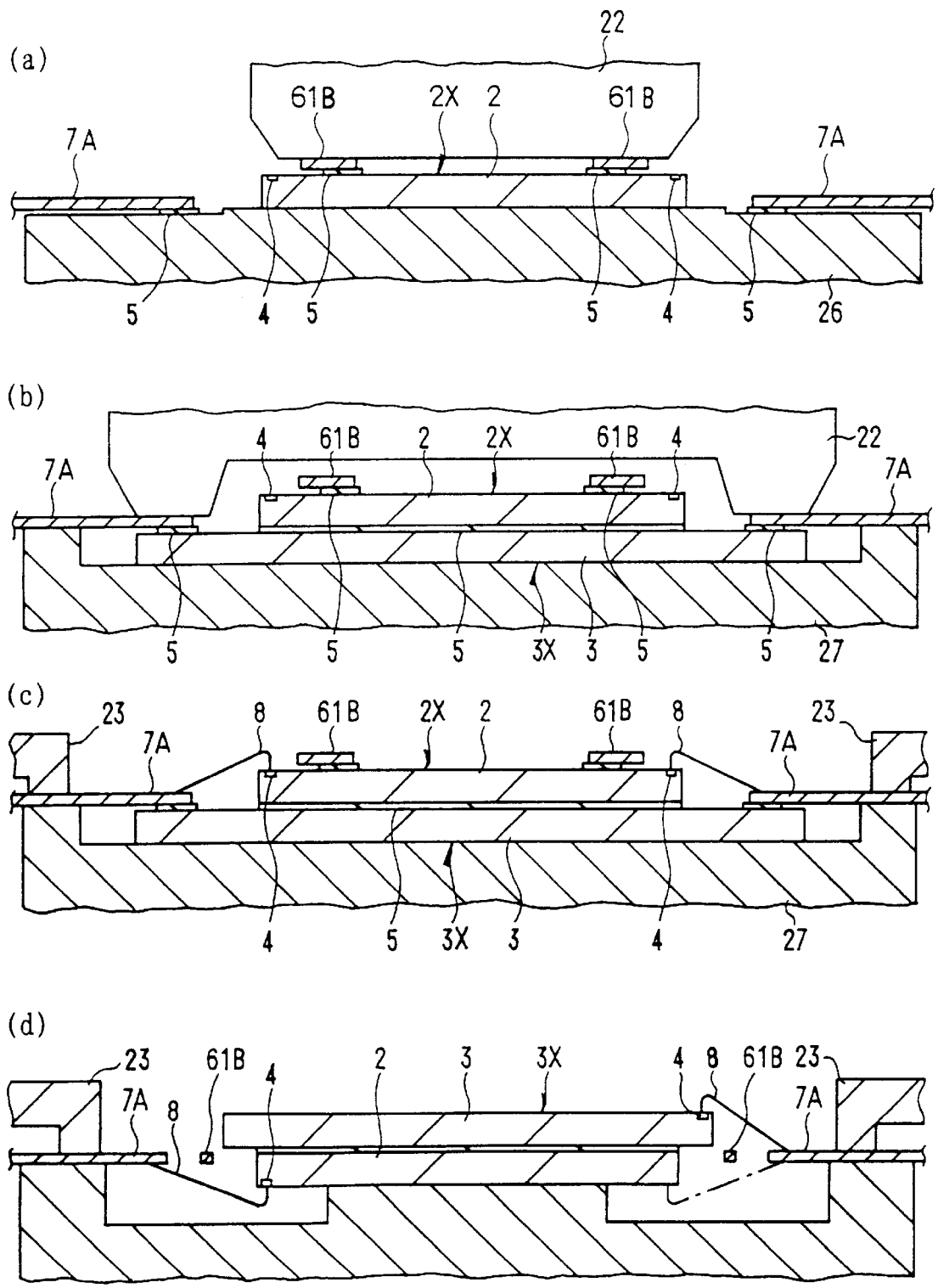
FIGS. 26A, 26B, 26C and 26D are schematic sectional views of a semiconductor device according to the sixth embodiment for explaining the manufacture of the same.

As shown in FIG. 26A, the semiconductor chip 2 is first mounted on a heat stage 26; semiconductor chip support lead portions (bus bars) 61B of a semiconductor chip support lead 61 of a lead frame LF is placed on the same; a tool 22 is urged against the same while being heated; and the back surface of the semiconductor chip lead support lead portions (bus bars) 61B is bonded to the circuit forming surface 2X of the semiconductor chip 2.

Next, as shown in FIG. 26B, the semiconductor chip 3 is mounted on another heat stage 27; the adhesive 5 (e.g., a pasty agent) is applied to the surface (back surface) of the semiconductor chip 3 opposite to the circuit forming surface 3X; the surface (back surface) of the semiconductor chip 2 opposite to the circuit forming surface 2X is placed on the same; and the semiconductor chip support lead portions (bus bars) 61B of the lead frame LF and inner portions 7A of leads 7 are placed on the same and are urged by the tool 22 to be bonded and secured.

As shown in FIG. 26C, the top surface of the lead frame LF of the stack formed by bonding and securing surfaces (back surfaces) of the semiconductor chips 2 and 3 opposite to the respective circuit forming surfaces thereof to each other is pressed with a frame pressing member 23 to secure the semiconductor chip support lead portions (bus bars) 61B and the inner portions 7A of the leads 7; the heat stage 27 is heated to warm the semiconductor chips 2 and 3; and the inner portions 7A of the leads 7, the semiconductor chip support lead portions (bus bars) 61B and electrode pads 4 on the first semiconductor chip 2 are respectively electrically connected with wires (e.g., Au wires) 8.

Next, as shown in FIG. 26D, the stack formed by the semiconductor chips 2 and 3 is inverted after the above-described step such that the semiconductor chip 3 is located upward; the back surface of the lead frame LF is secured with the lead frame pressing member 23; a heat stage 28 is heated to warm the semiconductor chips 2 and 3; and inner portions 7A of leads 7, semiconductor chip support lead portions (bus bars) 61B and electrode pads 4 on the semiconductor chip 3 are respectively electrically connected with wires (e.g., Au wires) 8.

Deep recesses 28A are provided on both sides of the heat stage 28 in order to prevent the semiconductor chip 3 and wires 8 from contacting each other at this step.

A resin encapsulant 9 is then formed by resin-encapsulating the semiconductor chips 2 and 3, the inner portions of the semiconductor chip support lead 61 (inner portions of the suspended lead portions 61A and the semiconductor chip support lead portions (bus bars) 61B), inner portions 7A of the leads 7, the wires 8 and the like. The resin encapsulant 9 is formed using transfer molding. Thus, a semiconductor device 60 according to the sixth embodiment is formed on a lead frame LF as shown in FIG. 9.

Seventh Embodiment

Figure 27:
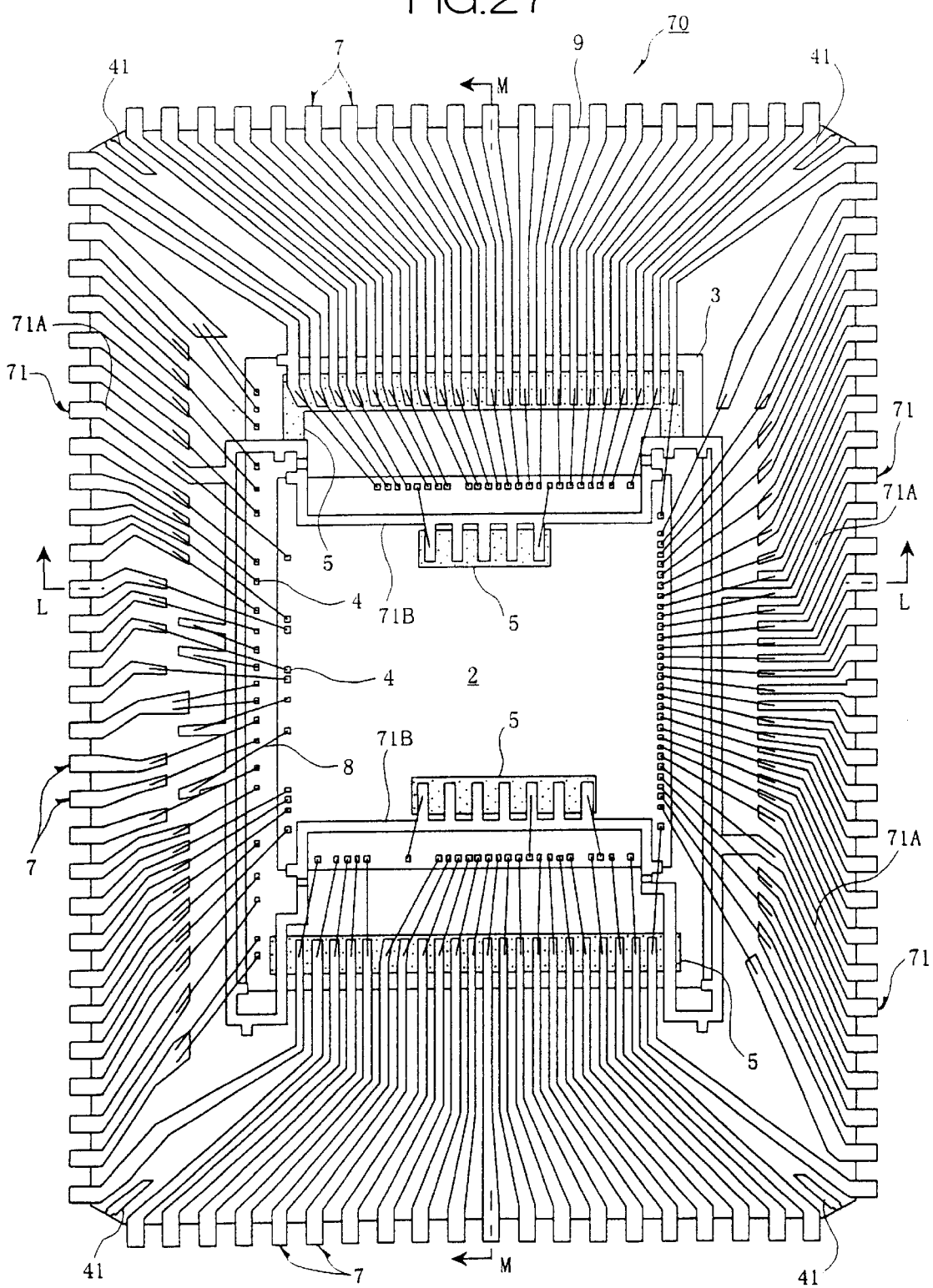
FIG. 27 is a schematic plan view of a semiconductor device which is a seventh embodiment of the invention with an upper part of a resin encapsulant thereof removed.
Figure 28:
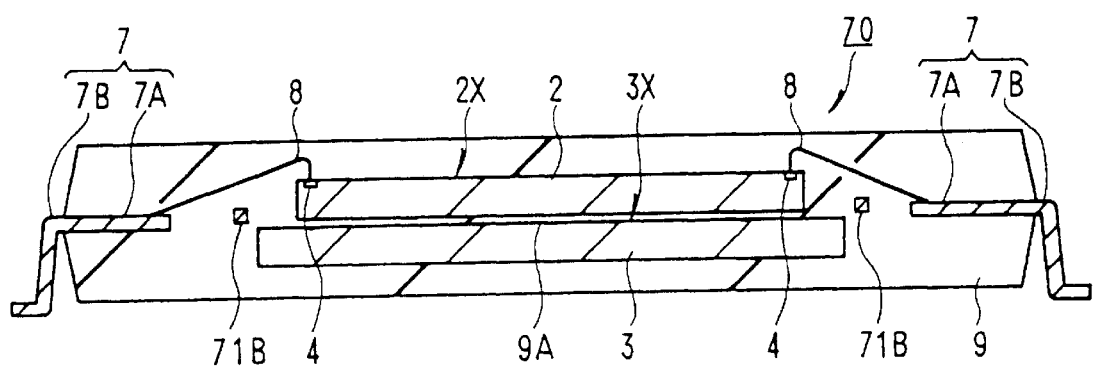
FIG. 28 is a schematic sectional view taken along the line L—L in FIG. 27.
Figure 29:
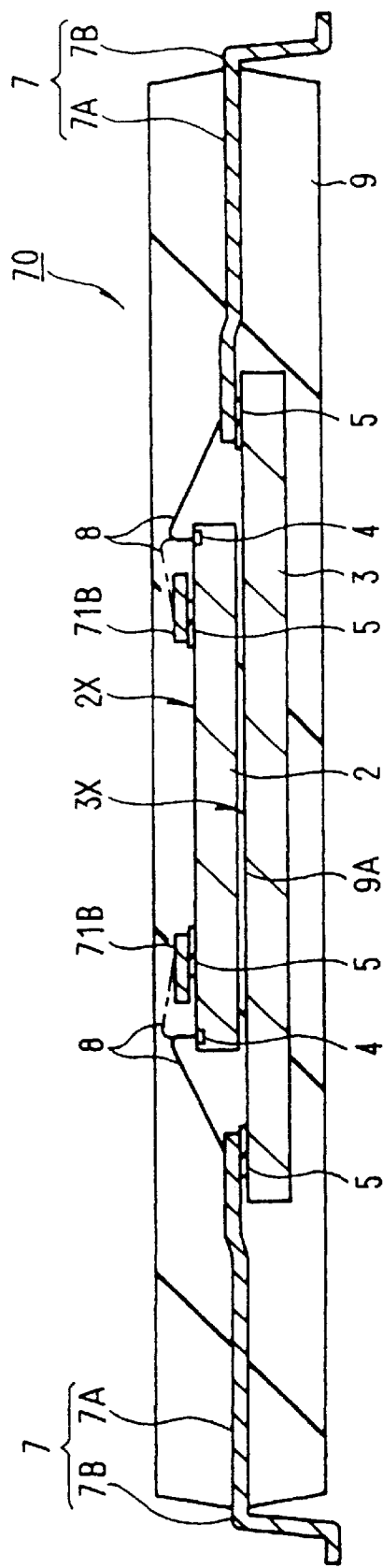
FIG. 29 is a schematic sectional view taken along the line M—M in FIG. 27.

FIG. 27 is a schematic plan view of a semiconductor device which is a seventh embodiment of the invention with an upper part of a resin encapsulant thereof removed. FIG. 28 is a schematic sectional view taken along the line L—L in FIG. 27. FIG. 29 is a schematic sectional view taken along the line M—M in FIG. 27.

As shown in FIGS. 27 through 29, the configuration of a semiconductor device 70 of the seventh embodiment is basically the same as that of the fifth embodiment except the following points.

A semiconductor chip 2 is stacked on a semiconductor chip 3; a surface (back surface) of the semiconductor chip 2 opposite to a circuit forming surface 2X thereof is secured to a circuit forming surface 3X of the semiconductor chip 3 with a resin encapsulating material (resin 9A of a resin encapsulant 9) interposed therebetween; and a semiconductor chip support lead 71 is bonded and secured to the circuit forming surfaces 2X and 3X of the respective semiconductor chips 2 and 3. The support lead 71 is comprised of suspended lead portions 71A and the semiconductor chip support lead portions (bus bars) 71B which are integrally formed from the same material.

With such a configuration, the stack is formed by the semiconductor chips 2 and 3 with a resin encapsulating material interposed therebetween without using any adhesive on the surfaces of the chips facing each other. This makes it possible to prevent any crack attributable to thermal expansion caused by heat generated when the semiconductor device is subjected to a reflow process and when the device operates.

A description will now be made with reference to FIGS. 30A, 30B and 30C (schematic sectional views) on a method of manufacturing the semiconductor device 70 of the seventh embodiment.

As shown in FIG. 30A, the semiconductor chip 2 is first mounted on a heat stage 24; a lead frame LF is placed on the same; and a tool 22 is urged against the same while being heated to bond and secure the back surface of the semiconductor chip support lead portions (bus bars) 71B of the semiconductor chip support lead 71 to the circuit forming surface 2X of the semiconductor chip 2 with an adhesive 5.

Next, as shown in FIG. 30B, the semiconductor chip 3 is mounted on a heat stage 25; the adhesive 5 and a pasty agent are applied to the circuit forming surface 3X of the semiconductor chip 3; and the tool 22 is urged against the same while being heated to secure and support the semiconductor chips with the semiconductor chip support lead 71 such that a stack is formed in which the surface (back surface) 2Y of the semiconductor chip 2 opposite to the circuit forming surface 2X thereof and the circuit forming surface 3X of the semiconductor chip 3 face each other with a gap 9B between them and to bond and secure inner portions 7A of leads 7 on to the circuit forming surface 3X of the semiconductor chip 3 with the adhesive 5.

As shown in FIG. 30C, the top surface of the lead frame LF is pressed with a frame pressing member 23; the heat stage 25 is heated to secure the inner portions 7A of the lead 7; electrode pads 4 on each of the semiconductor chips 2 and 3 and the inner portions 7A of the leads 7 are electrically connected through conductive wires 8.

Next, the semiconductor chips 2 and 3, the wires 8 and the inner portions 7A of the leads 7 are encapsulated with resin to form a resin encapsulant 9. The resin encapsulant 9 is formed using transfer molding. Thus, a semiconductor device 70 according to the seventh embodiment is formed on a lead frame LF as shown in FIG. 9.

Eighth Embodiment

Figure 31:
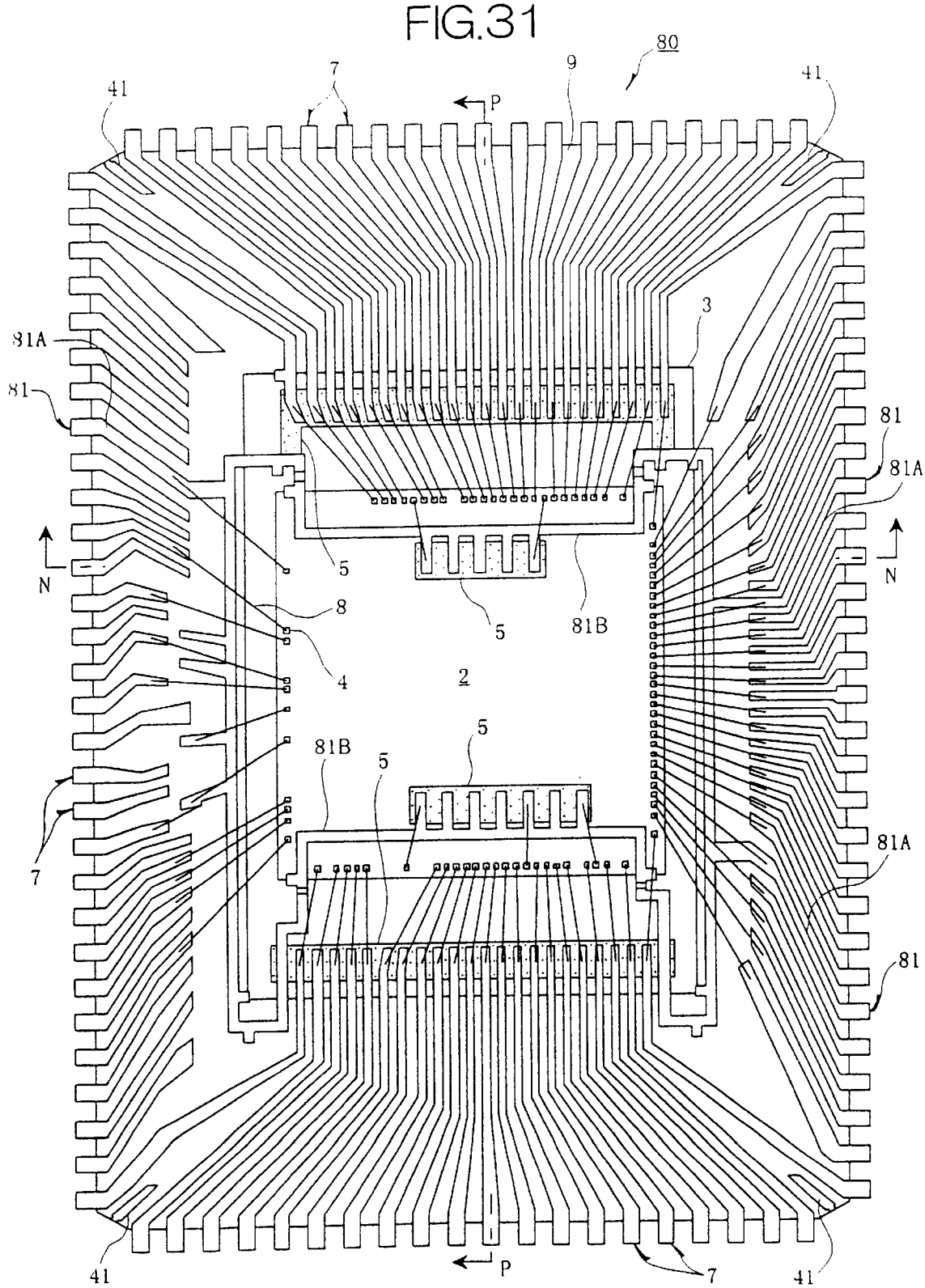
FIG. 31 is a schematic plan view of a semiconductor device which is an eighth embodiment of the invention with an upper part of a resin encapsulant thereof removed.
Figure 32:
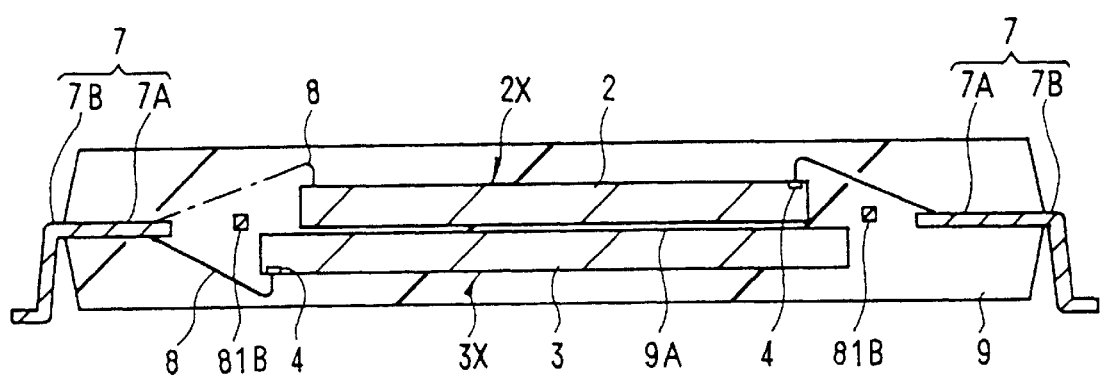
FIG. 32 is a schematic sectional view taken along the line N—N in FIG. 31.
Figure 33:
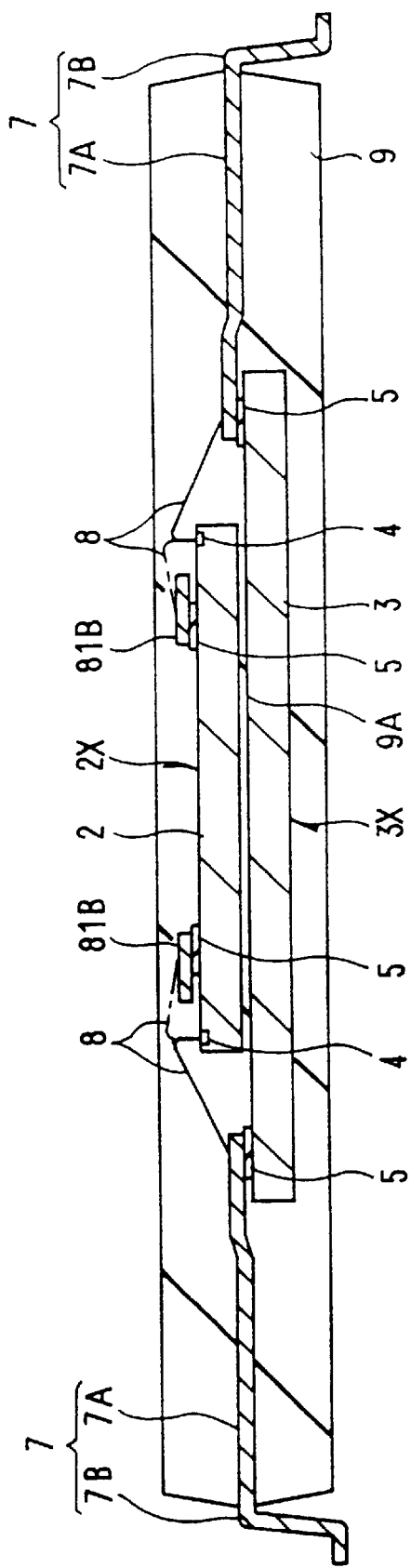
FIG. 33 is a schematic sectional view taken along the line P—P in FIG. 31.

FIG. 31 is a schematic plan view of a semiconductor device which is an seventh embodiment of the invention with an upper part of a resin encapsulant thereof removed. FIG. 32 is a schematic sectional view taken along the line N—N in FIG. 30. FIG. 33 is a schematic sectional view taken along the line P—P in FIG. 31.

As shown in FIGS. 31 through 33, the configuration of a semiconductor device 80 of the eighth embodiment is basically the same as that of the sixth embodiment except the following points.

When a semiconductor chip 2 is stacked on a semiconductor chip 3, surfaces (back surfaces) 2Y and 3Y of the respective semiconductor chips 2 and 3 opposite to circuit forming surfaces 2X and 3X thereof are put in a face-to-face relationship with each other, and a semiconductor chip support lead 81 is used to stack them with a gap between them. Semiconductor chip support lead portions (bus bars) 81B of the semiconductor chip support lead 81 are bonded and secured to the circuit forming surface 2X of the semiconductor chip 2 and the surface (back surface) 3Y of the semiconductor chip 3 opposite to the circuit forming surface 3X with an adhesive 5.

The support lead 81 is comprised of suspended lead portions 81A and the semiconductor chip support lead portions (bus bars) 81B which are integrally formed from the same material.

With such a configuration, semiconductor chips 2 and 3 are secured into a stack with resin of a resin encapsulant 9 interposed between them without using any adhesive on the surfaces of the semiconductor chips 2 and 3 facing each other. This makes it possible to prevent any crack attributable to thermal expansion caused by heat generated when the semiconductor device is subjected to a reflow process and when the device operates.

A description will now be made with reference to FIGS. 34A, 34B, 34C and 34D (schematic sectional views) on a method of manufacturing the semiconductor device 80 of the eighth embodiment.

Figure 34:
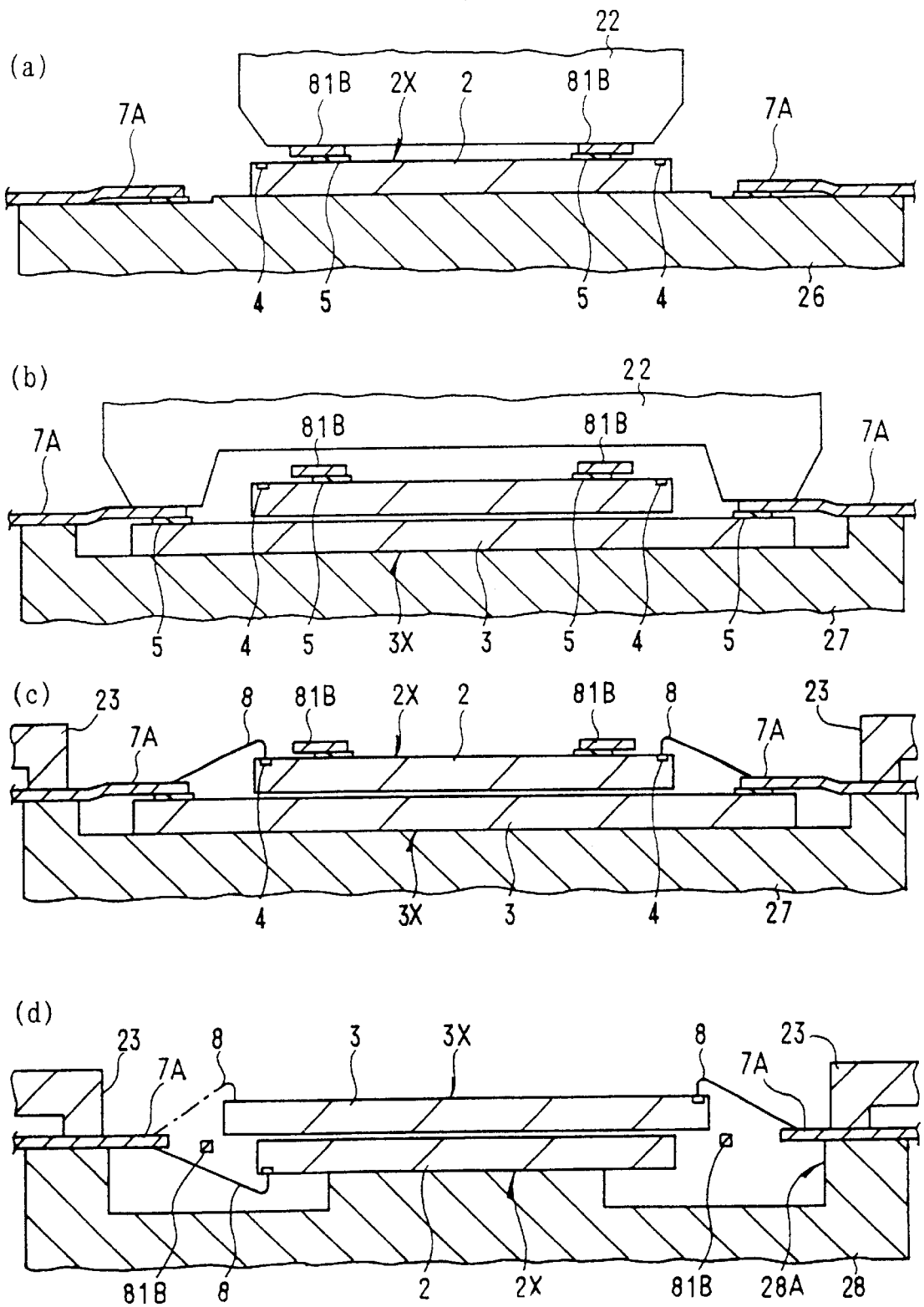
FIGS. 34A, 34B, 34C and 34D are schematic sectional views of a semiconductor device according to the eighth embodiment for explaining the manufacture of the same.

As shown in FIG. 34A, the semiconductor chip 2 is first mounted on a heat stage 26; a lead frame LF is placed on the same; and a tool 22 is urged against the same while being heated to bond and secure the back surface of the semiconductor chip support lead portions (bus bars) 81B of the semiconductor chip support lead 81 to the circuit forming surface 2X of the semiconductor chip 2 with the adhesive 5.

Next, as shown in FIG. 34B, the semiconductor chip 3 is mounted on a heat stage 27 separate from the heat stage 26; the adhesive 5 (e.g., a pasty agent) is applied to the surface (back surface) 3Y of the semiconductor chip 3 opposite to the circuit forming surface 3X thereof; the lead frame LF is placed on the same; and the tool 22 is urged against the same while being heated to support the semiconductor chips by bonding and securing them with the semiconductor chip support lead 81 such that a stack is formed in which a gap 9B is formed between the surface (back surface) 2Y of the semiconductor chip 2 opposite to the circuit forming surface 2X thereof and the surface (back surface) 3Y of the semiconductor chip 3 opposite to the circuit forming surface 3X of the semiconductor chip 3 and to bond and secure inner portions 7A of leads 7 on to the back surface 3Y of the semiconductor chip 3 with the adhesive 5.

As shown in FIG. 34C, the top surface of the lead frame LF is pressed with a frame pressing member 23; the heat stage 27 is heated to warm the semiconductor chips 2 and 3; and the inner portions 7A of the leads 7, the semiconductor chip support lead portions (bus bars) 81B and electrode pads 4 on the semiconductor chip 2 are electrically connected using wires (e.g., Au wires) 8.

Next, as shown in FIG. 34D, the stack formed by the semiconductor chips 2 and 3 is inverted after the step shown in FIG. 34C such that the semiconductor chip 3 is located upward; the back surface of the lead frame LF is secured to a heat stage 28 with the lead frame pressing member 23; the heat stage 28 is heated to warm the semiconductor chips 2 and 3; and inner portions 7A of leads 7, semiconductor chip support lead portions (bus bars) 81B and electrode pads 4 on the semiconductor chip 3 are respectively electrically connected with wires (e.g., Au wires) 8.

Deep recesses 28A are provided on both sides of the heat stage 28 in order to prevent the semiconductor chip 3 and wires 8 from contacting each other at this step.

A resin encapsulant 9 is then formed by resin-encapsulating the semiconductor chips 2 and 3, the inner portions of the semiconductor chip support lead 81 (inner portions of the suspended lead portions 81A and the semiconductor chip support lead portions (bus bars) 81B), inner portions 7A of the leads 7, the wires 8 and the like. The resin encapsulant 9 is formed using transfer molding. Thus, a semiconductor device 80 according to the fifth embodiment is formed on a lead frame LF as shown in FIG. 7.

Ninth Embodiment

Figure 35:
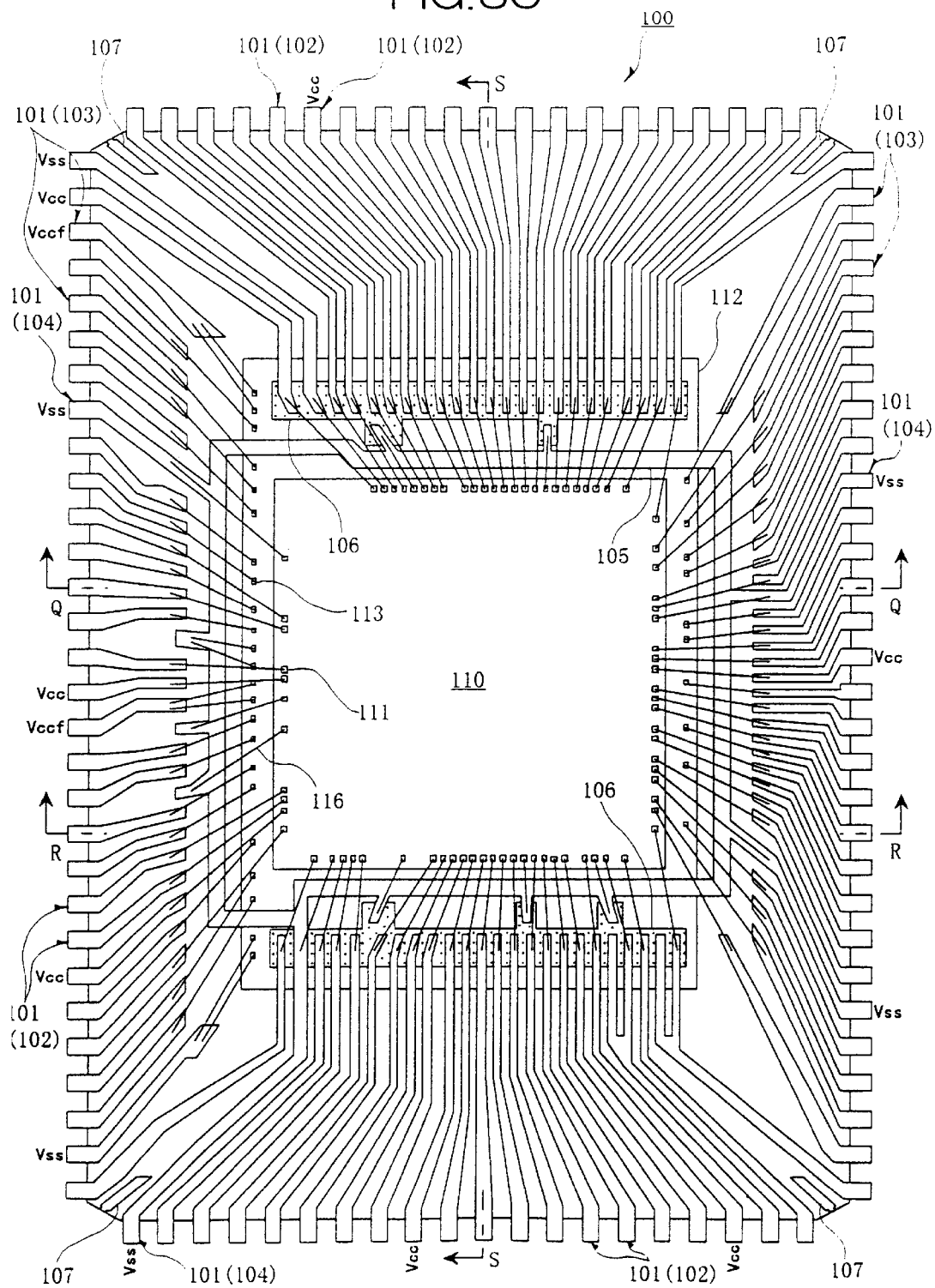
FIG. 35 is a schematic plan view of a semiconductor device which is a ninth embodiment of the invention with an upper part of a resin encapsulant thereof removed.
Figure 36:
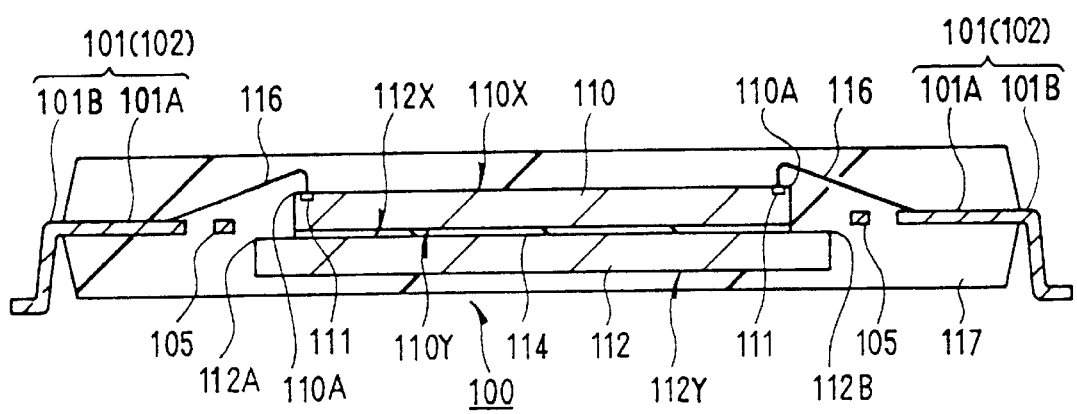
FIG. 36 is a schematic sectional view taken along the line Q—Q in FIG. 35.
Figure 37:
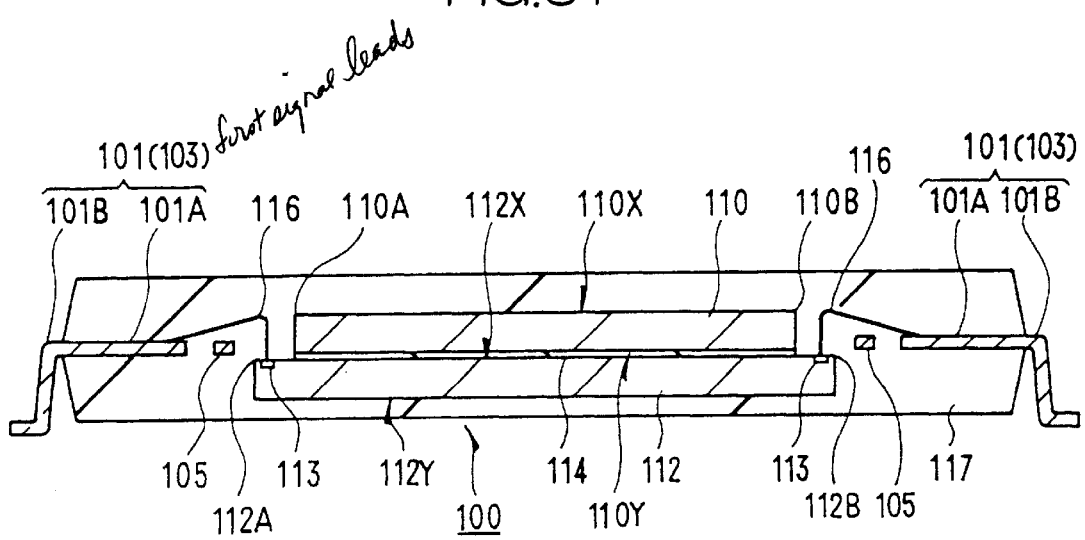
FIG. 37 is a schematic sectional view taken along the line R—R in FIG. 35.
Figure 38:
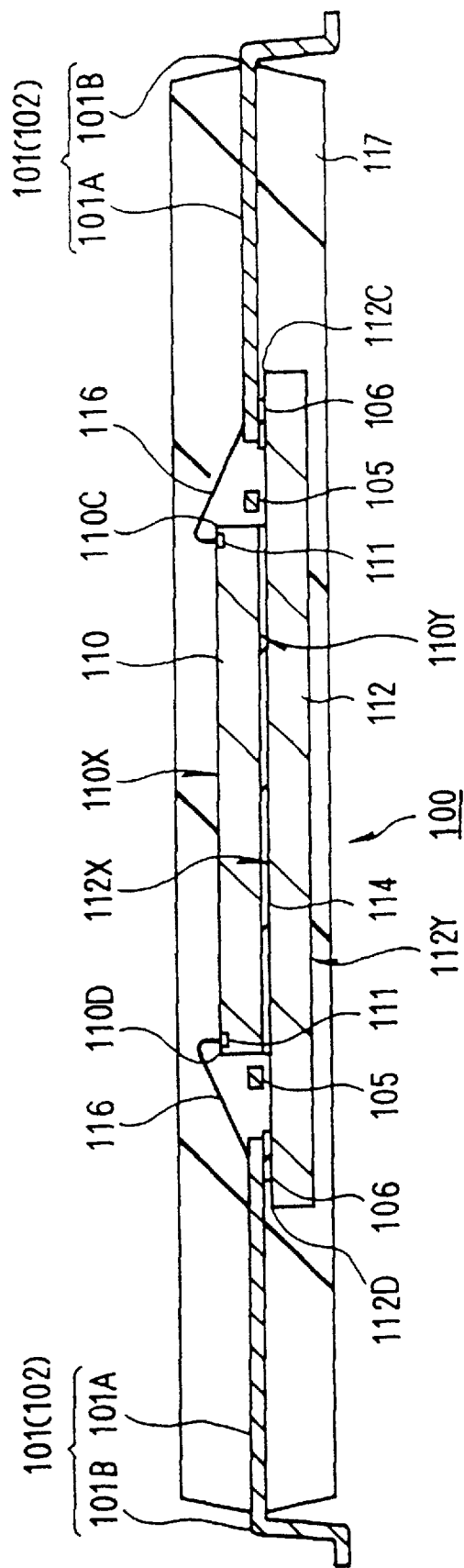
FIG. 38 is a schematic sectional view taken along the line S—S in FIG. 35.
Figure 39:
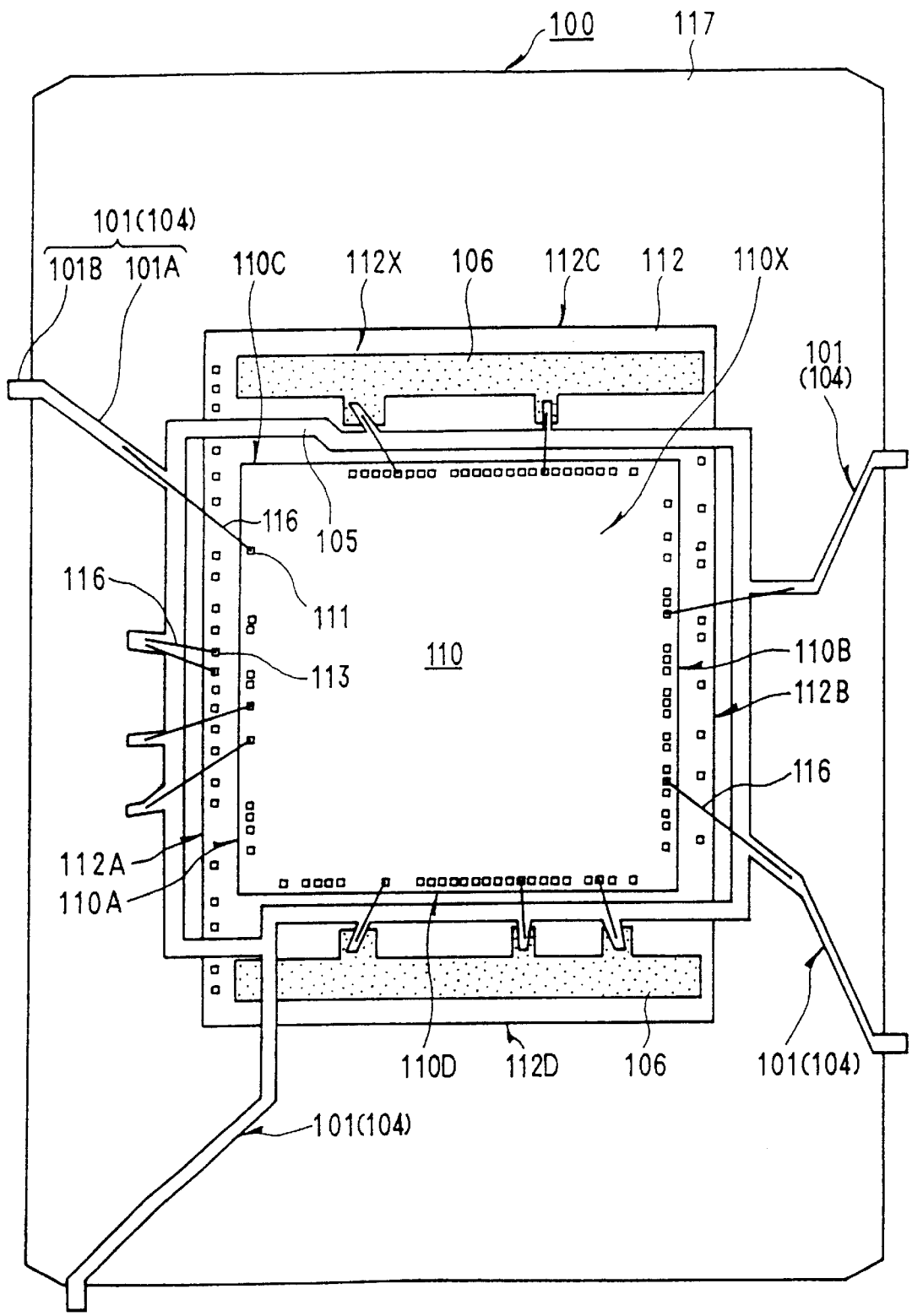
FIG. 39 is a schematic plan view of a part of FIG. 35.
Figure 40:
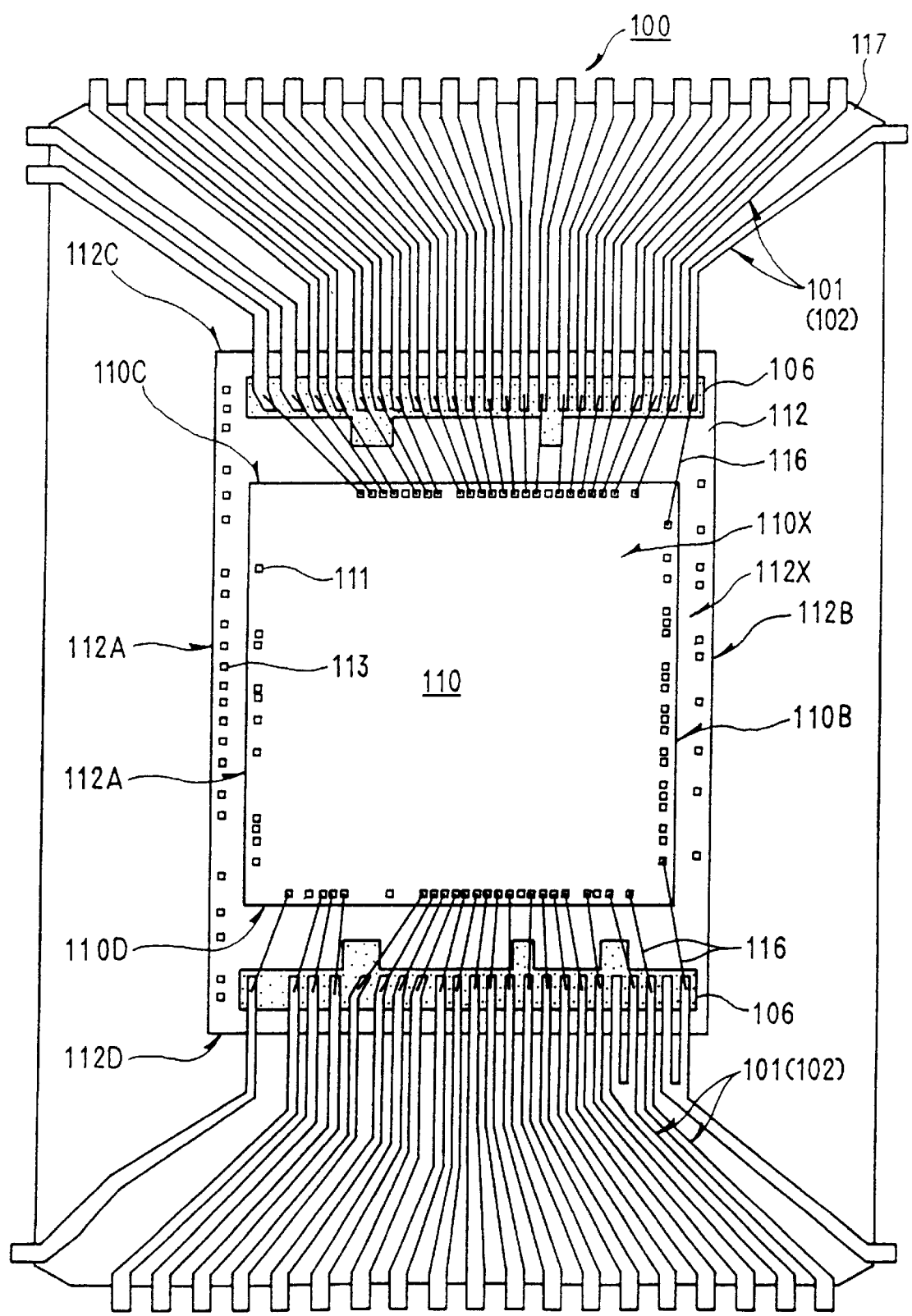
FIG. 40 is a schematic plan view of a part of FIG. 35.
Figure 41:
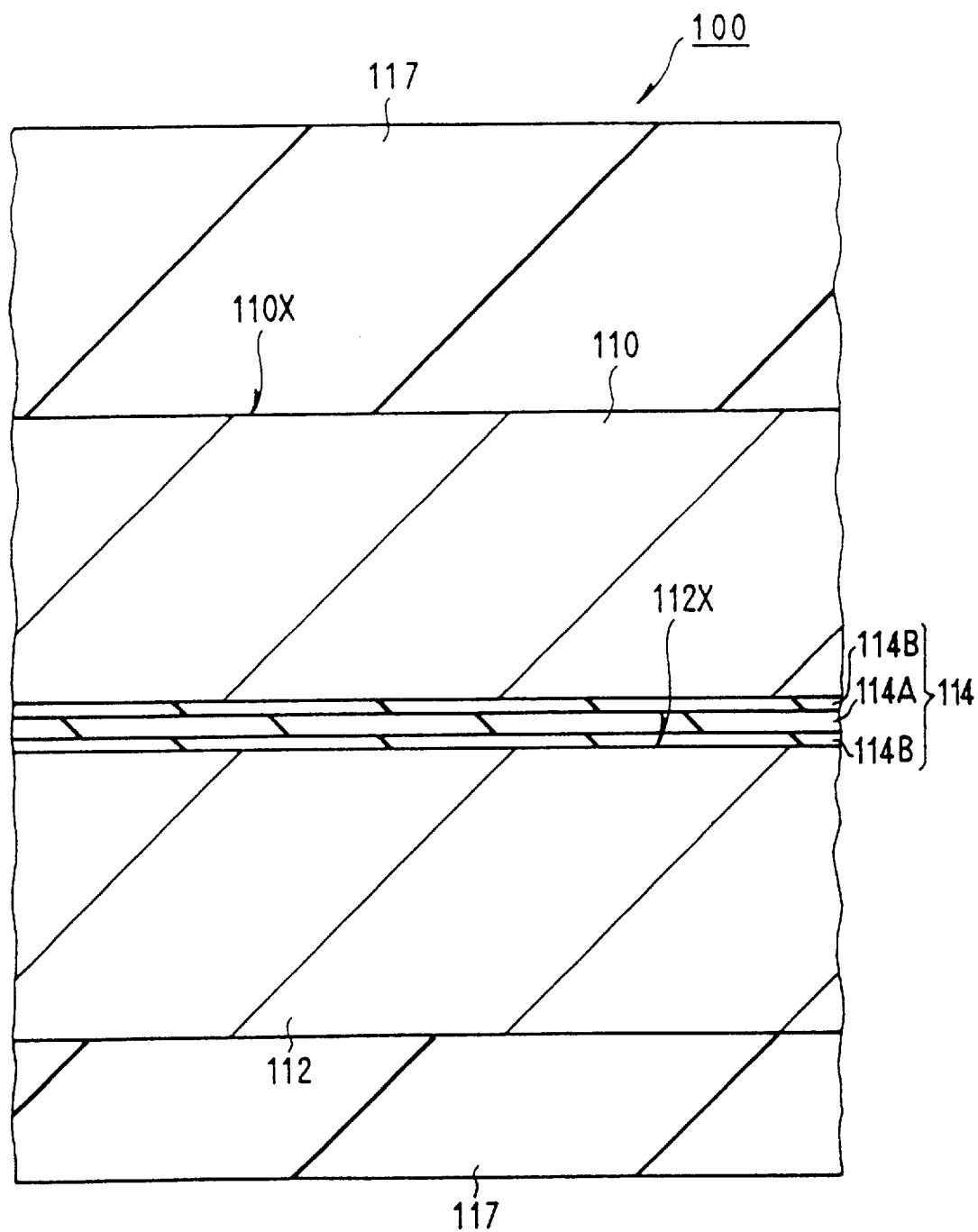
FIG. 41 is an enlarged schematic sectional view of a part of FIG. 36.

FIG. 35 is a schematic plan view of a semiconductor device which is a ninth embodiment of the invention with an upper part of a resin encapsulant thereof removed. FIG. 36 is a schematic sectional view taken along the line Q—Q in FIG. 35. FIG. 37 is a schematic sectional view taken along the line R—R in FIG. 35. FIG. 38 is a schematic sectional view taken along the line S—S in FIG. 35. FIG. 39 is a schematic plan view of a part of FIG. 35. FIG. 40 is a schematic plan view of a part of FIG. 35. FIG. 41 is an enlarged schematic sectional view of a part of FIG. 35.

As shown in FIGS. 35 through 38, a semiconductor device 100 of the present embodiment is formed by stacking a semiconductor chip (first semiconductor chip) 110, a semiconductor chip (second semiconductor chip) 112 vertically and by encapsulating the semiconductor chips 110 and 112 with a single resin encapsulant 117.

The semiconductor chips 110 and 112 are formed with different plane sizes (outline dimensions) and in quadrangular configurations. In the present embodiment, the semiconductor chip 110 is formed in a square configuration of, for example, 7.21 mm×7.21 mm, and the semiconductor chip 112 is formed in a rectangular configuration of, for example 11.59 mm×8.38 mm.

For example, each of the semiconductor chips 110 and 112 is primarily comprised of a semiconductor substrate made of single crystal silicon, a multiple wiring layer formed by staking a plurality of insulating layers and wiring layers on a circuit forming surface of the semiconductor substrate and a surface protection film (final protection film) formed to cover the multiple wiring layer. The semiconductor chip 112 incorporates a memory circuit, e.g., a 256 Mbit EEPROM (electrically erasable programmable read only memory) circuit referred to as "flash memory". For example, the semiconductor chip 110 incorporates a control circuit for controlling the memory circuit in the semiconductor chip 112.

A plurality of electrode pads (bonding pads) 111 are formed on a circuit forming surface 110X which is one of principal surfaces (first and second principal surfaces) of the semiconductor chip 110 opposite to each other. Each of the plurality of electrode pads 111 is formed on the uppermost wiring layer of the multiple wiring layer of the semiconductor chip 110. The uppermost wiring layer is covered by the surface protection film formed thereon, and the surface protection film is formed with bonding holes for exposing the surface of the electrode pads 111.

A plurality of electrode pads (bonding pads) 113 are formed on a circuit forming surface 112X which is one of principal surfaces (first and second principal surfaces) of the semiconductor chip 112 opposite to each other. Each of the plurality of electrode pads 113 is formed on the uppermost wiring layer of the multiple wiring layer of the semiconductor chip 112. The uppermost wiring layer is covered by the surface protection film formed thereon, and the surface protection film is formed with bonding holes for exposing the surface of the electrode pads 113.

The plurality of electrode pads 111 are divided into four groups of pads. As shown in FIG. 39, the electrode pads 111 in a first group of pads are arranged on the side of one (110A) of two opposite sides of the semiconductor chip 110 along the side 110A. The electrode pads 111 in a second group of pads are arranged on the side of the other (110B) of the two opposite sides of the semiconductor chip 110 along the side 110B. The electrode pads 111 in a third group of pads are arranged on the side of one (110C) of the remaining two opposite sides (the sides that meet the sides 110A and 110B) of the semiconductor chip 110 along the side 110C. The electrode pads 111 in a fourth group of pads are arranged on the side of the other (110D) of the remaining two opposite sides of the semiconductor chip 110 along the side 110D.

The plurality of electrode pads 113 are divided into two groups of pads. The electrode pads 113 in a first group of pads are arranged on the side of one (112A) of the two opposite longer sides of the semiconductor chip 112 along the longer side 112A. The electrode pads 113 in a second group of pads are arranged on the side of the other (112B) of the two opposite longer sides of the semiconductor chip 112 along the longer side 112B.

As shown in FIGS. 35 through 38, the semiconductor chip 110 is provided on the surface of the semiconductor chip 112 facing the back surface 110Y which is the other principal surface (second principal surface) of the semiconductor chip 110. In the present embodiment, the semiconductor chip 110 is provided on the circuit forming surface 112X of the semiconductor chip 112 facing the back surface 110Y of the semiconductor chip 110.

The resin encapsulant 117 is formed with a quadrangular surface configuration. In the present embodiment, the resin encapsulant is formed with a rectangular surface configuration of, for example, 20 mm×14 mm. The resin encapsulant 117 is formed using transfer molding suitable for mass production similarly to the above-described embodiments.

A plurality of leads 101 are provided outside the outer periphery of the semiconductor chip 110 such that they are arranged along two each longer and shorter sides of the resin encapsulant 117 opposite to each other. Each of the plurality of leads 101 extends in and out the resin encapsulant 117 and has a configuration consisting of an inner portion 101A located inside the resin encapsulant 117 and an outer portion 101B located outside the encapsulant 117. The outer position of each of the plurality of leads 101 is bent and molded into one of surface mount lead configurations, e.g., a gull wing type lead configuration.

As shown in FIGS. 35, 36 and 38, inner portions of leads 102 are electrically connected to electrode pads 111 on the semiconductor chip 110 through conductive wires 116. A plurality of leads 102 are provided outside each of the sides 110A through 110D of the semiconductor chip 110.

As shown in FIGS. 35 and 37, inner portions of leads 103 are electrically connected to electrode pads 113 on the semiconductor chip 112 through conductive wires 116. A plurality of leads 103 are provided outside each of the two longer sides 112A and 112B of the semiconductor chip 112.

As shown in FIGS. 35 and 39, leads 104 are formed such that they are integral with a lead 105 at inner portions thereof. One lead 104 is provided outside each of the sides 110A and 110D of the semiconductor chip 110, and two leads 104 are provided outside the side 110B of the semiconductor chip 110. The lead 105 is provided between the ends of the inner portions of the leads 102 and 103 and the semiconductor chip 110 and extends to surround the outer periphery of the semiconductor chip 110. In the present embodiment, the lead 105 includes a first portion located outside one longer side 112A of the semiconductor chip 112, a second portion located outside the other longer side 112B of the semiconductor chip 112, a third portion extending on the semiconductor chip 112 outside the side 110C of the semiconductor chip 110 and a fourth portion extending on the semiconductor chip 112 outside the side 110D of the semiconductor chip 110. Branch lead portions branch from the first, third and fourth portions of the lead 105.

The inner portions of the leads 104 and the lead 105 are electrically connected to electrode pads for power supply (electrode pads for fixed potential) among the plurality of electrode pads 111 formed on the circuit forming surface 110X of the semiconductor chip 110 through conductive wires 116 and are further electrically connected to electrode pads for power supply among the plurality of electrode pads 113 formed on the circuit forming surface 112X of the semiconductor chip 112 through conductive wires 116. That is, the leads 104 and 105 are used as leads for power supply (leads for fixed potential). In the present embodiment, the inner portions of the leads 104 and the lead 105 are electrically connected to electrode pads for reference potential whose potential is fixed at a reference potential (e.g., 0 V) among the electrode pads for power supply.

Most of the plurality of leads 102 are used as signal leads, and the rest of the leads 102 are used as power supply leads, operational potential leads whose potential is fixed at an operational potential (e.g., 5 V) or reference potential leads. Most of the plurality of leads 103 are used as signal leads, and the rest of the leads 103 are used as power supply leads.

The branch lead portions of the lead 105 are bonded and secured to the circuit forming surface 112X of the semiconductor chip 112 through a bonding tape 106. That is, the leads 104 and 105 are used also as support leads (suspended leads) for supporting the semiconductor chip 112. For example, a bonding tape 106 having a three-layer structure may be used in which bonding layers made of polyimide type thermoplastic resin are provided on both principal surfaces (principal surfaces opposite to each other) of a base made of polyimide type resin, although this is not limiting the invention.

Among the plurality of leads 102, as shown in FIGS. 38 and 40, the leads provided outside the side 110C of the semiconductor chip 110 and the leads provided outside the side 110D of the semiconductor chip 110, i.e., the leads provided at the shorter sides 112C and 112D of the semiconductor chip 112 are provided such that the inner portions thereof partially overlap the circuit forming surface 112X of the semiconductor chip 112 outside the semiconductor chip 110, and the ends of the inner portions are bonded and secured to the circuit forming surface 112X of the semiconductor chip 112 with a bonding tape 106. That is, the leads 102 provided outside the side 110C of the semiconductor chip 110 and the leads provided outside the side 110D of the semiconductor chip 110 are also used as support leads for supporting the semiconductor chip 112.

As shown in FIG. 39, the semiconductor chip 110 is provided on the circuit forming surface 112X of the semiconductor chip 112 such that the side 110A is located on the side of the longer side 112A of the semiconductor chip 112 and such that the side 110B is located on the side of the longer side 112B of the semiconductor chip 112. The number of the electrode pads 111 provided on the side of the sides 110A and 110B of the semiconductor chip 110 is smaller than the number of the electrode pads 111 provided on the side of the sides 1110C and 110D of the semiconductor chip 110. That is, the semiconductor chips 110 and 112 are stacked with the back surface 110Y of the semiconductor chip 110 and the circuit forming surface 112X of the semiconductor chip 112 in a face-to-face relationship with each other such that the sides of the semiconductor chip 110 along which a smaller number of electrode pads 111 are provided are located on the side of the longer sides of the semiconductor chip 112.

Since such a configuration makes it possible to reduce the number of the leads located outside the longer sides of the semiconductor chip 112, it is possible to suppress any increase in the dimension of the semiconductor device in the direction of the longer sides of the semiconductor chip 112.

Further, since the number of the wires 116 at the longer sides of the semiconductor chip 112 can be reduced, it is possible to prevent shorting between the wires attributable to a flow of resin during the formation of the resin encapsulant.

The semiconductor chip 112 of the present embodiment has a two-side pad structure in which the electrode pads 113 are arranged along the two longer sides thereof. When the electrode pads of the semiconductor chip is arranged along one side thereof as in the semiconductor chip 3 of the first embodiment, the two semiconductor chips are preferably stacked such that the side having the smallest number of electrode pads 111 among the four sides of the semiconductor chip 110 is located toward the side of the semiconductor chip 112 along which the pads are arranged.

The lead 105 extends between the electrode pads 113 of the semiconductor chip 112. Such a configuration improves the flexibility in routing the lead 105 that extends outside the outer periphery of the semiconductor chip 112 and on the semiconductor chip 112.

The semiconductor chips 110 and 112 are stacked such that the back surface 110Y of the semiconductor chip 110 and the circuit forming surface 112X of the semiconductor chip 112 face each other. In such a configuration, the loop height of the wires 116 which electrically connect the electrode pads 113 on the semiconductor chip 112 and the leads 103 can be canceled by the thickness of the semiconductor chip 110, which makes it possible to form the resin encapsulant 117 with a thickness smaller than that in the case wherein the back surfaces of the semiconductor chips 110 and 112 face each other.

As shown in FIGS. 36 through 38, the semiconductor chip 110 is bonded and secured to the circuit forming surface 112X of the semiconductor chip 112 with an insulating bonding tape 114. As shown in FIG. 41, for example, a bonding tape 114 having a three-layer structure is used in which bonding layers 114B made of polyimide type thermoplastic resin and thermosetting resin are provided on both sides of a base 114A made of polyimide type resin, although this is not limiting the invention.

As shown in FIGS. 35 through 38, the semiconductor chips 110 and 112, the inner portions of the plurality of leads 101, the wires 116, the leads 107 and the like are encapsulated with the resin encapsulant 117. One lead 107 is provided at each of the four corners of the resin encapsulant 117. The leads 107 are provided to support the resin encapsulant on a frame of a lead frame in a process of manufacturing a semiconductor device.

A semiconductor device 100 having such a configuration is manufactured using a manufacturing process utilizing a lead frame similarly to the above-described embodiments. The configuration of the lead frame of the present embodiment will not be described here because it is substantially the same as those of the lead frames used in the above-described embodiments except that the lead pattern is slightly different.

A description will now be made with reference to FIGS. 42 through 48 on the manufacture of the semiconductor device 100. FIGS. 42A and 42B schematically illustrate a configuration of a first semiconductor wafer used to manufacture the semiconductor device. FIGS. 42A and 42B are a schematic plan view and a schematic sectional view of the same, respectively. FIGS. 43A and 43B schematically illustrate a configuration of a second semiconductor wafer used to manufacture the semiconductor device. FIGS. 43A and 43B are a schematic plan view and a schematic sectional view of the same, respectively. FIGS. 44 through 48 are schematic sectional views for explaining the manufacture of the semiconductor device.

First, semiconductor wafers, e.g., a first semiconductor wafer (semiconductor substrate) 120 and a second semiconductor wafer (semiconductor substrate) 130 made of single crystal silicon having a thickness on the order of 720 pm are provided.

Referring to the first semiconductor wafer 120, semiconductor elements, an insulating layer, a wiring layer, electrode pads 111, a surface protection film, bonding holes and the like are formed on a circuit forming surface 120X of the first semiconductor wafer 120 to form a plurality of chip forming regions 121 having substantially the same memory circuits formed thereon in the form of a matrix. Referring to the second semiconductor wafer 130, semiconductor elements, an insulating layer, a wiring layer, electrode pads 113, a surface protection film, bonding holes and the like are formed on a circuit forming surface 130X of the second semiconductor wafer 130 to form a plurality of chip forming regions 131 having substantially the same memory circuits formed thereon in the form of a matrix. The plurality of chip forming regions 121 are spaced from each other with dicing regions (cutting regions) 122 for cutting the first semiconductor wafer 120 interposed. The plurality of chip forming regions 131 are spaced from each other with dicing regions (cutting regions) 132 for cutting the second semiconductor wafer 130 interposed. The steps up to this point are shown in FIGS. 42A, 42B, 43A and 43B.

As shown in FIG. 44A, a back surface 120Y of the first semiconductor wafer 120 opposite to the circuit forming surface 120X is ground to reduce the thickness of the same. A back surface 130Y of the second semiconductor wafer 130 opposite to the circuit forming surface 130X is ground to reduce the thickness of the same. In the present embodiment, for example, the semiconductor wafers are ground to a thickness of about 0.24 mm.

Next, as shown in FIG. 44B, a bonding tape 114 is applied to the back surface 120Y of the first semiconductor wafer 120. The bonding tape 114 is applied by first mounting the first semiconductor wafer 120 on the bonding tape 114 which is greater than the plane size of the first semiconductor wafer 120, applying the bonding tape 114 thereafter using thermo-compression bonding and thereafter cutting the bonding tape 114 along the contour of the first semiconductor wafer 120, although this is not limiting the invention. The bonding tape 114 is not applied to the back surface 130Y of the second semiconductor wafer 130.

The bonding tape 114 is preferably applied before the first semiconductor wafer 120 is divided into individual semiconductor chips 110, i.e., at the phase of the semiconductor wafer. The reason is that if the tape is applied after the semiconductor wafer 112 is divided into individual semiconductor chips 112, the number of units to be processed increases from that in the case of the wafer by a factor of several hundreds, resulting in a complicated process which adversely affects the quality and cost.

As shown in FIG. 44C, the first semiconductor wafer 120 is then attached to an adhesive layer of a dicing sheet 125 and, thereafter, the dicing regions 122 of the semiconductor wafer 120 and the bonding tape 114 are diced using a dicing apparatus as shown in FIG. 44D. As a result, semiconductor chips 110 are formed which have a control circuit, electrode pads 111 and the like formed on the circuit forming surface 110X thereof and to which the bonding tape 114 is applied on the back surface 110Y thereof. The second semiconductor wafer 130 is then attached to an adhesive layer of a dicing sheet and, thereafter, the dicing regions 132 of the semiconductor wafer 130 are diced using a dicing apparatus. As a result, semiconductor chips 112 are formed which have a memory circuit, electrode pads 113 and the like formed on the circuit forming surface 112X thereof and which are formed with a plane size greater than that of the semiconductor chips 110.

At this step, since the bonding tape 114 is made of a resinous material softer than the substrate made of silicon, the semiconductor wafer 120 can be easily diced. Further, since the bonding tape 114 is diced along with the semiconductor wafer 120, it is possible to form bonding tapes 114 matched with the external size of the semiconductor chips 110 easily.

Figure 45:
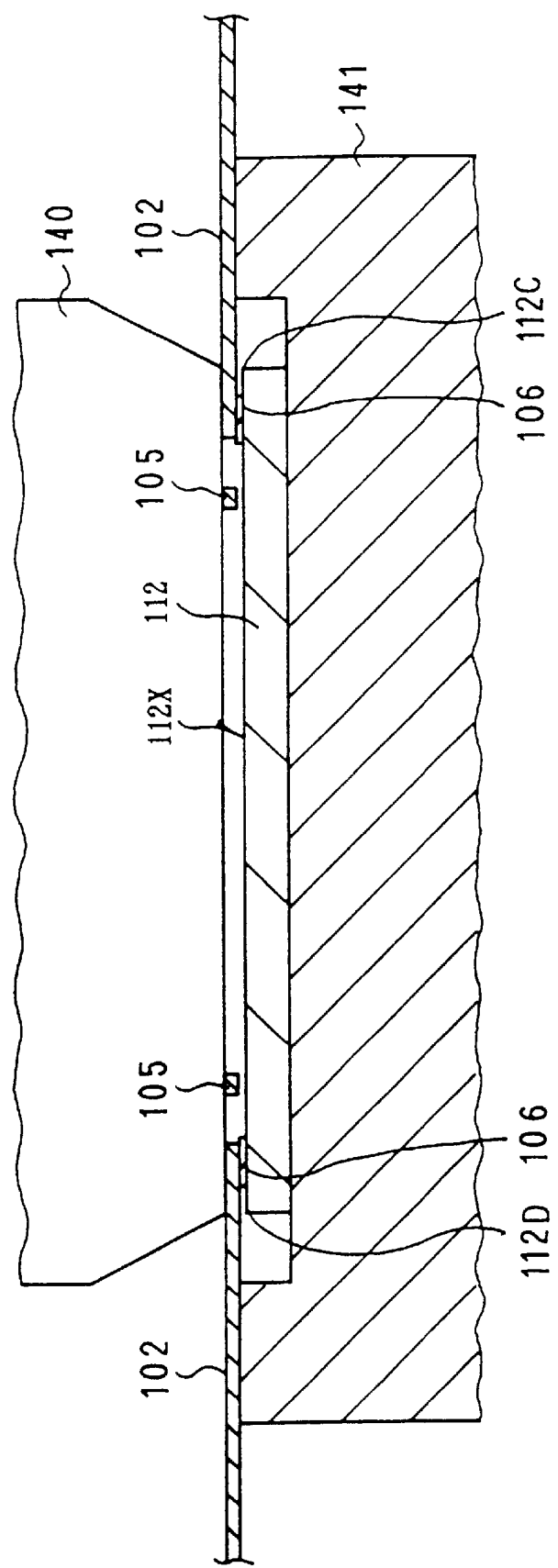
FIG. 45 is a schematic sectional view of the semiconductor device according to the ninth aspect for explaining the manufacture of the same.

The semiconductor chip 112 is then bonded and secured to a lead frame. The lead frame and the semiconductor chip 112 are bonded and secured by bonding and securing the leads 102 provided at the shorter sides 112C and 112D of the semiconductor chip 112 to the circuit forming surface 112X of the semiconductor chip 112. As shown in FIG. 45, the bonding and securing of the leads 102 and semiconductor chip 112 is carried out by positioning the semiconductor chip 112 on a heat stage 141, thereafter positioning the ends of the inner portions of the leads 102 at the shorter sides of the circuit forming surface 112X of the semiconductor chip 112 through the bonding tape 106 and thereafter performing thermo-compression bonding of the ends of the inner portions of the leads 102 with a bonding tool 140. At this step, the branch lead portions of the lead 105 are also subjected to thermo-compression bonding to be bonded and secured to the circuit forming surface 112X of the semiconductor chip 112 through the bonding tape 106, although not shown in detail.

At this step, the semiconductor chip 112 is supported on the lead frame through the leads 102.

Figure 46:
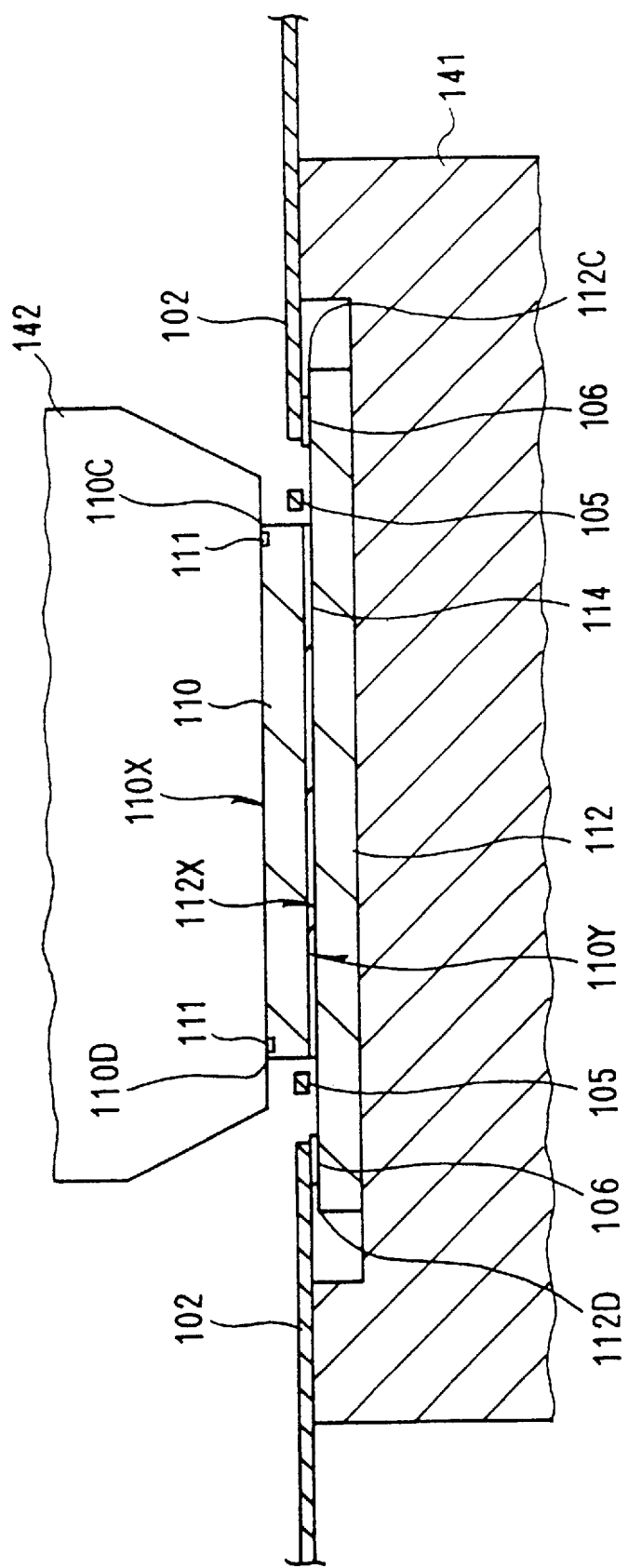
FIG. 46 is a schematic sectional view of the semiconductor device according to the ninth embodiment for explaining the manufacture of the same.

Next, the semiconductor chip 110 is bonded and secured to the semiconductor chip 112. As shown in FIG. 46, the bonding and securing of the semiconductor chips 112 and 110 is carried out by positioning the semiconductor chip 110 on the semiconductor chip 112 such that the bonding tape 114 applied to the back surface 110Y of the semiconductor chip 110 faces the circuit forming surface 112X of the semiconductor chip 112 and by performing thermocompression bonding of the semiconductor chip 110 using a heated bonding tool 142 thereafter.

At this step, the semiconductor chip 112 is supported on the lead frame through the leads 102, and the semiconductor chip 110 is bonded and secured to the semiconductor chip 112. That is, since each of the semiconductor chips 110 and 112 is supported by the lead frame, it is possible to eliminate tabs (die pads) to support the semiconductor chips.

The semiconductor chips 112 and 110 may alternatively be bonded and secured by applying a pasty adhesive to the circuit forming surface 112X of the semiconductor chip 112 to form a bonding layer thereon and by performing thermo-compression bonding of the semiconductor chip 110 thereafter. However, since the adhesive is normally applied using a multi-point application method, the bonding layer is likely to have ununiform thickness due to variation of the amount of application. An ununiform thickness of the bonding layer increases the inclination of the semiconductor chip 110 relative to the circuit forming surface 112X of the semiconductor chip 112. A great inclination of the semiconductor chip 110 increases the risk of poor connection between the electrode pads 111 on the semiconductor chip 110 and the wires at a subsequent wire bonding step. An ununiform thickness of the bonding layer increases the ratio of the part of adhesive that comes out from the periphery of the semiconductor chip 112 when the semiconductor chip 112 is subjected to thermo-compression bonding. Since this increases the possibility of overflow of the adhesive on to the circuit forming surface 110X of the semiconductor chip 110, the risk of poor connection between the electrode pads 111 on the semiconductor chip 110 and the wires is increased.

In the present embodiment, the semiconductor chips 110 and 112 are bonded and secured using a bonding film 114. Since the thickness of the bonding film 114 can be made more uniform compared to a bonding layer formed by applying an adhesive, it is possible to suppress the inclination and of the semiconductor chip 110 and the amount of overflow of the adhesive.

The semiconductor chip 110 is provided such that the side 110A of the semiconductor chip 110 is located toward the longer side 112A of the semiconductor chip 112 and such that the side 110B of the semiconductor chip 110 is located toward the other longer side 112B of the semiconductor chip 112.

Figure 47:
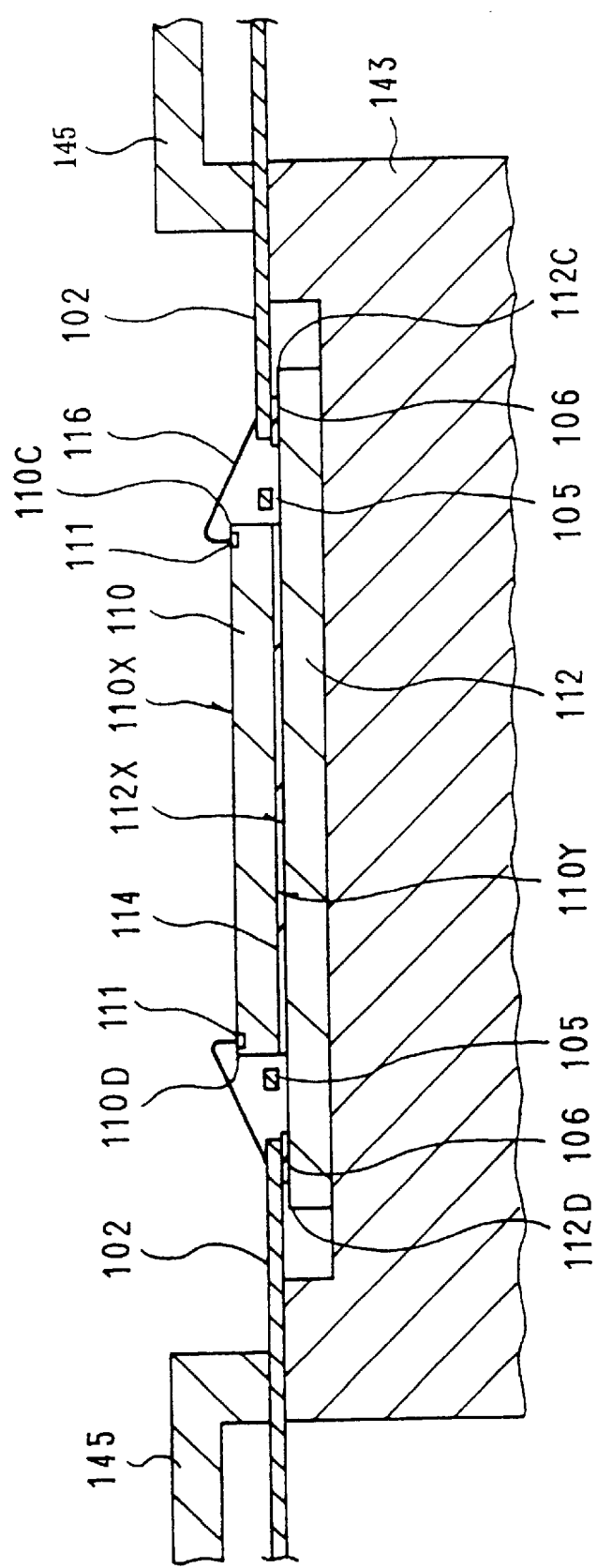
FIG. 47 is a schematic sectional view of the semiconductor device according to the ninth embodiment for explaining the manufacture of the same.

Next, electrical connection is made using the conductive wires 116 between the electrode pads 111 of the semiconductor chip 110 and the lead inner portions 102, between the electrode pads 113 of the semiconductor chip 112 and the inner portions of the leads 103, between the electrode pads 111 and 113 of the respective semiconductor chips 110 and 112 and the inner portions of the leads 104 and between the electrode pads 111 and 113 of the respective semiconductor chips 110 and 112 and the lead 105. As shown in FIG. 47, the electrical connection using the wires 116 is carried out while the leads 101, 102, 103 and 104 are pressed and secured with a frame pressing member 145 and a heat stage 143 is heated. For example, gold wires are used as the wires 116. For example, the wires 116 are connected using ball bonding which is thermo-compression bonding accompanied by ultrasonic vibration.

At this step, since the ends of the inner portions of the leads 102 provided at the two shorter sides 112C and 112D of the semiconductor chip 112 are located above the circuit forming surface 112A of the semiconductor chip 112, it is possible to reduce the length of the wires 116 for electrically connecting the inner portions of the leads 102 and the electrode pads 111 on the semiconductor chip 112.

Further, since the semiconductor chip 110 is bonded and secured to the semiconductor chip 112 through the bonding tape 114, the inclination of the semiconductor chip 110 and the amount of overflow of the adhesive is suppressed. This makes it possible to suppress poor connection between the electrode pads 111 on the semiconductor chip 110 and the wires 116.

Since the semiconductor chip 110 is provided on the semiconductor chip 112 with the back surface 110Y of the semiconductor chip 110 and the circuit forming surface 112X of the semiconductor chip 112 facing each other, it is possible to conduct wire connection to electrically connect the electrode pads 111 on the semiconductor chip 110 and the leads 102 and wire connection to electrically connect the electrode pads 113 on the semiconductor chip 112 and the leads 103 at the same step.

Figure 48:
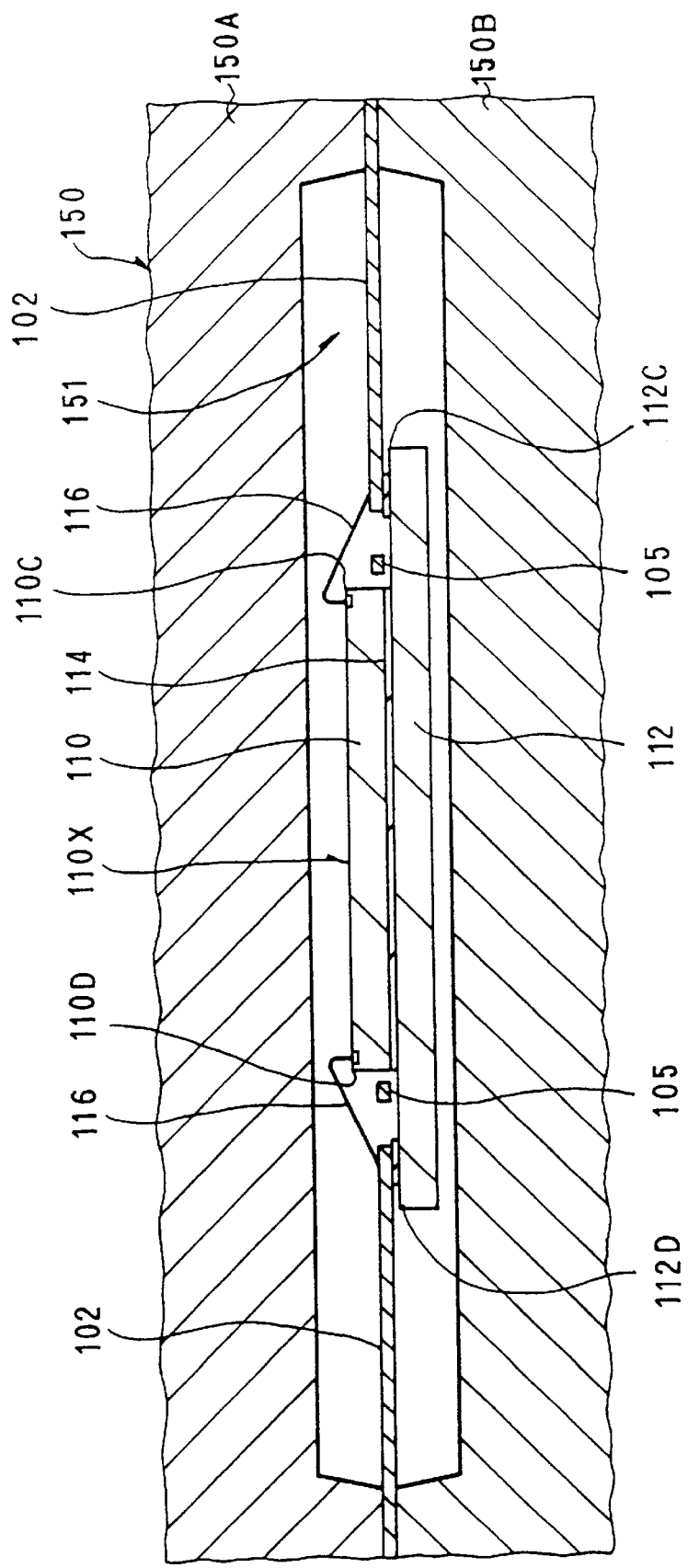
FIG. 48 is a schematic sectional view of the semiconductor device according to the ninth embodiment for explaining the manufacture of the same.

Next, as shown in FIG. 48, the lead frame is positioned between an upper die 150A and a lower die 150B of a molding die 150 of a transfer molding apparatus. At this time, the semiconductor chips 110 and 112, the inner portions of the leads 101, 102, 103 and 104, the lead 105, the leads 107, the wires 116 and the like are located in a cavity 151 formed by he upper die 150A and lower die 150B.

The resin encapsulant 117 is formed by injecting fluidic resin from a pot of the molding die 150 through a runner and an entrance gate into the cavity 151 under a pressure. The semiconductor chips 110 and 112, the inner portions of the leads 101, 102, 103 and 104, the lead 105, the leads 107, the wires 116 and the like are encapsulated by the resin encapsulant 117. For example, epoxy type thermosetting resin is used which is added with a phenol type setting agent, silicone rubber, a filler and the like.

Next, the tie bars connected to the leads 101 are cut; a plating process is thereafter performed on the outer portions of the leads 101; the leads 101 are thereafter cut off from the frame of the lead frame; the outer portions of the leads 101 are thereafter molded into one of configurations for surface mounting, e.g., a gull wing configuration; and the leads 107 are cut off from the frame of the lead frame to complete a semiconductor device 100 as shown in FIGS. 35 through 38 substantially.

Chips (Si chips) can remain at the periphery of the back surface (a corner where a cutting surface and the back surface meet) of a semiconductor chip divided through dicing as a result of incomplete separation. This can result in problems such as fall of such chips which have stuck to the periphery of the back surface of an upper semiconductor chip upon a lower semiconductor chip, which causes damage on the lower semiconductor chip due to the chips. According to the present embodiment, since the semiconductor chip 110 is formed by dicing the semiconductor wafer 120 and bonding tape 114 with the bonding tape 114 applied to the back surface of the semiconductor wafer 120, any chip remaining on the periphery of the back surface of the semiconductor chip 110 as a result of incomplete separation is held in place by the bonding tape 114. It is therefore possible to prevent any chip from falling on the semiconductor chip 112 on which the semiconductor chip 110 is placed.

Figure 49:
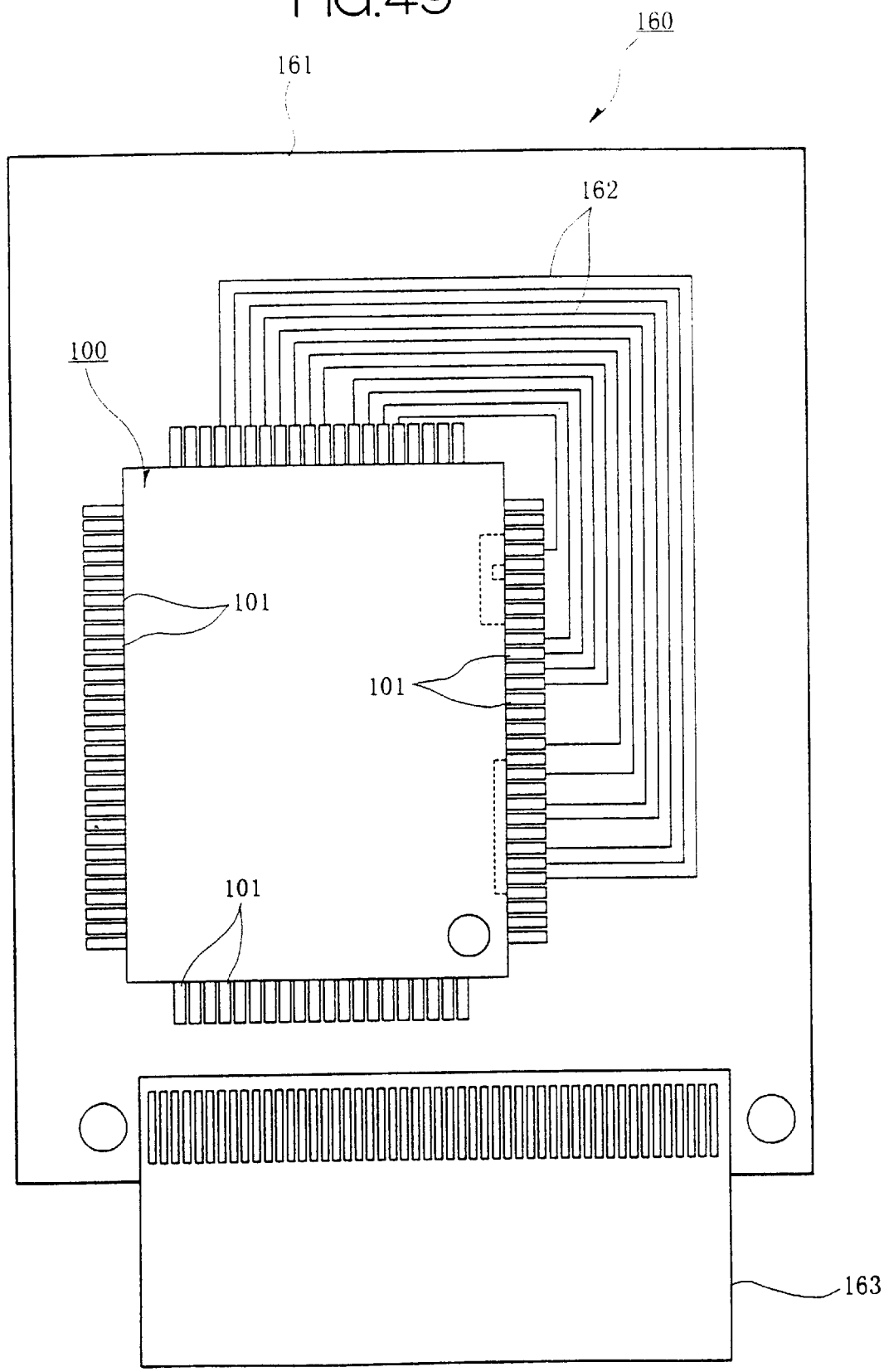
FIG. 49 is a schematic plan view of a CF card incorporating a semiconductor device according to the ninth embodiment of the invention .

A description will now be made with reference to FIG. 49 on a CF (compact flash) card (electronic apparatus) incorporating a semiconductor device 100 of the present embodiment. FIG. 49 is a schematic plan view of a CF card.

As shown in FIG. 49, a CF card 160 is primarily comprised of a circuit board 161, a connector 163 and a semiconductor device 100. The semiconductor device 100 is mounted on one principal surface of the wiring board 161.

In the semiconductor device 100, the electrode pads for power supply of the semiconductor chip 110 and the electrode pads for power supply of the semiconductor chip 112 are electrically connected to each other through the leads 101 (104) inside the resin encapsulant 117. The electrode pads for signals of the semiconductor chip 110 and the electrode pads for signals of the semiconductor chip 112 are not electrically connected inside the resin encapsulant 117. It is therefore necessary to electrically connect the electrode pads for signals of the semiconductor chip 110 and the electrode pads for signals of the semiconductor chip 112. According to the present embodiment, the leads 101 (102) electrically connected to the electrode pads for signals on the semiconductor chip 110 and the leads 101 (103) electrically connected to the electrode pads for signals on the semiconductor chip 112 are electrically connected through wires 162 formed on the wiring board 161. obviously, electrical connection between the leads 101 (102) and the leads 101 (103) is made only where necessary.

By mounting the semiconductor device 100 on the wiring board 161 in such a manner, a card system can be configured with a single semiconductor device 100. The size of the CF card can be smaller than that in a case wherein a semiconductor device having a semiconductor chip 110 loaded thereon and a semiconductor device having a semiconductor chip 112 loaded thereon are mounted on a wiring board 161.

By electrically connecting the leads 101 (102) electrically connected to the electrode pads for signals on the semiconductor chip 110 and the leads 101 (103) electrically connected to the electrode pads for signals on the semiconductor chip 112 through the wires 162 on the wiring board 161, the pin arrangement of the semiconductor device 100 can be simplified, and the number of the wires 116 can be reduced. This makes it possible to provide semiconductor devices 100 with high productivity.

As described above, the present embodiment provides the followings effects.

(1) The semiconductor chip 110 is bonded and secured to the surface of the semiconductor chip 112 facing the back surface of the 110Y of the semiconductor chip 110. The inner portions of he leads 102 provided at the two shorter sides 112C and 112D of the semiconductor chip 112 among the leads 102 electrically connected to the electrode pads 111 on the semiconductor chip 110 through the wires 116 are bonded and secured to the surface of the semiconductor chip 112 facing the back surface 110Y of the semiconductor chip 110.

Since such a configuration allows each of the semiconductor chips 110 and 112 to be supported by the lead frame during the manufacture of the semiconductor device, it is possible to eliminate tabs (die pads) for supporting the semiconductor chips. Further, since the thickness of the leads 102 is canceled by the thickness of the semiconductor chip 110, there is no increase in the thickness of the resin encapsulant 117 even though the semiconductor chip 112 is supported by the leads 102. Since this makes it possible to provide the resin encapsulant with a small thickness, a semiconductor device 100 having a low profile can be provided.

Since the length of the wires 116 for electrically connecting the electrode pads 111 on the semiconductor chip 110 and the leads 102 can be reduced, it is possible to reduce the impedance of the signal transmission path. As a result, a semiconductor device 100 having a high speed can be provided.

(2) The semiconductor chip 110 is bonded and secured to the circuit forming surface 112X of the semiconductor chip 112 facing the back surface of the 110Y of the semiconductor chip 110. The inner portions of he leads 102 provided at the two shorter sides 112C and 112D of the semiconductor chip 112 among the leads 102 electrically connected to the electrode pads 111 on the semiconductor chip 110 through the wires 116 are bonded and secured to the circuit forming surface 112X of the semiconductor chip 112 facing the back surface 110Y of the semiconductor chip 110.

Since such a configuration allows the loop height of the wires 116 electrically connecting the electrode pads 113 on the semiconductor chip 112 and the leads 103 to be canceled by the thickness of the semiconductor chip 110, the thickness of the resin encapsulant 117 can be smaller than that in a case wherein the back surfaces of the semiconductor chips 110 and 112 face each other. This makes it possible to provide a semiconductor device 100 having a low profile.

It is possible to conduct wire connection to electrically connect the electrode pads 111 on the semiconductor chip 110 and the leads 102 and wire connection to electrically connect the electrode pads 113 on the semiconductor chip 112 and the leads 103 at the same step during the manufacture of a semiconductor device 100. This makes it possible to improve the productivity of a semiconductor device 100.

(3) The semiconductor chips 110 and 112 are stacked with the back surface 110Y of the semiconductor chip 110 and the circuit forming surface 112X of the semiconductor chip 112 in a face-to-face relationship with each other such that the sides of the semiconductor chip 110 along which a smaller number of electrode pads 111 are provided are located on the side of the longer sides of the semiconductor chip 112.

Since such a configuration makes it possible to reduce the number of the leads located outside the longer sides of the semiconductor chip 112, it is possible to suppress any increase in the dimension of the semiconductor device in the direction of the longer sides of the semiconductor chip 112.

Further, since the number of the wires 116 at the longer sides of the semiconductor chip 112 can be reduced, it is possible to prevent shorting between the wires attributable to a flow of resin during the formation of the resin encapsulant 117. This makes it possible to improve the yield of semiconductor devices 100.

(4) The lead 105 extends between the electrode pads 113 of the semiconductor chip 112. Such a configuration improves the flexibility in routing the lead 105 that extends outside the outer periphery of the semiconductor chip 112 and on the semiconductor chip 112.

(5) During the manufacture of a semiconductor device 100, the semiconductor chip 110 is bonded and secured to the circuit forming surface 112X of the semiconductor chip 112 through the bonding tape 114.

Since the thickness of the bonding film 114 can be more uniform compared to that of a bonding layer formed by applying an adhesive, the inclination of the semiconductor chip 110 and the amount of an overflow of the adhesive can be suppressed, which makes it possible to suppress poor connection between the electrode pads 111 on the semiconductor chip 110 and the wires 116. As a result, the yield of semiconductor devices 100 can be improved.

(6) During the manufacture of a semiconductor device 100, the semiconductor wafer 120 and the bonding tape 114 applied to the back surface 120Y of the semiconductor wafer 120 are diced to form the semiconductor chip 110 and, thereafter, the semiconductor chip 110 is mounted on the circuit forming surface 112X of the semiconductor chip 112 through the bonding tape 114.

As a result, chips (Si chips) can remain at the periphery of the back surface 110Y (a corner where a cutting surface and the back surface 110Y meet) of a semiconductor chip 110 divided through dicing as a result of incomplete separation. Since such chips can be held in place by the bonding tape 114, it is possible to prevent any chip from falling on the semiconductor chip 112 on which the semiconductor chip 110 is placed. Since this makes it possible to prevent damage on both of those semiconductor chips attributable to the fall of chips, and the yield of semiconductor devices can therefore be improved.

Since the bonding tape 114 is formed of a resinous material softer than the substrate made of silicon, the semiconductor wafer 120 can be easily diced.

Since the bonding tape 114 is diced along with the semiconductor wafer 120, a bonding tape 114 matched with the external size of the semiconductor chip 110 can be easily formed.

(7) Since a semiconductor device 100 is mounted on a wiring board 161 in a CF card 160, it is possible to configure a card system with a single semiconductor device 100. The size of the CF card can be smaller than that in a case wherein a semiconductor device having a semiconductor chip 110 loaded thereon and a semiconductor device having a semiconductor chip 112 loaded thereon are mounted on a wiring board 161.

(8) By electrically connecting the leads 101 (102) electrically connected to the electrode pads for signals on the semiconductor chip 110 and the leads 101 (103) electrically connected to the electrode pads for signals on the semiconductor chip 112 through the wires 162 on the wiring board 161 in a CF card 160, the pin arrangement of the semiconductor device 100 can be simplified, and the number of the wires 116 can be reduced. This makes it possible to provide semiconductor devices 100 with high productivity.

Figure 50:
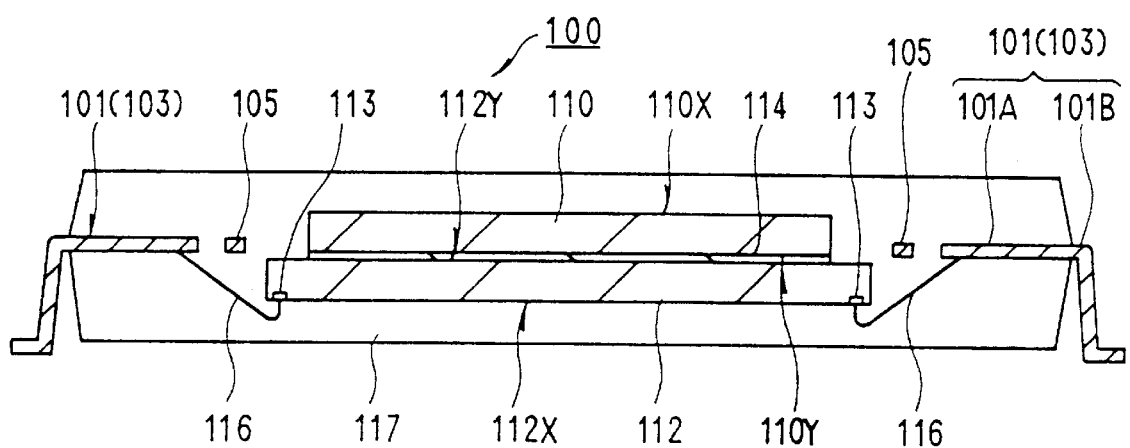
FIG. 50 is a schematic sectional view of a semiconductor device which is a modification of the ninth embodiment of the invention.

While the present embodiment has referred to an example wherein the semiconductor chip 110 is provided on the circuit forming surface 112X of the semiconductor chip 112, the semiconductor chip 110 may be provided on the back surface 112Y of the semiconductor chip 112 as shown in FIG. 50. In this case, since there is no damage on the circuit forming surface 112X of the semiconductor chip 112 even if the semiconductor chip 110 is subjected to thermo-compression bonding, the yield of semiconductor devices can be higher than that in a case wherein the semiconductor chip 110 is bonded to the circuit forming surface 112X of the semiconductor chip 112 on a thermo-compression basis.

While the present embodiment has referred to an example wherein the bonding tape 114 is applied to the back surface 110Y of the semiconductor chip 110, the bonding tape 114 may be bonded to the circuit forming surface 112X of the semiconductor chip 112. In this case, since the bonding tape 114 can not be applied in advance to a semiconductor wafer before separation, it is necessary to apply bonding tapes 114 matched with the external size of semiconductor chip 110 to the circuit forming surfaces 112X of semiconductor chips 112 one by one.

While the present embodiment has referred to an example the use of a bonding tape 114 having a three-layer structure in which bonding layers 114B are provided on both sides of a base 114A, a bonding tape having a single layer structure may be used.

Tenth Embodiment

Figure 51:
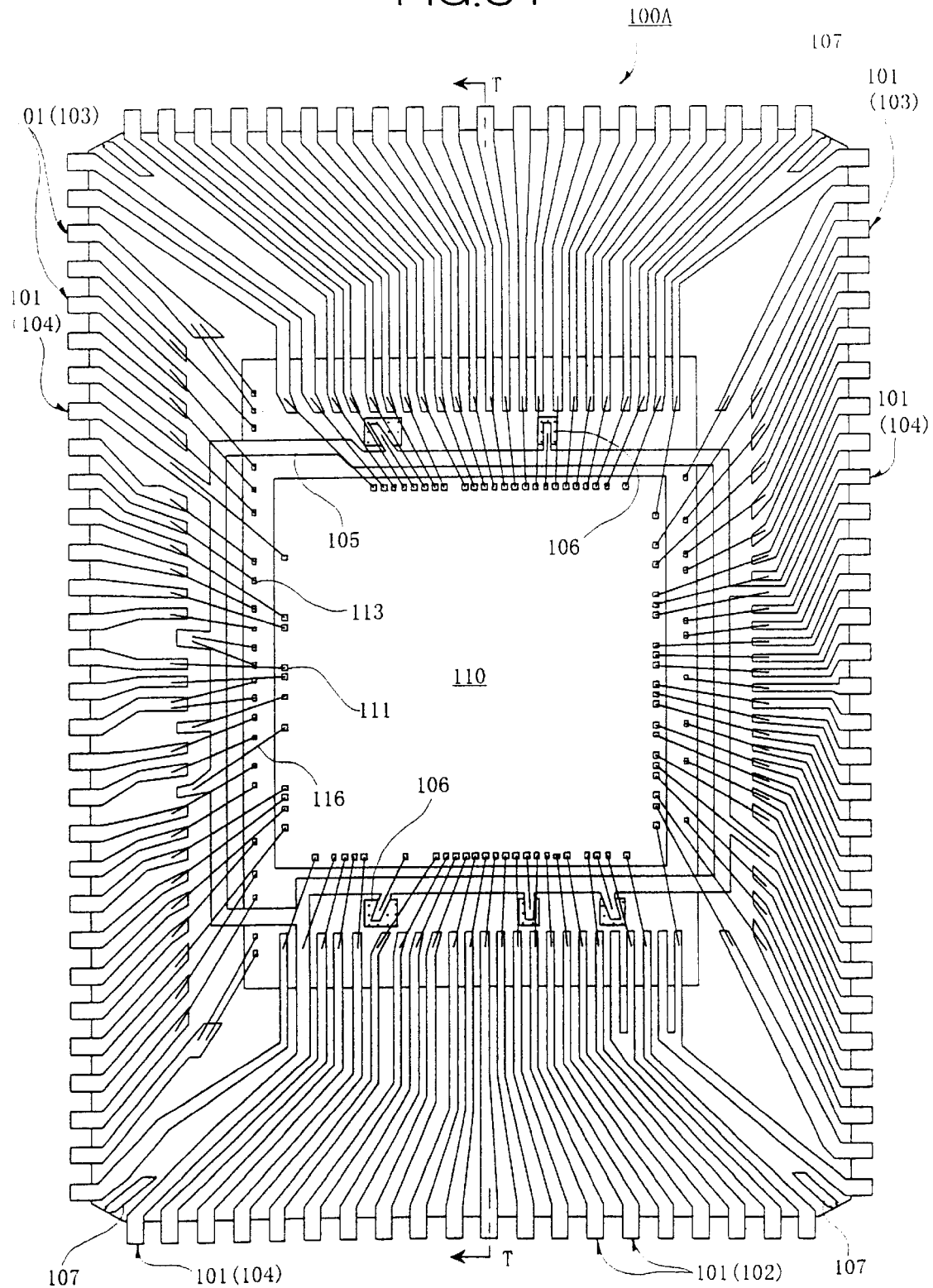
FIG. 51 is a schematic sectional view of a semiconductor device which is a tenth embodiment of the invention with an upper part of a resin encapsulant thereof removed.
Figure 52:
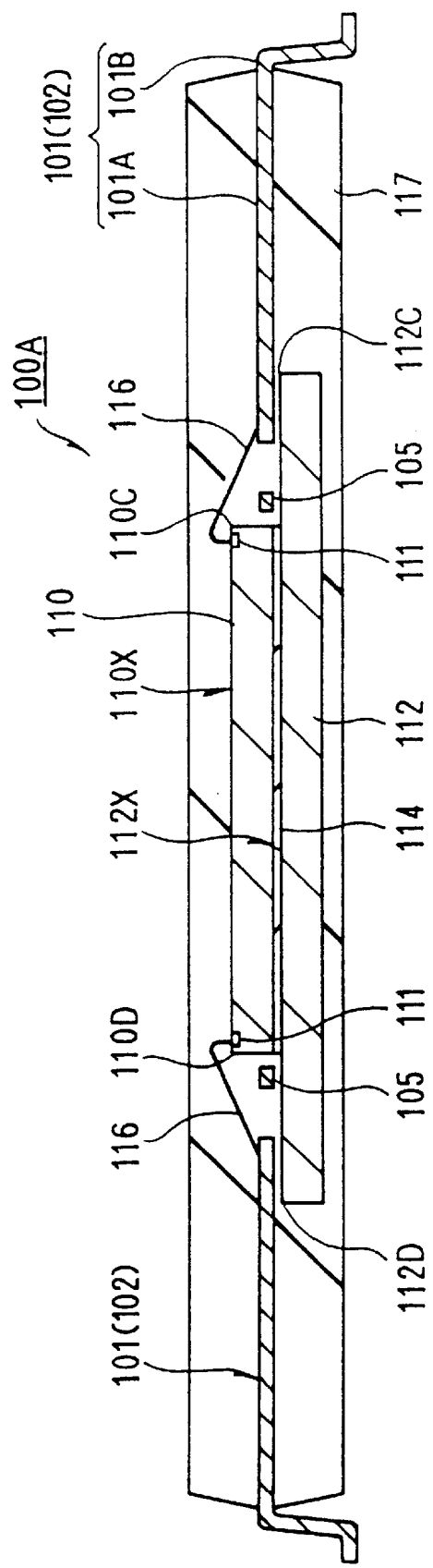
FIG. 52 is a schematic sectional view taken along the line T—T in FIG. 51.

FIG. 51 is a schematic plan view of a semiconductor device which is a tenth embodiment of the invention with an upper part of a resin encapsulant thereof removed. FIG. 52 is a schematic sectional view taken along the line T—T in FIG. 51.

As shown in FIGS. 51 and 52, the configuration of a semiconductor device 100A of the present embodiment is basically the same as that of the ninth embodiment except the following points.

The ends of inner portions of leads 102 provided at shorter sides 112C and 112D of a semiconductor chip 112 are located above a circuit forming surface 112X of the semiconductor chip 112 at a space from the surface instead of being bonded and secured to the circuit forming surface 112X of the semiconductor chip 112. Therefore, the semiconductor chip 112 is supported by leads 104 and 105.

The semiconductor device 100A having such a configuration provides the same effects as those of the ninth embodiment.

While the invention has been specifically described with reference to the preferred embodiments, the invention is not limited to the above-described embodiments and may obviously be modified in various ways without departing from the principle of the invention.

For example, the invention may be applied to semiconductor devices of the SOJ (small outline J-leaded package) type, the SOP (small outline package) type and the like having a double lead structure.

The invention may be also applied to semiconductor devices of the QFP (quad flat package) type, QFJ (quad flat J-leaded package) type and the like having a quadruple lead structure.

Effects that can be provided according to typical aspects of the invention disclosed in this specification can be briefly described as follows.

(1) It is possible to reduce the thickness of a semiconductor device in which two semiconductor chips are stacked and encapsulated with a single resin encapsulant.

(2) In a semiconductor device in which two semiconductor chips are stacked and encapsulated with a single resin encapsulant, a single lead frame can accommodate external electrodes provided on the two semiconductor chips.

(3) Workability at steps of assembling semiconductor devices can be improved.

(4) The yield of such semiconductor devices can be improved.

(5) Since a first semiconductor chip and a second semiconductor chip are stacked with a resin encapsulant interposed between them without using any adhesive on the surfaces thereof facing each other, it is possible to prevent any crack attributable to thermal expansion caused by heat generated when the semiconductor device is subjected to a reflow process and when the device operates.

What is claimed is:

1. A semiconductor device, comprising:

(1) a substrate having a plurality of electrode pads and wirings formed on one surface thereof; and (2) a packaged device mounted on said one surface of said substrate; said packaged device comprising:
a first semiconductor chip and a second semiconductor chip, each having a circuit forming surface and a back surface opposite to said circuit forming surface and electrode pads formed on said circuit forming surface;
first signal leads each having an inner portion and an outer portion which is continuous with said inner portion;
conductive wires electrically connecting said inner portions of said first signal leads with said electrode pads of said first and second semiconductor chips respectively; and a resin member sealing said first and second semiconductor chips, said conductive wires, said inner portions of said first signal leads, said outer portions of said first signal leads protruding outwardly from said resin member;

wherein said first semiconductor chip is stacked on said second semiconductor chip, wherein said outer portions of said first signal leads are connected to said plurality of electrode pads of said substrate respectively, wherein said electrode pads of said first semiconductor chip includes a first electrode pad which should be commonly connected to one of said electrode pads of said second semiconductor chip, wherein a signal lead electrically connected to said first electrode pad of said first semiconductor chip and a signal lead electrically connected to said one of said electrode pads of said second semiconductor chip are electrically connected to each other by one of said wirings of said substrate and are not electrically connected to each other in said packaged device.

2. A semiconductor device according to claim 1, wherein said second semiconductor chip has a size larger than that of said first semiconductor chip, and wherein said first semiconductor chip is disposed on said second semiconductor chip such that said back surface of said first semiconductor chip is contacted with said circuit forming surface of said second semiconductor chip.

3. A semiconductor device according to claim 2, further comprising fixed potential leads each having an inner portion and an outer portion which is continuous with said inner portion, wherein parts of said inner portions of said of fixed potential leads are continuously formed with one another.

4. A semiconductor device according to claim 3, wherein said fixed potential lead includes a ground potential lead.

5. A semiconductor device according to claim 4 wherein said back surface of said first semiconductor chip is bonded to said circuit forming surface of said second semiconductor chip by an insulating adhesive film.

6. A semiconductor device according to claim 5, wherein said parts of said inner portions of said fixed potential leads are formed to surround said first semiconductor chip in a plane view.

7. A semiconductor device according to claim 1, further comprising second signal leads each having an inner portion and an outer portion which is continuous with said inner portion, wherein said outer portions of said second signal leads are connected to said electrode pads of said substrate, and wherein said second signal leads are electrically independent from each other and are not electrically connected to each other by said wirings of said substrate.

8. A semiconductor device according to claim 1, wherein said packed device includes a quad-flat package.

* * * * *